(12) United States Patent
Murakami et al.

(10) Patent No.: US 10,855,312 B2
(45) Date of Patent: *Dec. 1, 2020

(54) TRANSMISSION APPARATUS AND ASSOCIATED METHOD OF ENCODED DATA

(71) Applicant: Panasonic Corporation, Osaka (JP)

(72) Inventors: Yutaka Murakami, Kanagawa (JP); Shutai Okamura, Osaka (JP); Masayuki Orihashi, Kyoto (JP); Takaaki Kishigami, Tokyo (JP); Shozo Okasaka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,252

(22) Filed: Jan. 15, 2019

(65) Prior Publication Data

US 2019/0149170 A1     May 16, 2019

Related U.S. Application Data

(63) Continuation of application No. 16/019,387, filed on Jun. 26, 2018, now Pat. No. 10,263,641, which is a
(Continued)

(30) Foreign Application Priority Data

Jul. 9, 2008    (JP) ................................ 2008-179636
Sep. 4, 2008    (JP) ................................ 2008-227505

(51) Int. Cl.
    *H03M 13/03*     (2006.01)
    *H03M 13/11*     (2006.01)
    (Continued)

(52) U.S. Cl.
    CPC ...... *H03M 13/1154* (2013.01); *H03M 13/116* (2013.01); *H03M 13/13* (2013.01);
    (Continued)

(58) Field of Classification Search
    CPC . G06F 11/18; H03M 13/1154; H03M 13/036; H03M 13/635; H03M 13/118;
    (Continued)

(56) References Cited

U.S. PATENT DOCUMENTS 5,699,368 A    12/1997   Sakai et al.
5,812,601 A    9/1998   Schramm
(Continued)

FOREIGN PATENT DOCUMENTS

CN           1126397 A       7/1996
CN           1639985 A       7/2005
(Continued)

OTHER PUBLICATIONS

Chen et al., "Reduced-Complexity Decoding of LDPC Codes," IEEE Transactions on Communications 53(8):1288-1299, Aug. 2005.
(Continued)

*Primary Examiner* — Samir W Rizk
(74) *Attorney, Agent, or Firm* — Seed IP Law Group LLP

(57) ABSTRACT

A transmission apparatus includes an encoder that codes a data sequence with a parity check matrix, wherein the data sequence includes a final information bit sequence and virtual information bits, and outputs the final information bit sequence and a parity sequence, as LDPC codes, and a transmitter that transmits the LDPC codes as a transmission data. A column length of the parity check matrix is longer than a total length of the final information bit sequence and the parity sequence, by a length of the virtual information bits that are set to "0" and are not transmitted. The total length of the final information bit sequence and the parity (Continued)

sequence has a sequence length corresponding to a length from a first column to a determined column of the parity check matrix. The encoder generates the LDPC codes by using the first column to the determined column among one or more column(s) of the parity check matrix.

2 Claims, 34 Drawing Sheets

Related U.S. Application Data continuation of application No. 15/387,041, filed on Dec. 21, 2016, now Pat. No. 10,038,457, which is a continuation of application No. 15/077,737, filed on Mar. 22, 2016, now Pat. No. 9,564,923, which is a continuation of application No. 14/860,302, filed on Sep. 21, 2015, now Pat. No. 9,331,715, which is a continuation of application No. 14/516,437, filed on Oct. 16, 2014, now Pat. No. 9,178,654, which is a continuation of application No. 14/072,586, filed on Nov. 5, 2013, now Pat. No. 8,892,984, which is a continuation of application No. 13/756,208, filed on Jan. 31, 2013, now Pat. No. 8,612,838, which is a continuation of application No. 12/937,366, filed as application No. PCT/JP2009/003129 on Jul. 6, 2009, now Pat. No. 8,397,145.

(51) Int. Cl.
*H04B 3/54* (2006.01)
*H03M 13/23* (2006.01)
*H03M 13/00* (2006.01)
*H03M 13/13* (2006.01)
*H04L 1/00* (2006.01)

(52) U.S. Cl.
CPC ....... *H03M 13/235* (2013.01); *H03M 13/616* (2013.01); *H03M 13/617* (2013.01); *H03M 13/635* (2013.01); *H03M 13/6306* (2013.01); *H03M 13/6356* (2013.01); *H03M 13/6516* (2013.01); *H03M 13/6527* (2013.01); *H04B 3/542* (2013.01); *H04L 1/0041* (2013.01); *H04L 1/0058* (2013.01)

(58) Field of Classification Search
CPC ... H03M 13/611; H03M 13/616; H03M 13/09
See application file for complete search history.

(56) References Cited

U.S. PATENT DOCUMENTS

| 7,089,479 | B2 | 8/2006 | Matsumoto |
| 7,600,173 | B2 | 10/2009 | Matsumoto |
| 2004/0054959 | A1 | 3/2004 | Blankenship et al. |
| 2004/0199859 | A1 | 10/2004 | Matsumoto |
| 2007/0192670 | A1 | 8/2007 | Ikeda et al. |

FOREIGN PATENT DOCUMENTS

| EP | 1837999 A1 | 9/2007 |
| EP | 2169836 A1 | 3/2010 |
| JP | 2007-215089 A | 8/2007 |
| JP | 2008-153760 A | 7/2008 |
| WO | 02056479 A1 | 7/2002 |
| WO | 2005/107081 A1 | 10/2005 |

OTHER PUBLICATIONS

Chen et al., "Efficient Encoding and Termination of Low-Density Parity-Check Convolutional Codes," Proceedings of the IEEE Global Telecommunications Conference (GLOBECOM '06), San Francisco, CA, Nov. 27-Dec. 1, 2006, pp. 1-5.
English Translation of Chinese Search Report dated Mar. 3, 2016, for corresponding CN Application No. 201310711243.1, 2 pages.
Extended European Search Report dated Dec. 12, 2012, for corresponding EP Application No. 09794170.2, 11 pages.
Extended European Search Report dated Dec. 1, 2015, for corresponding EP Application No. 15182348.1-1905, 9 pages.
Fan, "Array Codes as Low-Density Parity-Check Codes," 2nd International Symposium on Turbo Codes & Related Topics, Brest, France, 2000, pp. 543-546.
Felstrom et al., "Time-Varying Periodic Convolutional Codes with Low-Density Parity-Check Matrix," IEEE Transactions on Information Theory 45(6):2181-2191, Sep. 1999.
Fossorier et al., "Reduced Complexity Iterative Decoding of Low-Density Parity Check Codes Based on Belief Propagation," IEEE Transactions on Communications 47(5):673-680, May 1999.
Forrosier, "Quasi-Cyclic Low-Density Parity-Check Codes From Circulant Permutation Matrices," IEEE Transactions on Information Theory 50(8):1788-1793, Aug. 2004.
Gallager, "Low-Density Parity-Check Codes," IRE Transactions on Information Theory:21-28, Jan. 1962.
Gallager, "Low-Density Parity-Check Codes," MIT Press, Cambridge, MA, Jul. 1963, 90 pages.
IEEE Standard for Local and Metropolitan area networks, Part 16: Air Interface for Fixed and Mobile Broadband Wireless Access Systems, Amendment 2: Physical and Medium Access Control Layers for Combined Fixed and Mobile Operation in Licensed Bands, and Corrigendum 1, 2006, 864 pages.
International Search Report for corresponding International Application No. PCT/JP2009/003129, dated Aug. 4, 2009, 2 pages.
Kishigami et al., "LDPC-Convolutional Codes for IEEE 802.16m FEC Scheme," IEEE 802.16 Broadband Wireless Access Working Group, IEEE C802.16m-08/074, Jan. 16, 2008, 6 pages.
Kishigami et al., "Rate Compatible LDPC-Convolutional Codes for the Change Request to 802.16m SDD," IEEE 802.16 Broadband Wireless Access Working Group, IEEE C802.16m-09/0412, Feb. 27, 2009, 6 pages.
Lin et al., "Error Control Coding: Fundamentals and Applications," 2d ed., Prentice Hall, Englewood Cliffs, N.J., 2004, pp. 538-545.
MacKay, "Good Error-Correcting Codes Based on Very Sparse Matrices," IEEE Transactions on Information Theory 45(2):399-431, Mar. 1999.
Matsushita Electric Industrial Co. Ltd., AN Advanced Communications Networks SA, "G.hn: Two-mode support by using low density parity check-convolutional codes (LDPC-CCs)," ITC—Telecommunication Standardization Sector, Study Group 15, Antwerp, Belgium, Jun. 16-20, 2008, 8 pages.
Murakami et al., "LDPC Convolutional Codes Based on Parity Check Polynomial," IEICE Technical Report 108(61):75-79, 2008.
Pusane et al., "On Deriving Good LDPC Convolutional Codes from QC LDPC Block Codes," ISIT2007, Nice, Fance, Jun. 24-29, 2007, pp. 1221-1225.
Wadayama, "Low-Density Parity-Check Code and the decoding method," KabushikgaishaTricepts, Jun. 5, 2002, 18 pages.
Wen et al., "On the Performance of Incremental Redundancy Hybrid ARQ Schemes with Rate Compatible LDPC Codes," 2006 International Conference on Communications, Circuits and Systems Proceedings, Guilin, China, Jun. 25-28, 2006, pp. 731-734.
Zhang et al., "Shuffled Iterative Decoding,"IEEE Transactions on Communications 53(2):209-213, Feb. 2005.
Anonymous, "Low-density parity-check code," Wikipedia, Retrieved from the Internet: URL: https://en.wikipedia.org/w/index.php?title=Low-density_parity-check_code&oldid=223000561 [Retrieved on Jan. 18, 2019], Jul. 2, 2008, 4 pages.
Extended European Search Report, dated Feb. 1, 2019, for corresponding European Application No. 18201751.7-1207, 9 pages.

$$\mathbf{H}^T_{[0,n]} = \begin{pmatrix} h_1^{(0)}(0) & h_1^{(1)}(1) & \cdots & h_1^{(M)}(M) & 0 & 0 & \cdots & 0 \\ h_2^{(0)}(0) & h_2^{(1)}(1) & \cdots & h_2^{(0)}(M) & h_1^{(M)}(M+1) & 0 & \cdots & h_1^{(M)}(n) \\ 0 & h_1^{(0)}(1) & \cdots & \vdots & h_2^{(M)}(M+1) & \cdots & & h_2^{(M)}(n) \\ 0 & h_2^{(0)}(1) & \cdots & \vdots & \cdots & \ddots & & \vdots \\ & 0 & \cdots & \vdots & & & \ddots & h_2^{(0)}(n) \\ & & & \vdots & & & & 0 \end{pmatrix}$$

FIG.1

$$H = \begin{matrix} \text{00000000} & H1 & 11000000...000 \\ \text{000000000} & H2 & 11000000...000 \\ \text{0000000000} & H3 & 11000000...000 \\ \text{00000000000} & H4 & 11000000...000 \\ \vdots & & \\ \text{0000...0000} & Hm & 11000000...000 \\ \end{matrix}$$

FIG.3

「CHECK EQUATION #1」

$(D^2+D^1+1)X(D)+(D^2+D^1+1)P(D)=0$ $H_1=$ 11 11 11

「CHECK EQUATION #2」

$(D^5+D^1+1)X(D)+(D^5+D^1+1)P(D)=0$ $H_2=$ 11 00 00 00 11 11

「CHECK EQUATION #3」

$(D^4+D^2+1)X(D)+(D^4+D^2+1)P(D)=0$ $H_3=$ 11 00 11 00 11

CHECK EQUATION #1
CHECK EQUATION #2
CHECK EQUATION #3
CHECK EQUATION #1
CHECK EQUATION #2
CHECK EQUATION #3
CHECK EQUATION #1
CHECK EQUATION #2
CHECK EQUATION #3

GENERATOR POLYNOMIAL $\quad G = [1 \quad (D^2+1)/(D^2+D+1)]$

PARITY CHECK POLYNOMIAL $\quad (D^2+1)X(D) + (D^2+D+1)P(D) = 0$

PARITY CHECK MATRIX $H =$
```
1100000000000000000000000000000000...
0111000000000000000000000000000000...
1101100000000000000000000000000000...
0011011000000000000000000000000000...
0000110110000000000000000000000000...
0000001101100000000000000000000000...
0000000011011000000000000000000000...
0000000000110110000000000000000000...
0000000000001101100000000000000000...
                                  ...
```

TRANSMISSION SEQUENCE $w_i = (x_i, p_i)$

TRANSMISSION VECTOR $w = (x_1, p_1, x_2, p_2, x_3, p_3, x_4, p_4, x_5, p_5, \cdots, x_i, p_i, \cdots)$ $Hw = 0$

TRANSMISSION APPARATUS AND ASSOCIATED METHOD OF ENCODED DATA

TECHNICAL FIELD

The present invention relates to an encoder, decoder and encoding method using a low-density parity-check convolutional code (LDPC-CC) supporting a plurality of coding rates.

BACKGROUND ART

In recent years, attention has been attracted to a low-density parity-check (LDPC) code as an error correction code that provides high error correction capability with a feasible circuit scale. Because of its high error correction capability and ease of implementation, an LDPC code has been adopted in an error correction coding scheme for IEEE802.11n high-speed wireless LAN systems, digital broadcasting systems, and so forth.

An LDPC code is an error correction code defined by low-density parity check matrix H. An LDPC code is a block code having a block length equal to number of columns N of parity check matrix H (e.g. see Non-Patent Literature 1, Non-Patent Literature 4, or Non-Patent Literature 11). A random-like LDPC code, array LDPC code, and QC-LDPC code (QC: Quasi-Cyclic) are proposed in Non-Patent Literature 2, Non-Patent Literature 3, and Non-Patent Literature 12, for example.

However, a characteristic of many current communication systems is that transmission information is collectively transmitted per variable-length packet or frame, as in the case of Ethernet (registered trademark). A problem with applying an LDPC code, which is a block code, to a system of this kind is, for example, how to make a fixed-length LDPC code block correspond to a variable-length Ethernet (registered trademark) frame. With IEEE802.11n, the length of a transmission information sequence and an LDPC code block length are adjusted by executing padding processing or puncturing processing on a transmission information sequence, but it is difficult to avoid a change in the coding rate and redundant sequence transmission due to padding or puncturing.

In contrast to this kind of LDPC code of block code (hereinafter referred to as "LDPC-BC: Low-Density Parity-Check Block Code"), LDPC-CC (Low-Density Parity-Check Convolutional Code) allowing encoding and decoding of information sequences of arbitrary length have been investigated (see Non-Patent Literature 7, for example).

An LDPC-CC is a convolutional code defined by a low-density parity-check matrix, and, as an example, parity check matrix $H^T[0,n]$ of an LDPC-CC in a coding rate of R=1/2(=b/c) is shown in FIG. 1. Here, element $h_1^{(m)}(t)$ of $H^T[0,n]$ has a value of 0 or 1. All elements other than $h_1^{(m)}(t)$ are 0. M represents the LDPC-CC memory length, and n represents the length of an LDPC-CC codeword. As shown in FIG. 1, a characteristic of an LDPC-CC parity check matrix is that it is a parallelogram-shaped matrix in which 1 is placed only in diagonal terms of the matrix and neighboring elements, and the bottom-left and top-right elements of the matrix are zero.

An LDPC-CC encoder defined by parity check matrix $H^T[0,n]$ when $h_1^{(0)}(t)=1$ and $h_2^{(0)}(t)=1$ here is represented by FIG. 2. As shown in FIG. 2, an LDPC-CC encoder is composed of M+1 shift registers of bit-length c and a modulo 2 adder (exclusive OR calculator). Consequently, a characteristic of an LDPC-CC encoder is that it can be implemented with extremely simple circuitry in comparison with a circuit that performs generator matrix multiplication or an LDPC-BC encoder that performs computation based on backward (forward) substitution. Also, since the encoder in FIG. 2 is a convolutional code encoder, it is not necessary to divide an information sequence into fixed-length blocks when encoding, and an information sequence of any length can be encoded.

CITATION LIST

Non-Patent Literature

[NPL 1]
R. G. Gallager, "Low-density parity check codes," IRE Trans. Inform. Theory, IT-8, pp-21-28, 1962

[NPL 2]
D. J. C. Mackay, "Good error-correcting codes based on very sparse matrices," IEEE Trans. Inform. Theory, vol. 45, no. 2, pp 399-431, March 1999

[NPL 3]
J. L. Fan, "Array codes as low-density parity-check codes," proc. of 2nd Int. Symp. on Turbo Codes, pp. 543-546, September 2000

[NPL 4]
R. D. Gallager, "Low-Density Parity-Check Codes," Cambridge, Mass.: MIT Press, 1963

[NPL 5]
M. P. C. Fossorier, M. Mihaljevic, and H. Imai, "Reduced complexity iterative decoding of low density parity check codes based on belief propagation," IEEE Trans. Commun., vol. 47., no. 5, pp. 673-680, May 1999

[NPL 6]
J. Chen, A. Dholakia, E. Eleftheriou, M. P. C. Fossorier, and X.-Yu Hu, "Reduced-complexity decoding of LDPC codes," IEEE Trans. Commun., vol. 53., no. 8, pp. 1288-1299, August 2005

[NPL 7]
A. J. Feltstrom, and K. S. Zigangirov, "Time-varying periodic convolutional codes with low-density parity-check matrix," IEEE Trans. Inform. Theory, vol. 45, no. 6, pp. 2181-2191, September 1999

[NPL 8]
IEEE Standard for Local and Metropolitan Area Networks, IEEE P802.16e/D12, October 2005

[NPL 9] J. Zhang, and M. P. C. Fossorier, "Shuffled iterative decoding," IEEE Trans. Commun., vol. 53, no. 2, pp. 209-213, February 2005

[NPL 10]
S. Lin, D. J. Jr., Costello, "Error control coding: Fundamentals and applications," Prentice-Hall

[NPL 11]
Tadashi Wadayama, "Low-Density Parity-Check Code and the decoding method", Triceps

[NPL 12]
M. P. C. Fossorier, "Quasi-cyclic low-density parity-check codes from circulant permutation matrices," IEEE Trans. Inform. Theory, vol. 50, no. 8, pp. 1788-1793, November 2001.

SUMMARY OF INVENTION

Technical Problem

However, an LDPC-CC, LDPC-CC encoder and LDPC-CC decoder for supporting a plurality of coding rates in a low computational complexity and providing data of good received quality have not been sufficiently investigated.

For example, Non-Patent Literature 10 discloses using puncturing to support a plurality of coding rates. To support a plurality of coding rates using puncturing, first, a basic code (i.e. mother code) is prepared to generate a coding sequence in the mother code and then select non-transmission bits (i.e. puncturing bits) from the coding sequence. Further, by changing the number of non-transmission bits, a plurality of coding rates are supported. By this means, it is possible to support all coding rates by the encoder and decoder (i.e. mother code encoder and decoder), so that it is possible to provide an advantage of reducing the computational complexity (i.e. circuit scale).

In contrast, as a method of supporting a plurality of coding rates, there is a method of providing different codes (i.e. distributed codes) every coding rate. Especially, as disclosed in Non-Patent Literature 8, an LDPC code has a flexibility of being able to provide various code lengths and coding rates easily, and therefore it is a general method to support a plurality of coding rates by a plurality of codes. In this case, although a use of a plurality of codes has a disadvantage of providing a large computational complexity (i.e. circuit scale), compared to a case where a plurality of coding rates are supported by puncturing, there is an advantage of providing data of excellent received quality.

In view of the above, there are few documents that argue a method of generating an LDPC code that can maintain the received quality of data by preparing a plurality of codes to support a plurality of coding rates, while reducing the computational complexity of the encoder and decoder. If a method of providing an LDPC code to realize this is established, it is possible to improve the received quality of data and reduce the computational complexity at the same time, which has been difficult to realize.

It is therefore an object of the present invention to provide an LDPC-CC encoding method for improving the received quality of data by realizing a plurality of coding rates using a plurality of codes in an LDPC-CC encoder and decoder, and for realizing the encoder and decoder in a low computational complexity.

Solution to Problem

The encoder of the present invention that creates a low-density parity-check convolutional code of a time (varying) period of g (where g is a natural number) using a parity check polynomial of equation 44 of a coding rate of $(q-1)/q$ (where q is an integer equal to or greater than 3), employs a configuration having: a coding rate setting section that sets a coding rate of $(s-1)/s$ $(s \leq q)$; an r-th computing section that receives as input information $X_{r,i}$ (where r=1, 2, . . . , q−1) at point in time i and outputs a computation result of $A_{Xr,k}(D)X_i(D)$ of equation 44; a parity computing section that receives as input parity $P_{i-1}$ at point in time i−1 and outputs a computation result of $B_k(D)P(D)$ of equation 44; an adding section that acquires an exclusive OR of computation results of the first to (q−1)-th computation sections and the computation result of the parity computing section, as parity $P_i$ at point in time i; and an information generating section that sets zero between information $X_{s,i}$ and information $X_{q-1,i}$.

The decoder of the present invention that provides a parity check matrix based on a parity check polynomial of equation 45 of a coding rate of $(q-1)/q$ (where q is an integer equal to or greater than 3) and decodes a low-density parity-check convolutional code of a time varying period of g (where g is a natural number) using belief propagation, employs a configuration having: a log likelihood ratio setting section that sets log likelihood ratios for information from information $X_{s,i}$ to information $X_{q-1,i}$ at point in time i (where i is an integer), to a known value, according to a set coding rate of $(s-1)/s$ $(s \leq q)$; and a computation processing section that performs row processing computation and column processing computation according to the parity check matrix based on the parity check polynomial of equation 45, using the log likelihood ratio.

The encoding method of the present invention for encoding a low-density parity-check convolutional code of a time varying period of g (where g is a natural number) supporting coding rates of $(y-1)/y$ and $(z-1)/z$ $(y<z)$, includes: generating a low-density parity-check convolutional code of the coding rate of $(z-1)/z$ using a parity check polynomial of equation 46; and generating a low-density parity-check convolutional code of the coding rate of $(y-1)/y$ using a parity check polynomial of equation 47.

Advantageous Effect of Invention

According to the encoder and decoder of the present invention, with an LDPC-CC encoder and decoder, it is possible to realize a plurality of coding rates in a low computational complexity and provide data of high received quality.

BRIEF DESCRIPTION OF DRAWINGS

FIG. 1 shows an LDPC-CC parity check matrix;

FIG. 3 shows an example of the configuration of an LDPC-CC parity check matrix of a time varying period of 4;

FIG. 4A shows parity check polynomials of an LDPC-CC of a time varying period of 3 and the configuration of parity check matrix H of this LDPC-CC;

FIG. 5 shows a parity check matrix of a (7, 5) convolutional code;

FIG. 6 shows an example of the configuration of parity check matrix H about an LDPC-CC of a coding rate of 2/3 and a time varying period of 2;

FIG. 7 shows an example of the configuration of an LDPC-CC parity check matrix of a coding rate of 2/3 and a time varying period of m;

DESCRIPTION OF EMBODIMENTS

Figure 2:
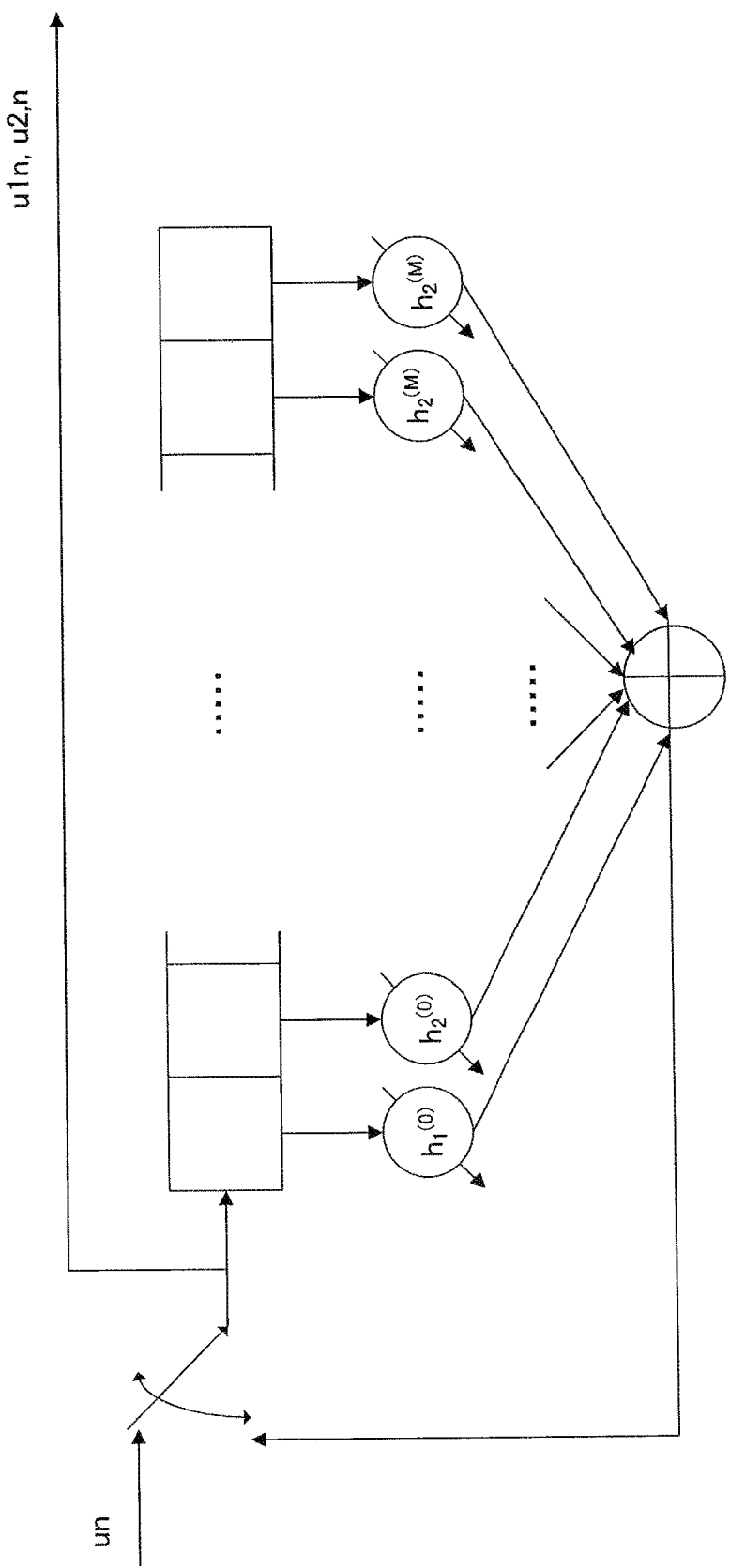
FIG. 2 shows a configuration of an LDPC-CC encoder.

Now, embodiments of the present invention will be described in detail with reference to the accompanying drawings.

First, before explaining the specific configurations and operations in embodiments, an LDPC-CC of good characteristics will be explained.

(LDPC-CC of good characteristics)

An LDPC-CC of a time varying period of g with good characteristics is described below.

First, an LDPC-CC of a time varying period of 4 with good characteristics will be described. A case in which the coding rate is 1/2 is described below as an example.

Consider equations 1-1 to 1-4 as parity check polynomials of an LDPC-CC for which the time varying period is 4. At this time, X(D) is a polynomial representation of data (information) and P(D) is a parity polynomial representation. Here, in equations 1-1 to 1-4, parity check polynomials have been assumed in which there are four terms in X(D) and P(D) respectively, the reason being that four terms are desirable from the standpoint of obtaining good received quality.

[1]

$$(D^{a1}+D^{a2}+D^{a3}+D^{a4})X(D)+(D^{b1}+D^{b2}+D^{b3}+D^{b4})P(D)=0 \quad \text{(Equation 1-1)}$$

$$(D^{A1}+D^{A2}+D^{A3}+D^{A4})X(D)+(D^{B1}+D^{B2}+D^{B3}+D^{B4})P(D)=0 \quad \text{(Equation 1-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Equation 1-3)}$$

$$(D^{E1}+D^{E2}+D^{E3}+D^{E4})X(D)+(D^{F1}+D^{F2}+D^{F3}+D^{F4})P(D)=0 \quad \text{(Equation 1-4)}$$

In equation 1-1, it is assumed that a1, a2, a3 and a4 are integers (where a1≠a2≠a3≠a4, and a1 to a4 are all mutually different). Use of the notation "X≠Y≠ . . . ≠Z" is assumed to express the fact that X, Y, . . . , Z are all mutually different. Also, it is assumed that b1, b2, b3 and b4 are integers (where b1≠b2≠b3≠b4). A parity check polynomial of equation 1-1 is called "check equation #1," and a sub-matrix based on the parity check polynomial of equation 1-1 is designated first sub-matrix $H_1$.

In equation 1-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 1-2 is called "check equation #2," and a sub-matrix based on the parity check polynomial of equation 1-2 is designated second sub-matrix $H_2$.

In equation 1-3, it is assumed that α1, α2, α3, and α4 are integers (where α1≠α2≠α3≠α4). Also, it is assumed that β1, β2, β3, and β4 are integers (where β1≠β2≠β3≠β4). A parity check polynomial of equation 1-3 is called "check equation #3," and a sub-matrix based on the parity check polynomial of equation 1-3 is designated third sub-matrix $H_3$.

In equation 1-4, it is assumed that E1, E2, E3, and E4 are integers (where E1≠E2≠E3≠E4). Also, it is assumed that F1, F2, F3, and F4 are integers (where F1≠F2≠F3≠F4). A parity check polynomial of equation 1-4 is called "check equation #4," and a sub-matrix based on the parity check polynomial of equation 1-4 is designated fourth sub-matrix $H_4$.

Next, an LDPC-CC of a time varying period of 4 is considered that generates a parity check matrix such as shown in FIG. 3 from first sub-matrix $H_1$, second sub-matrix $H_2$, third sub-matrix $H_3$, and fourth sub-matrix $H_4$.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4), (F1, F2, F3, F4), in equations 1-1 to 1-4 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of the other parity check equations ("check equation #2," "check equation #3" and "check equation #4").

By this means, the column weight of parity check matrix H configured from equations 1-1 to 1-4 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 4, an LDPC-CC offering good reception performance can be obtained by generating an LDPC-CC as described above.

Table 1 shows examples of LDPC-CCs (LDPC-CCs #1 to #3) of a time varying period of 4 and a coding rate of 1/2 for which the above condition about "remainder" holds true. In table 1, LDPC-CCs of a time varying period of 4 are defined by four parity check polynomials: "check polynomial #1," "check polynomial #2," "check polynomial #3," and "check polynomial #4."

[2]

$$(D^{a1}+D^{a2}+D^{a3}+D^{a4})X(D)+(D^{b1}+D^{b2}+D^{b3}+D^{b4})P(D)=0 \quad \text{(Equation 2-1)}$$

$$(D^{A1}+D^{A2}+D^{A3}+D^{A4})X(D)+(D^{B1}+D^{B2}+D^{B3}+D^{B4})P(D)=0 \quad \text{(Equation 2-2)}$$

In equation 2-1, it is assumed that a1, a2, a3, and a4 are integers (where $a1 \neq a2 \neq a3 \neq a4$). Also, it is assumed that b1, b2, b3, and b4 are integers (where $b1 \neq b2 \neq b3 \neq b4$). A parity check polynomial of equation 2-1 is called "check equation #1," and a sub-matrix based on the parity check polynomial of equation 2-1 is designated first sub-matrix $H_1$.

In equation 2-2, it is assumed that A1, A2, A3, and A4 are integers (where $A1 \neq A2 \neq A3 \neq A4$). Also, it is assumed that B1, B2, B3, and B4 are integers (where $B1 \neq B2 \neq B3 \neq B4$). A parity check polynomial of equation 2-2 is called "check equation #2," and a sub-matrix based on the parity check polynomial of equation 2-2 is designated second sub-matrix $H_2$.

TABLE 1

| Code | Parity check polynomial |
| --- | --- |
| LDPC-CC #1 of a time varying period of 4 and a coding rate of 1/2 | Check polynomial #1: $(D^{458} + D^{435} + D^{341} + 1)X(D) + (D^{598} + D^{373} + D^{67} + 1)P(D) = 0$<br>Check polynomial #2: $(D^{287} + D^{213} + D^{130} + 1)X(D) + (D^{545} + D^{542} + D^{103} + 1)P(D) = 0$<br>Check polynomial #3: $(D^{557} + D^{495} + D^{326} + 1)X(D) + (D^{561} + D^{502} + D^{351} + 1)P(D) = 0$<br>Check polynomial #4: $(D^{426} + D^{329} + D^{99} + 1)X(D) + (D^{321} + D^{55} + D^{42} + 1)P(D) = 0$ |
| LDPC-CC #2 of a time varying period of 4 and a coding rate of 1/2 | Check polynomial #1: $(D^{503} + D^{454} + D^{49} + 1)X(D) + (D^{569} + D^{467} + D^{402} + 1)P(D) = 0$<br>Check polynomial #2: $(D^{518} + D^{473} + D^{203} + 1)X(D) + (D^{598} + D^{499} + D^{145} + 1)P(D) = 0$<br>Check polynomial #3: $(D^{403} + D^{397} + D^{62} + 1)X(D) + (D^{294} + D^{267} + D^{69} + 1)P(D) = 0$<br>Check polynomial #4: $(D^{483} + D^{385} + D^{94} + 1)X(D) + (D^{426} + D^{415} + D^{413} + 1)P(D) = 0$ |
| LDPC-CC #3 of a time varying period of 4 and a coding rate of 1/2 | Check polynomial #1: $(D^{454} + D^{447} + D^{17} + 1)X(D) + (D^{494} + D^{237} + D^{7} + 1)P(D) = 0$<br>Check polynomial #2: $(D^{583} + D^{545} + D^{506} + 1)X(D) + (D^{325} + D^{71} + D^{66} + 1)P(D) = 0$<br>Check polynomial #3: $(D^{430} + D^{425} + D^{407} + 1)X(D) + (D^{582} + D^{47} + D^{45} + 1)P(D) = 0$<br>Check polynomial #4: $(D^{434} + D^{353} + D^{127} + 1)X(D) + (D^{345} + D^{207} + D^{38} + 1)P(D) = 0$ |

In the above description, a case in which the coding rate is 1/2 has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 2, also, it has been confirmed that a code with good characteristics can be found if the above condition about "remainder" is applied. An LDPC-CC of a time varying period of 2 with good characteristics is described below. A case in which the coding rate is 1/2 is described below as an example.

Consider equations 2-1 and 2-2 as parity check polynomials of an LDPC-CC for which the time varying period is 2. At this time, X(D) is a polynomial representation of data (information) and P(D) is a parity polynomial representation. Here, in equations 2-1 and 2-2, parity check polynomials have been assumed in which there are four terms in X(D) and P(D) respectively, the reason being that four terms are desirable from the standpoint of obtaining good received quality.

Next, an LDPC-CC of a time varying period of 2 generated from first sub-matrix $H_1$ and second sub-matrix $H_2$ is considered.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), in equations 2-1 and 2-2 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of "check equation #2."

By this means, the column weight of parity check matrix H configured from equations 2-1 and 2-2 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 8, an LDPC-CC enabling reception performance to be further improved can be obtained by generating an LDPC-CC as described above.

Table 2 shows examples of LDPC-CCs (LDPC-CCs #1 and #2) of a time varying period of 2 and a coding rate of 1/2 for which the above condition about "remainder" holds true. In table 2, LDPC-CCs of a time varying period of 2 are defined by two parity check polynomials: "check polynomial #1" and "check polynomial #2."

TABLE 2

| Code | Parity check polynomial |
| --- | --- |
| LDPC-CC #1 of a time varying period of 2 and a coding rate of 1/2 | Check polynomial #1: $(D^{551} + D^{465} + D^{98} + 1)X(D) + (D^{407} + D^{386} + D^{373} + 1)P(D) = 0$<br>Check polynomial #2: $(D^{443} + D^{433} + D^{54} + 1)X(D) + (D^{559} + D^{557} + D^{546} + 1)P(D) = 0$ |
| LDPC-CC #2 of a time varying period of 2 and a coding rate of 1/2 | Check polynomial #1: $(D^{265} + D^{190} + D^{99} + 1)X(D) + (D^{295} + D^{246} + D^{69} + 1)P(D) = 0$<br>Check polynomial #2: $(D^{275} + D^{226} + D^{213} + 1)X(D) + (D^{298} + D^{147} + D^{45} + 1)P(D) = 0$ |

In the above description (LDPC-CCs of a time varying period of 2), a case in which the coding rate is 1/2 has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 3, also, it has been confirmed that a code with good characteristics can be found if the following condition about "remainder" is applied. An LDPC-CC of a time varying period of 3 with good characteristics is described below. A case in which the coding rate is 1/2 is described below as an example.

Consider equations 3-1 to 3-3 as parity check polynomials of an LDPC-CC for which the time varying period is 3. At this time, X(D) is a polynomial representation of data (information) and P(D) is a parity polynomial representation. Here, in equations 3-1 to 3-3, parity check polynomials are assumed such that there are three terms in X(D) and P(D) respectively.

[3]

$$(D^{a1}+D^{a2}+D^{a3})X(D)+(D^{b1}+D^{b2}+D^{b3})P(D)=0 \quad \text{(Equation 3-1)}$$

$$(D^{A1}+D^{A2}+D^{A3})X(D)+(D^{B1}+D^{B2}+D^{B3})P(D)=0 \quad \text{(Equation 3-2)}$$

$$(D^{\alpha 1}+D^{\alpha 2}+D^{\alpha 3})X(D)+(D^{\beta 1}+D^{\beta 2}+D^{\beta 3})P(D)=0 \quad \text{(Equation 1-3)}$$

In equation 3-1, it is assumed that a1, a2, and a3 are integers (where a1≠a2≠a3). Also, it is assumed that b1, b2 and b3 are integers (where b1≠b2≠b3). A parity check polynomial of equation 3-1 is called "check equation #1," and a sub-matrix based on the parity check polynomial of equation 3-1 is designated first sub-matrix $H_1$.

In equation 3-2, it is assumed that A1, A2 and A3 are integers (where A1≠A2≠A3). Also, it is assumed that B1, B2 and B3 are integers (where B1≠B2≠B3). A parity check polynomial of equation 3-2 is called "check equation #2," and a sub-matrix based on the parity check polynomial of equation 3-2 is designated second sub-matrix $H_2$.

In equation 3-3, it is assumed that α1, α2 and α3 are integers (where α1≠α2≠α3). Also, it is assumed that β1, β2 and β3 are integers (where β1≠β2≠β3). A parity check polynomial of equation 3-3 is called "check equation #3," and a sub-matrix based on the parity check polynomial of equation 3-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of X(D) and P(D), (a1, a2, a3), (b1, b2, b3), (A1, A2, A3), (B1, B2, B3), (α1, α2, α3), (β1, β2, β3), in equations 3-1 to 3-3 by 3, provision is made for one each of remainders 0, 1, and 2 to be included in three-coefficient sets represented as shown above (for example, (a1, a2, a3)), and to hold true for all the above three-coefficient sets.

For example, if orders (a1, a2, a3) of X(D) of "check equation #1" are set as (a1, a2, a3)=(6, 5, 4), remainders k after dividing orders (a1, a2, a3) by 3 are (0, 2, 1), and one each of 0, 1, 2 are included in the three-coefficient set as remainders k. Similarly, if orders (b1, b2, b3) of P(D) of "check equation #1" are set as (b1, b2, b3)=(3, 2, 1), remainders k after dividing orders (b1, b2, b3) by 3 are (0, 2, 1), and one each of 0, 1, 2 are included in the three-coefficient set as remainders k. It is assumed that the above condition about "remainder" also holds true for the three-coefficient sets of X(D) and P(D) of "check equation #2" and "check equation #3."

By generating an LDPC-CC as above, it is possible to generate a regular LDPC-CC code in which the row weight is equal in all rows and the column weight is equal in all columns, without some exceptions. Here, "exceptions" refer to part in the beginning of a parity check matrix and part in the end of the parity check matrix, where the row weights and columns weights are not the same as row weights and column weights of the other part. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained. This is because, when considered in column units, positions at which "1" is present are arranged so as to propagate belief accurately, as described above.

The above belief propagation will be described below using accompanying drawings. FIG. 4A shows parity check polynomials of an LDPC-CC of a time varying period of 3 and the configuration of parity check matrix H of this LDPC-CC.

"Check equation #1" illustrates a case in which (a1, a2, a3)=(2, 1, 0) and (b1, b2, b3)=(2, 1, 0) in a parity check polynomial of equation 3-1, and remainders after dividing the coefficients by 3 are as follows: (a1%3, a2%3, a3%3)=(2, 1, 0), (b1%3, b2%3, b3%3)=(2, 1, 0), where "Z %3" represents a remainder after dividing Z by 3.

"Check equation #2" illustrates a case in which (A1, A2, A3)=(5, 1, 0) and (B1, B2, B3)=(5, 1, 0) in a parity check polynomial of equation 3-2, and remainders after dividing the coefficients by 3 are as follows: (A1%3, A2%3, A3%3)=(2, 1, 0), (B1%3, B2%3, B3%3)=(2, 1, 0).

"Check equation #3" illustrates a case in which ($\alpha$1, $\alpha$2, $\alpha$3)=(4, 2, 0) and ($\beta$1, $\beta$2, $\beta$3)=(4, 2, 0) in a parity check polynomial of equation 3-3, and remainders after dividing the coefficients by 3 are as follows: ($\alpha$1%3, $\alpha$2%3, $\alpha$3%3)=(1, 2, 0), ($\beta$1%3, $\beta$2%3, $\beta$3%3)=(1, 2, 0).

Therefore, the example of LDPC-CC of a time varying period of 3 shown in FIG. 4A satisfies the above condition about "remainder", that is, a condition that (a1%3, a2%3, a3%3), (b1%3, b2%3, b3%3), (A1%3, A2%3, A3%3), (B1%3, B2%3, B3%3), ($\alpha$1%3, $\alpha$2%3, $\alpha$3%3) and ($\beta$1%3, 62 2%3, $\beta$3%3) are any of the following: (0, 1, 2), (0, 2, 1), (1, 0, 2), (1, 2, 0), (2, 0, 1), (2, 1, 0).

Returning to FIG. 4A again, belief propagation will now be explained. By column computation of column 6506 in BP decoding, for "1" of area 6501 of "check equation #1," belief is propagated from "1" of area 6504 of "check equation #2" and from "1" of area 6505 of "check equation #3." As described above, "1" of area 6501 of "check equation #1" is a coefficient for which a remainder after division by 3 is 0 (a3%3=0 (a3=0) or b3%3=0 (b3=0)). Also, "1" of area 6504 of "check equation #2" is a coefficient for which a remainder after division by 3 is 1 (A2%3=1 (A2=1) or B2%3=1 (B2=1)). Furthermore, "1" of area 6505 of "check equation #3" is a coefficient for which a remainder after division by 3 is 2 ($\alpha$2%3=2 ($\alpha$2=2) or $\beta$2%3=2 ($\beta$2=2)).

Thus, for "1" of area 6501 for which a remainder is 0 in the coefficients of "check equation #1," in column computation of column 6506 in BP decoding, belief is propagated from "1" of area 6504 for which a remainder is 1 in the coefficients of "check equation #2" and from "1" of area 6505 for which a remainder is 2 in the coefficients of "check equation #3."

Similarly, for "1" of area 6502 for which a remainder is 1 in the coefficients of "check equation #1," in column computation of column 6509 in BP decoding, belief is propagated from "1" of area 6507 for which a remainder is 2 in the coefficients of "check equation #2" and from "1" of area 6508 for which a remainder is 0 in the coefficients of "check equation #3."

Similarly, for "1" of area 6503 for which a remainder is 2 in the coefficients of "check equation #1," in column computation of column 6512 in BP decoding, belief is propagated from "1" of area 6510 for which a remainder is 0 in the coefficients of "check equation #2" and from "1" of area 6511 for which a remainder is 1 in the coefficients of "check equation #3."

Figure 4B:
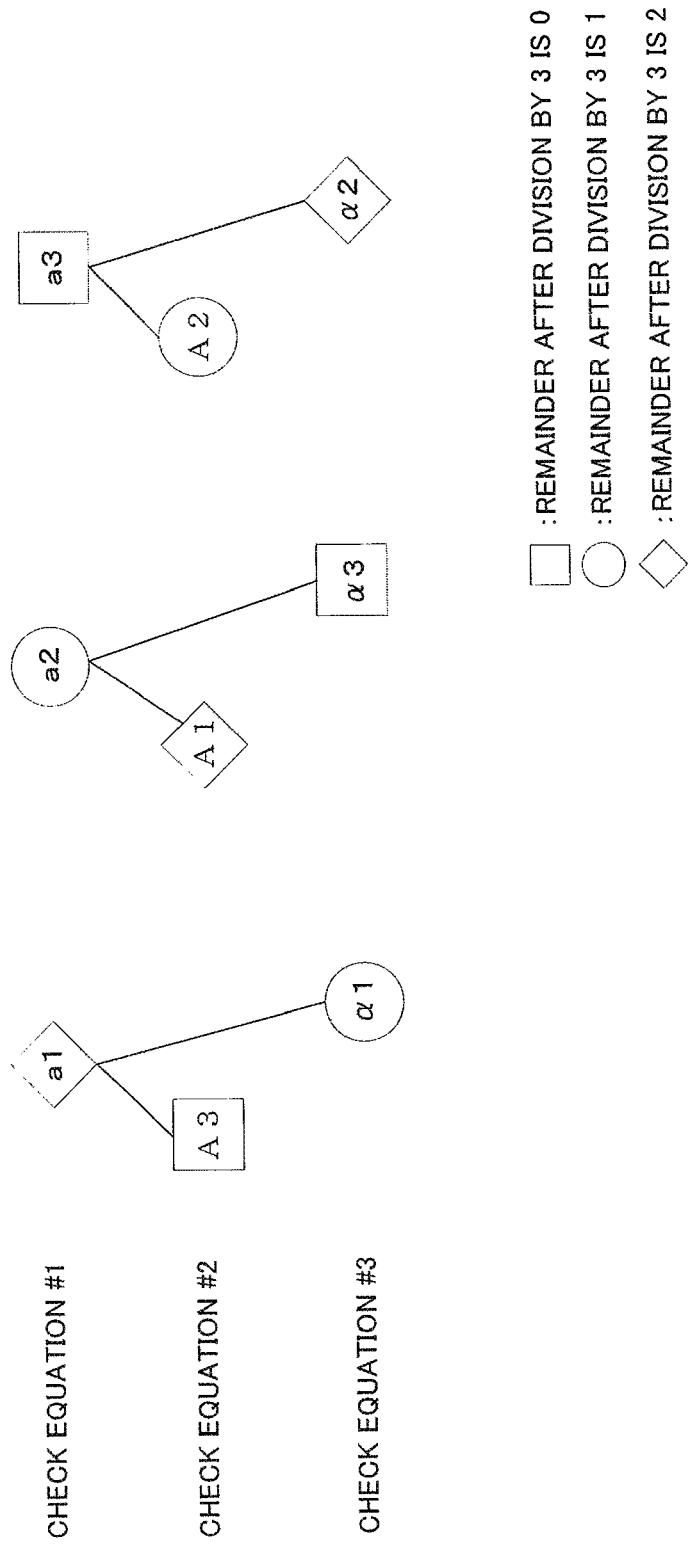
FIG. 4B shows the belief propagation relationship of terms relating to X(D) of "check equation #1" to "check equation #3" in FIG. 4A.

A supplementary explanation of belief propagation will now be given using FIG. 4B. FIG. 4B shows the belief propagation relationship of terms relating to X(D) of "check equation #1" to "check equation #3" in FIG. 4A. "Check equation #1" to "check equation #3" in FIG. 4A illustrate cases in which (a1, a2, a3)=(2, 1, 0), (A1, A2, A3)=(5, 1, 0), and ($\alpha$1, $\alpha$2, $\alpha$3)=(4, 2, 0), in terms relating to X(D) of equations 3-1 to 3-3.

In FIG. 4B, terms (a3, A3, $\alpha$3) inside squares indicate coefficients for which a remainder after division by 3 is 0, terms (a2, A2, $\alpha$2) inside circles indicate coefficients for which a remainder after division by 3 is 1, and terms (a1, A1, $\alpha$1) inside diamond-shaped boxes indicate coefficients for which a remainder after division by 3 is 2.

As can be seen from FIG. 4B, for a1 of "check equation #1," belief is propagated from A3 of "check equation #2" and from $\alpha$1 of "check equation #3" for which remainders after division by 3 differ; for a2 of "check equation #1," belief is propagated from A1 of "check equation #2" and from $\alpha$3 of "check equation #3" for which remainders after division by 3 differ; and, for a3 of "check equation #1," belief is propagated from A2 of "check equation #2" and from $\alpha$2 of "check equation #3" for which remainders after division by 3 differ. While FIG. 4B shows the belief propagation relationship of terms relating to X(D) of "check equation #1" to "check equation #3," the same applies to terms relating to P(D).

Thus, for "check equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, beliefs with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "check equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the orders of parity check polynomials of equations 3-1 to 3-3 to satisfy the above condition about "remainder" in this way, belief is necessarily propagated in all column computations, so that it is possible to perform belief propagation efficiently in all check equations and further increase error correction capability.

A case in which the coding rate is 1/2 has been described above for an LDPC-CC of a time varying period of 3, but the coding rate is not limited to 1/2. A regular LDPC code is also formed and good received quality can be obtained when the coding rate is (n−1)/n (where n is an integer equal to or greater than 2) if the above condition about "remainder" holds true for three-coefficient sets in information X1(D), X2(D), . . . , Xn−1(D).

A case in which the coding rate is (n−1)/n (where n is an integer equal to or greater than 2) is described below.

Consider equations 4-1 to 4-3 as parity check polynomials of an LDPC-CC for which the time varying period is 3. At this time, X1(D), X2(D), . . . , Xn−1(D) are polynomial representations of data (information) X1, X2, . . . , Xn−1, and P(D) is a polynomial representation of parity. Here, in equations 4-1 to 4-3, parity check polynomials are assumed such that there are three terms in X1(D), X2(D), . . . , Xn−1(D), and P(D) respectively.

[4]

$$(D^{a1,1}+D^{a1,2}+D^{a1,3})X_1(D)+(D^{a2,1}+D^{a2,2}+D^{a2,3})X_2(D)+ \ldots +(D^{an-1,1}+D^{an-1,2}+D^{an-1,3})X_{n-1}(D)+(D^{b1}+D^{b2}+D^{b3})P(D)=0 \quad \text{(Equation 4-1)}$$

$$(D^{A1,1}+D^{A1,2}+D^{A1,3})X_1(D)+(D^{A2,1}+D^{A2,2}+D^{A2,3})X_2(D)+ \ldots +(D^{An-1,1}+D^{An-1,2}+D^{An-1,3})X_{n-1}(D)+(D^{B1}+D^{B2}+D^{B3})P(D)=0 \quad \text{(Equation 4-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+ \ldots +(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Equation 4-3)}$$

In equation 4-1, it is assumed that $a_{i,1}$, $a_{i,2}$, and $a_{i,3}$ (where i=1,2, . . . , n−1) are integers (where $a_{i,1} \neq a_{i,2} \neq a_{i,3}$). Also, it is assumed that b1, b2 and b3 are integers (where b1≠b2≠b3). A parity check polynomial of equation 4-1 is called "check equation #1," and a sub-matrix based on the parity check polynomial of equation 4-1 is designated first sub-matrix $H_1$.

In equation 4-2, it is assumed that $A_{i,1}$, $A_{i,2}$, and $A_{i,3}$ (where i=1, 2, . . . , n−1) are integers (where $A_{i,1} \neq A_{i,2} \neq A_{i,3}$). Also, it is assumed that B1, B2 and B3 are integers (where B1≠B2≠B3). A parity check polynomial of equation 4-2 is called "check equation #2," and a sub-matrix based on the parity check polynomial of equation 4-2 is designated second sub-matrix $H_2$.

In equation 4-3, it is assumed that $\alpha_{i,1}$, $\alpha_{i,2}$, and $\alpha_{i,3}$ (where i=1, 2, . . . , n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of equation 4-3 is called "check equation #3," and a sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of X1(D), X2(D), . . . , Xn−1(D), and P(D), $(a_{1,1}, a_{1,2}, a_{1,3})$, $(a_{2,1}, a_{2,2}, a_{2,3})$, . . . , $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, . . . , $(A_{n-1,1}, A_{n-1,3})$, (B1, B2, B3), $(\alpha_{1,1}, \alpha_{1,2}, \alpha_{1,3})$, $(\alpha_{2,1}, \alpha_{2,2}, \alpha_{2,3})$, . . . , $(\alpha_{n-1,1}, \alpha_{n-1,2}, \alpha_{n-1,3})$, (β1, β2, β3), in equations 4-1 to 4-3 by 3, provision is made for one each of remainders 0, 1, and 2 to be included in three-coefficient sets represented as shown above (for example, $(a_{1,1}, a_{1,2}, a_{1,3})$), and to hold true for all the above three-coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, . . . , $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, . . . , $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, \alpha_{2,3}\%3)$,. . . ,$(\alpha_{n-1,1}\%3, \alpha_{n-1,2}\%3, \alpha_{n-1,3}\%3)$ and (β1%3, β2%3, β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of 1/2.

Table 3 shows examples of LDPC-CCs (LDPC-CCs #1, #2, #3, #4, and #5) of a time varying period of 3 and a coding rate of 1/2 for which the above "remainder" related condition holds true. In table 3, LDPC-CCs of a time varying period of 3 are defined by three parity check polynomials: "check (polynomial) equation #1," "check (polynomial) equation #2" and "check (polynomial) equation #3."

TABLE 3

| Code | Parity check polynomial |
|---|---|
| LDPC-CC #1 of a time varying period of 3 and a coding rate of 1/2 | Check polynomial #1: $(D^{428} + D^{325} + 1)X(D) + (D^{538} + D^{332} + 1)P(D) = 0$<br>Check polynomial #2: $(D^{538} + D^{380} + 1)X(D) + (D^{449} + D^{1} + 1)P(D) = 0$<br>Check polynomial #3: $(D^{583} + D^{170} + 1)X(D) + (D^{364} + D^{242} + 1)P(D) = 0$ |
| LDPC-CC #2 of a time varying period of 3 and a coding rate of 1/2 | Check polynomial #1: $(D^{562} + D^{71} + 1)X(D) + (D^{325} + D^{155} + 1)P(D) = 0$<br>Check polynomial #2: $(D^{215} + D^{106} + 1)X(D) + (D^{566} + D^{142} + 1)P(D) = 0$<br>Check polynomial #3: $(D^{590} + D^{559} + 1)X(D) + (D^{127} + D^{110} + 1)P(D) = 0$ |
| LDPC-CC #3 of a time varying period of 3 and a coding rate of 1/2 | Check polynomial #1: $(D^{112} + D^{53} + 1)X(D) + (D^{110} + D^{88} + 1)P(D) = 0$<br>Check polynomial #2: $(D^{103} + D^{47} + 1)X(D) + (D^{85} + D^{83} + 1)P(D) = 0$<br>Check polynomial #3: $(D^{148} + D^{89} + 1)X(D) + (D^{146} + D^{49} + 1)P(D) = 0$ |
| LDPC-CC #4 of a time varying period of 3 and a coding rate of 1/2 | Check polynomial #1: $(D^{350} + D^{322} + 1)X(D) + (D^{448} + D^{338} + 1)P(D) = 0$<br>Check polynomial #2: $(D^{529} + D^{32} + 1)X(D) + (D^{238} + D^{188} + 1)P(D) = 0$<br>Check polynomial #3: $(D^{592} + D^{572} + 1)X(D) + (D^{578} + D^{568} + 1)P(D) = 0$ |

TABLE 3-continued

| Code | Parity check polynomial |
|---|---|
| LDPC-CC #5 of a time varying period of 3 and a coding rate of 1/2 | Check polynomial #1: $(D^{410} + D^{82} + 1)X(D) + (D^{835} + D^{47} + 1)P(D) = 0$<br>Check polynomial #2: $(D^{875} + D^{796} + 1)X(D) + (D^{962} + D^{871} + 1)P(D) = 0$<br>Check polynomial #3: $(D^{605} + D^{547} + 1)X(D) + (D^{950} + D^{439} + 1)P(D) = 0$ |
| LDPC-CC #6 of a time varying period of 3 and a coding rate of 1/2 | Check polynomial #1: $(D^{373} + D^{56} + 1)X(D) + (D^{406} + D^{218} + 1)P(D) = 0$<br>Check polynomial #2: $(D^{457} + D^{197} + 1)X(D) + (D^{491} + D^{22} + 1)P(D) = 0$<br>Check polynomial #3: $(D^{485} + D^{70} + 1)X(D) + (D^{236} + D^{181} + 1)P(D) = 0$ |

It has been confirmed that, as in the case of a time varying period of 3, a code with good characteristics can be found if the condition about "remainder" below is applied to an LDPC-CC for which the time varying period is a multiple of 3 (for example, 6, 9, 12, . . . ). An LDPC-CC of a multiple of a time varying period of 3 with good characteristics is described below. The case of an LDPC-CC of a coding rate of 1/2 and a time varying period of 6 is described below as an example.

Consider equations 5-1 to 5-6 as parity check polynomials of an LDPC-CC for which the time varying period is 6.

[5]

$$(D^{a1,1}+D^{a1,2}+D^{a1,3})X(D)+(D^{b1,1}+D^{b1,2}+D^{b1,3})P(D)=0 \quad \text{(Equation 5-1)}$$

$$(D^{a2,1}+D^{a2,2}+D^{a2,3})X(D)+(D^{b2,1}+D^{b2,2}+D^{b2,3})P(D)=0 \quad \text{(Equation 5-2)}$$

$$(D^{a3,1}+D^{a3,2}+D^{a3,3})X(D)+(D^{b3,1}+D^{b3,2}+D^{b3,3})P(D)=0 \quad \text{(Equation 5-3)}$$

$$(D^{a4,1}+D^{a4,2}+D^{a4,3})X(D)+(D^{b4,1}+D^{b4,2}+D^{b4,3})P(D)=0 \quad \text{(Equation 5-4)}$$

$$(D^{a5,1}+D^{a5,2}+D^{a5,3})X(D)+(D^{b5,1}+D^{b5,2}+D^{b5,3})P(D)=0 \quad \text{(Equation 5-5)}$$

$$(D^{a6,1}+D^{a6,2}+D^{a6,3})X(D)+(D^{b6,1}+D^{b6,2}+D^{b6,3})P(D)=0 \quad \text{(Equation 5-6)}$$

At this time, X(D) is a polynomial representation of data (information) and P(D) is a parity polynomial representation. With an LDPC-CC of a time varying period of 6, if i %6=k (where k=0, 1, 2, 3, 4, 5) is assumed for parity Pi and information Xi at time i, a parity check polynomial of equation 5-(k+1) holds true. For example, if i=1, i %6=1 (k=1), and therefore equation 6 holds true.

[6]

$$(D^{a2,1}+D^{a2,2}+D^{a2,3})X_1+(D^{b2,1}+D^{b2,2}+D^{b2,3})P_1=0 \quad \text{(Equation 6)}$$

Here, in equations 5-1 to 5-6, parity check polynomials are assumed such that there are three terms in X(D) and P(D) respectively.

In equation 5-1, it is assumed that a1,1, a1,2, a1,3 are integers (where a1,1≠a1,2≠a1,3). Also, it is assumed that b1,1, b1,2, and b1,3 are integers (where b1,1≠b1,2≠b1,3). A parity check polynomial of equation 5-1 is called "check equation #1," and a sub-matrix based on the parity check polynomial of equation 5-1 is designated first sub-matrix $H_1$.

In equation 5-2, it is assumed that a2,1, a2,2, and a2,3 are integers (where a2,1≠a2,2≠a2,3). Also, it is assumed that b2,1, b2,2, b2,3 are integers (where b2,1≠b2,2≠b2,3). A parity check polynomial of equation 5-2 is called "check equation #2," and a sub-matrix based on the parity check polynomial of equation 5-2 is designated second sub-matrix $H_2$.

In equation 5-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of equation 5-3 is called "check equation #3," and a sub-matrix based on the parity check polynomial of equation 5-3 is designated third sub-matrix $H_3$.

In equation 5-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of equation 5-4 is called "check equation #4," and a sub-matrix based on the parity check polynomial of equation 5-4 is designated fourth sub-matrix $H_4$.

In equation 5-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of equation 5-5 is called "check equation #5," and a sub-matrix based on the parity check polynomial of equation 5-5 is designated fifth sub-matrix $H_5$.

In equation 5-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of equation 5-6 is called "check equation #6," and a sub-matrix based on the parity check polynomial of equation 5-6 is designated sixth sub-matrix $H_6$.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$ and sixth sub-matrix $H_6$.

At this time, if k is designated as a remainder after dividing the values of combinations of orders of X(D) and P(D), (a1,1, a1,2, a1,3), (b1,1, b1,2, b1,3), (a2,1, a2,2, a2,3), (b2,1, b2,2, b2,3), (a3,1, a3,2, a3,3), (b3,1, b3,2, b3,3), (a4,1, a4,2, a4,3), (b4,1, b4,2, b4,3), (a5,1, a5,2, a5,3), (b5,1, b5,2, b5,3), (a6,1, a6,2, a6,3), (b6,1, b6,2, b6,3), in equations 5-1 to 5-6 by 3, provision is made for one each of remainders 0, 1, and 2 to be included in three-coefficient sets represented as shown above (for example, (a1,1, a1,2, a1,3)), and to hold true for all the above three-coefficient sets. That is to say, provision is made for (a1,1%3, a1,2%3, a1,3%3), (b1,1%3, b1,2%3, b1,3%3), (a2,1%3, a2,2%3, a2,3%3), (b2,1%3, b2,2%3, b2,3%3), (a3,1%3, a3,2%3, a3,3%3), (b3,1%3, b3,2%3, b3,3%3), (a4,1%3, a4,2%3, a4,3%3), (b4,1%3, b4,2%3, b4,3%3), (a5,1%3, a5,2%3, a5,3%3), (b5,1%3, b5,2%3, b5,3%3), (a6,1%3, a6,2%3, a6,3%3) and (b6,1%3, b6,2%3, b6,3%3) to be any of the following: (0, 1, 2), (0, 2, 1), (1, 0, 2), (1, 2, 0), (2, 0, 1), (2, 1, 0).

By generating an LDPC-CC in this way, if an edge is present when a Tanner graph is drawn for "check equation #1," belief in "check equation #2 or check equation #5" and belief in "check equation #3 or check equation #6" are propagated accurately.

Also, if an edge is present when a Tanner graph is drawn for "check equation #2," belief in "check equation #1 or check equation #4" and belief in "check equation #3 or check equation #6" are propagated accurately.

If an edge is present when a Tanner graph is drawn for "check equation #3," belief in "check equation #1 or check equation #4" and belief in "check equation #2 or check equation #5" are propagated accurately. If an edge is present when a Tanner graph is drawn for "check equation #4," belief in "check equation #2 or check equation #5" and belief in "check equation #3 or check equation #6" are propagated accurately.

If an edge is present when a Tanner graph is drawn for "check equation #5," belief in "check equation #1 or check equation #4" and belief in "check equation #3 or check equation #6" are propagated accurately. If an edge is present when a Tanner graph is drawn for "check equation #6," belief in "check equation #1 or check equation #4" and belief in "check equation #2 or check equation #5" are propagated accurately.

Consequently, an LDPC-CC of a time varying period of 6 can maintain better error correction capability in the same way as when the time varying period is 3.

Figure 4C:
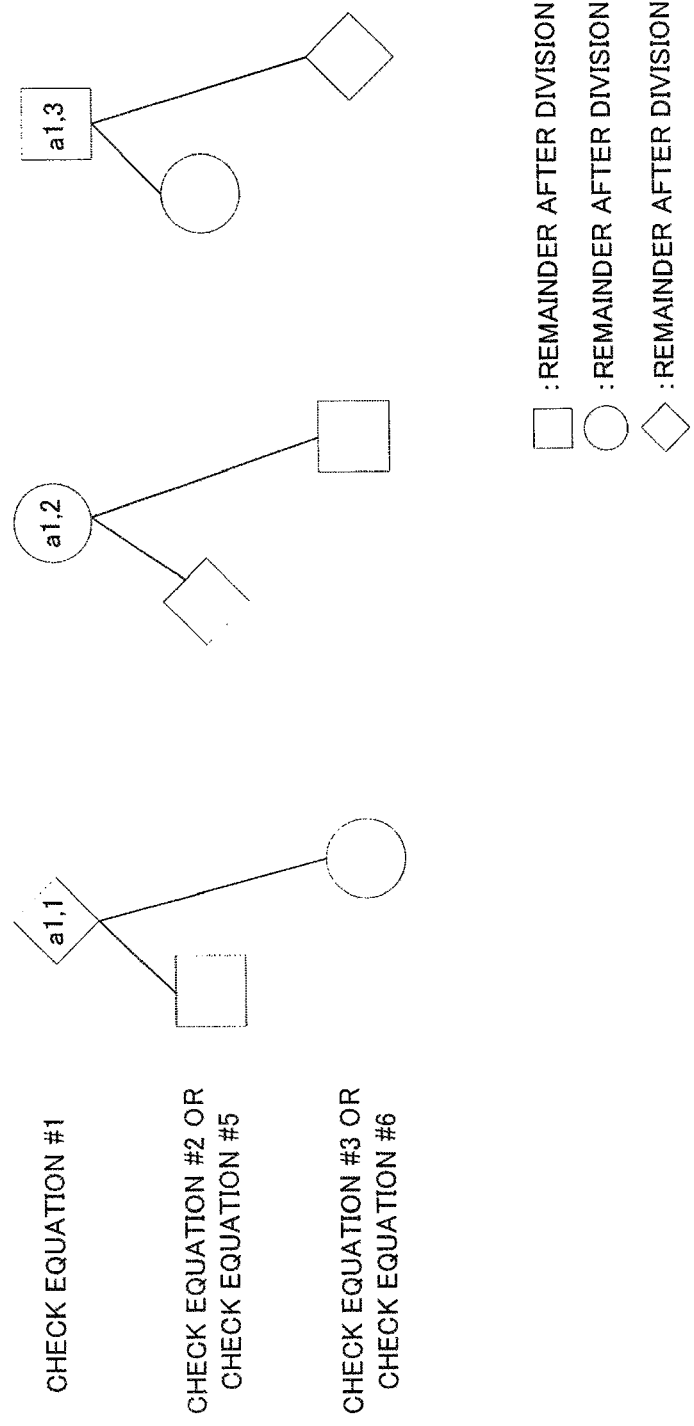
FIG. 4C shows the belief propagation relationship of terms relating to X(D) of "check equation #1" to "check equation #6"

In this regard, belief propagation will be described using FIG. 4C. FIG. 4C shows the belief propagation relationship of terms relating to X(D) of "check equation #1" to "check equation #6." In FIG. 4C, a square indicates a coefficient for which a remainder after division by 3 in $a_{x,y}$ (where x=1, 2, 3, 4, 5, 6, and y=1, 2, 3) is 0.

A circle indicates a coefficient for which a remainder after division by 3 in $a_{x,y}$ (where x=1, 2, 3, 4, 5, 6, and y=1, 2, 3) is 1. A diamond-shaped box indicates a coefficient for which a remainder after division by 3 in $a_{x,y}$ (where x=1, 2, 3, 4, 5, 6, and y=1, 2, 3) is 2.

As can be seen from FIG. 4C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ.

Similarly, if an edge is present when a Tanner graph is drawn, for a1,3 of "check equation #1," belief is propagated from "check equation #2 or #5" and "check equation #3 or #6" for which remainders after division by 3 differ. While FIG. 4C shows the belief propagation relationship of terms relating to X(D) of "check equation #1" to "check equation #6," the same applies to terms relating to P(D).

Thus, belief is propagated to each node in a Tanner graph of "check equation #1" from coefficient nodes of other than "check equation #1." Therefore, beliefs with low correlation are all propagated to "check equation #1," enabling an improvement in error correction capability to be expected.

In FIG. 4C, "check equation #1" has been focused upon, but a Tanner graph can be drawn in a similar way for "check equation #2" to "check equation #6," and belief is propagated to each node in a Tanner graph of "check equation #K" from coefficient nodes of other than "check equation #K." Therefore, beliefs with low correlation are all propagated to "check equation #K" (where K=2, 3, 4, 5, 6), enabling an improvement in error correction capability to be expected.

By providing for the orders of parity check polynomials of equations 5-1 to 5-6 to satisfy the above condition about "remainder" in this way, belief can be propagated efficiently in all check equations, and the possibility of being able to further improve error correction capability is increased.

A case in which the coding rate is 1/2 has been described above for an LDPC-CC of a time varying period of 6, but the coding rate is not limited to 1/2. The possibility of obtaining good received quality can be increased when the coding rate is (n−1)/n (where n is an integer equal to or greater than 2) if the above condition about "remainder" holds true for three-coefficient sets in information X1(D), X2(D), . . . , Xn−1(D).

A case in which the coding rate is (n−1)/n (where n is an integer equal to or greater than 2) is described below.

Consider equations 7-1 to 7-6 as parity check polynomials of an LDPC-CC for which the time varying period is 6.

[7]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+ \ldots +(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 7-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+ \ldots +(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 7-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+ \ldots +(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 7-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+ \ldots +(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 7-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+ \ldots +(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 7-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+ \ldots +(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 7-6)}$$

At this time, X1(D), X2(D), . . . , Xn−1(D) are polynomial representations of data (information) X1, X2, . . . , Xn−1, and P(D) is a polynomial representation of parity. Here, in equations 7-1 to 7-6, parity check polynomials are assumed such that there are three terms in X1(D), X2(D), . . . , Xn−1(D), and P(D) respectively. As in the case of the above coding rate of 1/2, and in the case of a time varying period of 3, the possibility of being able to obtain higher error correction capability is increased if the condition below (<Condition #1>) is satisfied in an LDPC-CC of a time varying period of 6 and a coding rate of (n−1)/n (where n is an integer equal to or greater than 2) represented by parity check polynomials of equations 7-1 to 7-6.

In an LDPC-CC of a time varying period of 6 and a coding rate of (n−1)/n (where n is an integer equal to or greater than 2), parity and information at time i are represented by Pi and $X_{i,1}, X_{i,2}, \ldots, X_{i,n-1}$ respectively. If i %6=k (where k=0, 1, 2, 3, 4, 5) is assumed at this time, a parity check polynomial of equation 7-(k+1) holds true. For example, if i=8, i %6=2 (k=2), and therefore equation 8 holds true.

[8]

$$(D^{a\#3,1,1}+D^{a\#3,1,2}+D^{a\#3,1,3})X_{8,1}(D)+(D^{a\#3,2,1}+D^{a\#3,2,2}+D^{a\#3,2,3})X_{8,2}(D)+\ldots+(D^{a\#3,n-1,1}+D^{a\#3,n-1,2}+D^{a\#3,n-1,3})X_{8,n-1}(D)+(D^{b\#3,1}+D^{b\#3,2}+D^{b\#3,3})P_8=0 \quad \text{(Equation 8)}$$

<Condition #1>

In equations 7-1 to 7-6, combinations of orders of X1(D), X2(D), . . . , Xn−1(D), and P(D) satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,k,1}\%3, a_{\#1,k,2}\%3, a_{\#1,k,3}\%3), \ldots, (a_{\#1,n-1,1}\%3, a_{\#1,n-1,2}\%3, a_{\#1,n-1,3}\%3)$ and $(b_{\#1,1}\%3, b_{\#1,2}\%3, b_{\#1,3}\%3)$ are any of (0,1,2),(0,2,1),(1,0,2),(1,2,0),(2,0,1), or (2,1,0) (where $k=1,2,3,\ldots,n-1$);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#2,k,1}\%3, a_{\#2,k,2}\%3, a_{\#2,k,3}\%3), \ldots, (a_{\#2,n-1,1}\%3, a_{\#2,n-1,2}\%3, a_{\#2,n-1,3}\%3)$ and $(b_{\#2,1}\%3, b_{\#2,2}\%3, b_{\#2,3}\%3)$ are any of (0,1,2),(0,2,1),(1,0,2),(1,2,0),(2,0,1), or (2,1,0) (where $k=1,2,3,\ldots,n-1$);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3), \ldots, (a_{\#3,k,1}\%3, a_{\#3,k,2}\%3, a_{\#3,k,3}\%3), \ldots, (a_{\#3,n-1,1}\%3, a_{\#3,n-1,2}\%3, a_{\#3,n-1,3}\%3)$ and $(b_{\#3,1}\%3, b_{\#3,2}\%3, b_{\#3,3}\%3)$ are any of (0,1,2),(0,2,1),(1,0,2),(1,2,0),(2,0,1), or (2,1,0) (where $k=1,2,3,\ldots,n-1$);

$(a_{\#4,1,1}\%3, a_{\#4,1,2}\%3, a_{\#4,1,3}\%3), (a_{\#4,2,1}\%3, a_{\#4,2,2}\%3, a_{\#4,2,3}\%3), \ldots, (a_{\#4,k,1}\%3, a_{\#4,k,2}\%3, a_{\#4,k,3}\%3), \ldots, (a_{\#4,n-1,1}\%3, a_{\#4,n-1,2}\%3, a_{\#4,n-1,3}\%3)$ and $(b_{\#4,1}\%3, b_{\#4,2}\%3, b_{\#4,3}\%3)$ are any of (0,1,2),(0,2,1),(1,0,2),(1,2,0),(2,0,1), or (2,1,0) (where $k=1,2,3,\ldots,n-1$);

$(a_{\#5,1,1}\%3, a_{\#5,1,2}\%3, a_{\#5,1,3}\%3), (a_{\#5,2,1}\%3, a_{\#5,2,2}\%3, a_{\#5,2,3}\%3), \ldots, (a_{\#5,k,1}\%3, a_{\#5,k,2}\%3, a_{\#5,k,3}\%3), \ldots, (a_{\#5,n-1,1}\%3, a_{\#5,n-1,2}\%3, a_{\#5,n-1,3}\%3)$ and $(b_{\#5,1}\%3, b_{\#5,2}\%3, b_{\#5,3}\%3)$ are any of (0,1,2),(0,2,1),(1,0,2),(1,2,0),(2,0,1), or (2,1,0) (where $k=1,2,3,\ldots,n-1$); and $(a_{\#6,1,1}\%3, a_{\#6,1,2}\%3, a_{\#6,1,3}\%3), (a_{\#6,2,1}\%3, a_{\#6,2,2}\%3, a_{\#6,2,3}\%3), \ldots, (a_{\#6,k,1}\%3, a_{\#6,k,2}\%3, a_{\#6,k,3}\%3), \ldots, (a_{\#6,n-1,1}\%3, a_{\#6,n-1,2}\%3, a_{\#6,n-1,3}\%3)$ and $(b_{\#6,1}\%3, b_{\#6,2}\%3, b_{\#6,3}\%3)$ are any of (0,1,2),(0,2,1),(1,0,2),(1,2,0),(2,0,1), or (2,1,0) (where $k=1,2,3,\ldots,n-1$).

In the above description, a code having high error correction capability has been described for an LDPC-CC of a time varying period of 6, but a code having high error correction capability can also be generated when an LDPC-CC of a time varying period of 3g (where g=1, 2, 3, 4, . . . ) (that is, an LDPC-CC for which the time varying period is a multiple of 3) is created in the same way as with the design method for an LDPC-CC of a time varying period of 3 or 6. A configuration method for this code is described in detail below.

Consider equations 9-1 to 9-3g as parity check polynomials of an LDPC-CC for which the time varying period is 3g (where g=1, 2, 3, 4, . . . ) and the coding rate is (n−1)/n (where n is an integer equal to or greater than 2).

[9]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 9-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 9-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 9-3)}$$

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\ldots+(D^{a\#k,n-1,1}+D^{a\#k,n-1,2}+D^{a\#k,n-1,3})X_{n-1}(D)+(D^{b\#k,1}+D^{b\#k,2}+D^{b\#k,3})P(D)=0 \quad \text{(Equation 9-k)}$$

$$(D^{a\#3g-2,1,1}+D^{a\#3g-2,1,2}+D^{a\#3g-2,1,3})X_1(D)+(D^{a\#3g-2,2,1}+D^{a\#3g-2,2,2}+D^{a\#3g-2,2,3})X_2(D)+\ldots+(D^{a\#3g-2,n-1,1}+D^{a\#3g-2,n-1,2}+D^{a\#3g-2,n-1,3})X_{n-1}(D)+(D^{b\#3g-2,1}+D^{b\#3g-2,2}+D^{b\#3g-2,3})P(D)=0 \quad \text{(Equation 9-(3g-2))}$$

$$(D^{a\#3g-1,1,1}+D^{a\#3g-1,1,2}+D^{a\#3g-1,1,3})X_1(D)+(D^{a\#3g-1,2,1}+D^{a\#3g-1,2,2}+D^{a\#3g-1,2,3})X_2(D)+\ldots+(D^{a\#3g-1,n-1,1}+D^{a\#3g-1,n-1,2}+D^{a\#3g-1,n-1,3})X_{n-1}(D)+(D^{b\#3g-1,1}+D^{b\#3g-1,2}+D^{b\#3g-1,3})P(D)=0 \quad \text{(Equation 9-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\ldots+(D^{a\#3g,n-1,1}+D^{a\#3g,n-1,2}+D^{a\#3g,n-1,3})X_{n-1}(D)+(D^{b\#3g,1}+D^{b\#3g,2}+D^{b\#3g,3})P(D)=0 \quad \text{(Equation 9-3g)}$$

At this time, X1(D), X2(D), . . . , Xn−1(D) are polynomial representations of data (information) X1, X2, . . . , Xn−1, and P(D) is a polynomial representation of parity. Here, in equations 9-1 to 9-3g, parity check polynomials are assumed such that there are three terms in X1(D), X2(D), . . . , Xn−1(D), and P(D) respectively.

As in the case of an LDPC-CC of a time varying period of 3 and an LDPC-CC of a time varying period of 6, the possibility of being able to obtain higher error correction capability is increased if the condition below (<Condition #2>) is satisfied in an LDPC-CC of a time varying period of 3g and a coding rate of (n−1)/n (where n is an integer equal to or greater than 2) represented by parity check polynomials of equations 9-1 to 9-3g.

In an LDPC-CC of a time varying period of 3g and a coding rate of (n−1)/n (where n is an integer equal to or greater than 2), parity and information at time i are represented by $P_i$ and $X_{i,1}$, $X_{i,2}$, . . . , $X_{i,n-1}$ respectively. If i %3g=k (where k=0, 1, 2, . . . , 3g−1) is assumed at this time, a parity check polynomial of equation 9-(k+1) holds true. For example, if i=2, i %3g=2 (k=2), and therefore equation 10 holds true.

[10]

$$(D^{a\#3,1,1}+D^{a\#3,1,2}+D^{a\#3,1,3})X_{2,1}(D)+(D^{a\#3,2,1}+D^{a\#3,2,2}+D^{a\#3,2,3})X_{2,2}(D)+\ldots+(D^{a\#3,n-1,1}+D^{a\#3,n-1,2}+D^{a\#3,n-1,3})X_{2,n-1}(D)+(D^{b\#3,1}+D^{b\#3,2}+D^{b\#3,3})P_2=0 \quad \text{(Equation 10)}$$

In equations 9-1 to 9-3g, it is assumed that $a_{\#k,p,1}$, $a_{\#k,p,2}$ and $a_{\#k,p,3}$ are integers (where $a_{\#k,p,1} \neq a_{\#k,p,2} \neq a_{\#k,p,3}$) (where k=1, 2, 3, . . . , 3g, and p=1, 2, 3, . . . , n−1). Also, it is assumed that $b_{\#k,1}$, $b_{\#k,2}$ and $b_{\#k,3}$ are integers (where $b_{\#k,1} \neq b_{\#k,2} \neq b_{\#k,3}$). A parity check polynomial of equation 9-k (where k=1, 2, 3, . . . , 3g) is called "check equation #k," and a sub-matrix based on the parity check polynomial of equation 9-k is designated k-th sub-matrix $H_k$. Next, an LDPC-CC of a time varying period of 3g is considered that is generated from first sub-matrix $H_1$, second sub-matrix $H_2$, third sub-matrix $H_3$, . . . , and 3g-th sub-matrix $H_{3g}$.

<Condition #2>

In equations 9-1 to 9-3g, combinations of orders of X1(D), X2(D), Xn−1(D), and P(D) satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,p,1}\%3, a_{\#1,p,2}\%3, a_{\#1,p,3}\%3), \ldots, (a_{\#1,n-1,1}\%3, a_{\#1,n-1,2}\%3, a_{\#1,n-1,3}\%3)$ and $(b_{\#1,1}\%3, b_{\#1,2}\%3, b_{\#1,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#2,p,1}\%3, a_{\#2,p,2}\%3, a_{\#2,p,3}\%3), \ldots, (a_{\#2,n-1,1}\%3, a_{\#2,n-1,2}\%3, a_{\#2,n-1,3}\%3)$ and $(b_{\#2,1}\%3, b_{\#2,2}\%3, b_{\#2,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3), \ldots, (a_{\#3,p,1}\%3, a_{\#3,p,2}\%3, a_{\#3,p,3}\%3), (a_{\#3,n-1,1}\%3, a_{\#3,n-1,2}\%3, a_{\#3,n-1,3}\%3)$ and $(b_{\#3,1}\%3, b_{\#3,2}\%3, b_{\#3,3}\%3)$ are any of $(0,1,2), (0,2,1), (1,0,2), (1,2,0), (2,0,1),$ or $(2,1,0)$ (where $p=1,2,3,\ldots,n-1$);

⋮

$(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3), \ldots, (a_{\#k,p,1}\%3, a_{\#k,p,2}\%3, a_{\#k,p,3}\%3), \ldots, (a_{\#k,n-1,1}\%3, a_{\#k,n-1,2}\%3, a_{\#k,n-1,3}\%3)$ and $(b_{\#k,1}\%3, b_{\#k,2}\%3, b_{\#k,3}\%3)$ are any of $(0,1,2), (0,2,1), (1,0,2), (1,2,0), (2,0,1),$ or $(2,1,0)$ (where $p=1,2,3,\ldots,n-1$) (where $k=1,2,3,\ldots,3g$);

⋮

$(a_{\#3g-2,1,1}\%3, a_{\#3g-2,1,2}\%3, a_{\#3g-2,1,3}\%3), (a_{\#3g-2,2,1}\%3, a_{\#3g-2,2,2}\%3, a_{\#3g-2,2,3}\%3), \ldots, (a_{\#3g-2,p,1}\%3, a_{\#3g-2,p,2}\%3, a_{\#3g-2,p,3}\%3), \ldots, (a_{\#3g-2,n-1,1}\%3, a_{\#3g-2,n-1,2}\%3, a_{\#3g-2,n-1,3}\%3)$, and $(b_{\#3g-2,1}\%3, b_{\#3g-2,2}\%3, b_{\#3g-2,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#3g-1,1,1}\%3, a_{\#3g-1,1,2}\%3, a_{\#3g-1,1,3}\%3), (a_{\#3g-1,2,1}\%3, a_{\#3g-1,2,2}\%3, a_{\#3g-1,2,3}\%3), \ldots, (a_{\#3g-1,p,1}\%3, a_{\#3g-1,p,2}\%3, a_{\#3g-1,p,3}\%3), \ldots, (a_{\#3g-1,n-1,1}\%3, a_{\#3g-1,n-1,2}\%3, a_{\#3g-1,n-1,3}\%3)$ and $(b_{\#3g-1,1}\%3, b_{\#3g-1,2}\%3, b_{\#3g-1,3}\%3)$ are any of $(0,1,2), (0,2,1), (1,0,2), (1,2,0), (2,0,1),$ or $(2,1,0)$ (where $p=1,2,3,\ldots,n-1$); and $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots, (a_{\#3g,p,1}\%3, a_{\#3g,p,2}\%3, a_{\#3g,p,3}\%3), \ldots, (a_{\#3g,n-1,1}\%3, a_{\#3g,n-1,2}\%3, a_{\#3g,n-1,3}\%3)$ and $(b_{\#3g,1}\%3, b_{\#3g,2}\%3, b_{\#3g,3}\%3)$ are any of $(0,1,2), (0,2,1), (1,0,2), (1,2,0), (2,0,1),$ or $(2,1,0)$ (where $p=1,2,3,\ldots,n-1$).

Taking ease of performing encoding into consideration, it is desirable for one "0" to be present among the three items $(b_{\#k,1}\%3, b_{\#k,2}\%3, b_{\#k,3}\%3)$ (where $k=1, 2, \ldots, 3g$) in equations 9-1 to 9-3g. This is because of a feature that, if $D^0=1$ holds true and $b_{\#k,1}, b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for:

one "0" to be present among the three items $(a_{\#k,1,1}\%3, a_{\#k,1,2}\%3, a_{\#k,1,3}\%3)$;

one "0" to be present among the three items $(a_{\#k,2,1}\%3, a_{\#k,2,2}\%3, a_{\#k,2,3}\%3)$;

⋮ one "0" to be present among the three items $(a_{\#k,p,1}\%3, a_{\#k,p,2}\%3, a_{\#k,p,3}\%3)$;

⋮ one "0" to be present among the three items $(a_{\#k,n-1,1}\%3, a_{\#k,n-1,2}\%3, a_{\#k,n-1,3}\%3)$, (where $k=1, 2, \ldots, 3g$).

Next, an LDPC-CC of a time varying period of 3g (where $g=2, 3, 4, 5, \ldots$) that takes ease of encoding into account is considered. At this time, if the coding rate is $(n-1)/n$ (where n is an integer equal to or greater than 2), LDPC-CC parity check polynomials can be represented as shown below.

[11]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 11-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 11-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 11-3)}$$

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\ldots+(D^{a\#k,n-1,1}+D^{a\#k,n-1,2}+D^{a\#k,n-1,3})X_{n-1}(D)+(D^{b\#k,1}+D^{b\#k,2}+D^{b\#k,3})P(D)=0 \quad \text{(Equation 11-k)}$$

$$(D^{a\#3g-2,1,1}+D^{a\#3g-2,1,2}+D^{a\#3g-2,1,3})X_1(D)+(D^{a\#3g-2,2,1}+D^{a\#3g-2,2,2}+D^{a\#3g-2,2,3})X_2(D)+\ldots+(D^{a\#3g-2,n-1,1}+D^{a\#3g-2,n-1,2}+D^{a\#3g-2,n-1,3})X_{n-1}(D)+(D^{b\#3g-2,1}+D^{b\#3g-2,2}+D^{b\#3g-2,3})P(D)=0 \quad \text{(Equation 11-(3g-2))}$$

$$(D^{a\#3g-1,1,1}+D^{a\#3g-1,1,2}+D^{a\#3g-1,1,3})X_1(D)+(D^{a\#3g-1,2,1}+D^{a\#3g-1,2,2}+D^{a\#3g-1,2,3})X_2(D)+\ldots+(D^{a\#3g-1,n-1,1}+D^{a\#3g-1,n-1,2}+D^{a\#3g-1,n-1,3})X_{n-1}(D)+(D^{b\#3g-1,1}+D^{b\#3g-1,2}+D^{b\#3g-1,3})P(D)=0 \quad \text{(Equation 11-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\ldots+(D^{a\#3g,n-1,1}+D^{a\#3g,n-1,2}+D^{a\#3g,n-1,3})X_{n-1}(D)+(D^{b\#3g,1}+D^{b\#3g,2}+D^{b\#3g,3})P(D)=0 \quad \text{(Equation 11-3g)}$$

At this time, $X1(D), X2(D), \ldots, Xn-1(D)$ are polynomial representations of data (information) $X1, X2, \ldots, Xn-1$, and $P(D)$ is a polynomial representation of parity. Here, in equations 11-1 to 11-3g, parity check polynomials are assumed such that there are three terms in $X1(D), X2(D), \ldots, Xn-1(D)$, and $P(D)$ respectively. In an LDPC-CC of a time varying period of 3g and a coding rate of $(n-1)/n$ (where n is an integer equal to or greater than 2), parity and information at time i are represented by $P_i$ and $X_{i,1}, X_{i,2}, \ldots, X_{i,n-1}$ respectively. If $i \%3g=k$ (where $k=0, 1, 2, \ldots, 3g-1$) is assumed at this time, a parity check polynomial of equation 11-(k+1) holds true. For example, if $i=2$, $i \%3=2$ ($k=2$), and therefore equation 12 holds true.

[12]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+\ldots+(D^{a\#3,n-1,1}+D^{a\#3,n-1,2}+D^{a\#3,n-1,3})X_{2,n-1}+(D^{b\#3,1}+D^{b\#3,2}+1)P(D)=0 \quad \text{(Equation 12)}$$

If <Condition #3> and <Condition #4> are satisfied at this time, the possibility of being able to create a code having higher error correction capability is increased.

<Condition #3>

In equations 11-1 to 11-3g, combinations of orders of X1(D), X2(D), . . . , Xn−1(D), and P(D) satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,p,1}\%3, a_{\#1,p,2}\%3, a_{\#1,p,3}\%3), \ldots,$ and $(a_{\#1,n-1,1}\%3, a_{\#1,n-1,2}\%3, a_{\#1,n-1,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#4,1}\%3, a_{\#2,p,2}\%3, a_{\#2,p,3}\%3), \ldots,$ and $(a_{\#2,n-1,1}\%3, a_{\#2,n-1,2}\%3, a_{\#2,n-1,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#3,1,1}\%3, a_{\#312}\%3, a_{\#313}\%3), (a_{\#3,2,1}\%3, a_{\#3,2,2}\%3, a_{\#3,2,3}\%3), \ldots, (a_{\#3,p,1}\%3, a_{\#3,p,2}\%3, a_{\#3,p,3}\%3), \ldots,$ and $(a_{\#3,n-1,1}\%3, a_{\#3,n-1,2}\%3, a_{\#3,n-1,3}\%3)$ are any of $(0,1,2), (0,2,1), (1,0,2), (1,2,0), (2,0,1),$ or $(2,1,0)$ (where $p=1,2,3,\ldots,n-1$);

⋮

$(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3), \ldots, (a_{\#k,p,1}\%3, a_{\#k,p,2}\%3, a_{\#k,p,3}\%3), \ldots,$ and $(a_{\#k,n-1,1}\%3, a_{\#k,n-1,2}\%3, a_{\#k,n-1,3}\%3)$ are any of $(0,1,2), (0,2,1), (1,0,2), (1,2,0), (2,0,1),$ or $(2,1,0)$ (where $p=1,2,3,\ldots,n-1$, and $k=1,2,3,\ldots,3g$);

⋮

●

$(a_{\#3g-2,1,1}\%3, a_{\#3g-2,1,2}\%3, a_{\#3g-2,1,3}\%3), (a_{\#3g-2,2,1}\%3, a_{\#3g-2,2,2}\%3, a_{\#3g-2,2,3}\%3), \ldots, (a_{\#3g-2,p,1}\%3, a_{\#3g-2,p,2}\%3, a_{\#3g-2,p,3}\%3), \ldots,$ and $(a_{\#3g-2,n-1,1}\%3, a_{\#3g-2,n-1,2}\%3, a_{\#3g-2,n-1,3}\%3)$ are any of $(0,1,2), (0,2,1), (1,0,2), (1,2,0), (2,0,1),$ or $(2,1,0)$ (where $p=1,2,3,\ldots,n-1$);

$(a_{\#3g-1,1,1}\%3, a_{\#3g-1,1,2}\%3, a_{\#3g,1,3}\%3), (a_{\#3g-1,2,1}\%3, a_{\#3g-1,2,2}\%3, a_{\#3g-1,2,3}\%3), \ldots, (a_{\#3g-1,p,1}\%3, a_{\#3g-1,p,2}\%3, a_{\#3g-1,p,3}\%3), \ldots,$ and $(a_{\#3g-1,n-1,1}\%3, a_{\#3g-1,n-1,2}\%3, a_{\#3g-1,n-1,3}\%3)$ are any of $(0,1,2), (0,2,1), (1,0,2), (1,2,0), (2,0,1),$ or $(2,1,0)$ (where $p=1,2,3,\ldots,n-1$); and $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots, (a_{\#3g,p,1}\%3, a_{\#3g,p,2}\%3, a_{\#3g,p,3}\%3), \ldots,$ and $(a_{\#3g,n-1,1}\%3, a_{\#3g,n-1,2}\%3, a_{\#3g,n-1,3}\%3)$ are any of $(0,1,2), (0,2,1), (1,0,2), (1,2,0), (2,0,1),$ or $(2,1,0)$ (where $p=1,2,3,\ldots,n-1$).

In addition, in equations 11-1 to 11-3g, combinations of orders of P(D) satisfy the following condition:

$(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots, (b_{\#3g-2,1}\%3, b_{\#3g-2,2}\%3), (b_{\#3g-1,1}\%3, b_{\#3g-1,2}\%3),$ and $(b_{\#3g,1}\%3, b_{\#3g,2}\%3)$ are any of $(1,2),$ or $(2,1)$ (where $k=1,2,3,\ldots,3g$).

<Condition #3> has a similar relationship with respect to equations 11-1 to 11-3g as <Condition #2> has with respect to equations 9-1 to 9-3g. If the condition below (<Condition #4>) is added for equations 11-1 to 11-3g in addition to <Condition #3>, the possibility of being able to create an LDPC-CC having higher error correction capability is increased.

<Condition #4>

Orders of P(D) of equations 11-1 to 11-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the values of 6g orders of $(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots, (b_{\#3g-2,1}\%3, b_{\#3g-2,2}\%3), (b_{\#3g-1,1}\%3, b_{\#3g-1,2}\%3), (b_{\#3g,1}\%3, b_{\#3g,2}\%3)$ (in this case, two orders form a pair, and therefore the number of orders forming 3g pairs is 6g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is (n−1)/n (where n is an integer equal to or greater than 2) that has parity check polynomials of equations 11-1 to 11-3g, if a code is created in which <Condition #4> is applied in addition to <Condition #3>, it is possible to provide randomness while maintaining regularity for positions at which "1"s are present in a parity check matrix, and therefore the possibility of obtaining good error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is (n−1)/n (where n is an integer equal to or greater than 2), LDPC-CC parity check polynomials can be represented as shown below.

[13]

$(D^{a\#1,1,1}+D^{a\#1,1,2}+1)X_1(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0$ (Equation 13-1)

$(D^{a\#2,1,1}+D^{a\#2,1,2}+1)X_1(D)+(D^{a\#2,2,1}+D^{a\#2,2,2}1)X_2(D)+\ldots+(D^{a\#2,n-1,1}+D^{a\#2,n-1,2}+1)X_{n-1}(D)+(D^{b\#2,1}+D^{b\#2,2}+1)P(D)=0$ (Equation 13-2)

$(D^{a\#3,1,1}+D^{a\#3,1,2}+1)X_1(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0$ (Equation 13-3)

$(D^{a\#k,1,1}+D^{a\#k,1,2}+1)X_1(D)+(D^{a\#k,2,1}+D^{a\#k,2,2}+1)X_2(D)+\ldots+(D^{a\#k,n-1,1}+D^{a\#k,n-1,2}+1)X_{n-1}(D)+(D^{b\#k,1}+D^{b\#k,2}+1)P(D)=0$ (Equation 13-k)

$(D^{a\#3g-2,1,1}+D^{a\#3g-2,1,2}+1)X_1(D)+(D^{a\#3g-2,2,1}+D^{a\#3g-2,2,2}+1)X_2(D)+\ldots+(D^{a\#3g-2,n-1,1}+D^{a\#3g-2,n-1,2}+1)X_{n-1}(D)+(D^{b\#3g-2,1}+D^{b\#3g-2,2}+1)P(D)=0$ (Equation 13-(3g−2))

$(D^{a\#3g-1,1,1}+D^{a\#3g-1,1,2}+1)X_1(D)+(D^{a\#3g-1,2,1}+D^{a\#3g-1,2,2}+1)X_2(D)+\ldots+(D^{a\#3g-1,n-1,1}+D^{a\#3g-1,n-1,2}+1)X_{n-1}(D)+(D^{b\#3g-1,1}+D^{b\#3g-1,2}+1)P(D)=0$ (Equation 13-(3g−1))

$(D^{a\#3g,1,1}+D^{a\#3g,1,2}+1)X_1(D)+(D^{a\#3g,2,1}+D^{a\#3g,2,2}+1)X_2(D)+\ldots+(D^{a\#3g,n-1,1}+D^{a\#3g,n-1,2}+1)X_{n-1}(D)+(D^{b\#3g,1}+D^{b\#3g,2}+1)P(D)=0$ (Equation 13-3g)

At this time, X1(D), X2(D), . . . , Xn−1(D) are polynomial representations of data (information) X1, X2, . . . , Xn−1, and P(D) is a polynomial representation of parity. In equations 13-1 to 13-3g, parity check polynomials are assumed such that there are three terms in X1(D), X2(D), . . . , Xn−1(D), and P(D) respectively, and term $D^0$ is present in X1(D), X2(D), . . . , Xn−1(D), and P(D) (where k=1, 2, 3, . . . , 3g).

In an LDPC-CC of a time varying period of 3g and a coding rate of (n−1)/n (where n is an integer equal to or greater than 2), parity and information at time i are represented by Pi and $X_{i,1}, X_{i,2}, \ldots, X_{i,n-1}$ respectively. If i %3g=k (where k=0, 1, 2, . . . 3g−1) is assumed at this time, a parity check polynomial of equation 13-(k+1) holds true. For example, if i=2, i %3g=2 (k=2), and therefore equation 14 holds true.

[14]

$$(D^{a\#3,1,1}+D^{a\#3,1,2}+1)X_{2,1}(D)+(D^{a\#3,2,1}+D^{a\#3,2,2}+1)X_{2,2}(D)+\ldots+(D^{a\#3,n-1,1}+D^{a\#3,n-1,2}+1)X_{2,n-1}+(D^{b\#3,1}+D^{b\#3,2}+1)P_2=0 \quad \text{(Equation 13-3)}$$

If following <Condition #5> and <Condition #6> are satisfied at this time, the possibility of being able to create a code having higher error correction capability is increased.

<Condition #5>

In equations 13-1 to 13-3g, combinations of orders of X1(D), X2(D), ..., Xn−1(D), and P(D) satisfy the following condition:

$(a_{\#1,1,1}\%3, a_{\#1,1,2}\%3), (a_{\#1,2,1}\%3, a_{\#1,2,2}\%3), \ldots,$
$(a_{\#1,p,1}\%3, a_{\#1,p,2}\%3), \ldots,$ and $(a_{\#1,n-1,1}\%3, a_{\#1,n-1,2}\%3)$ are any of $(1,2),(2,1)$ $(p=1,2, 3, \ldots, n-1)$;

$(a_{\#2,1,1}\%3, a_{\#2,1,2}\%3), (a_{\#2,2,1}\%3, a_{\#2,2,2}\%3), \ldots,$
$(a_{\#2,p,1}\%3, a_{\#2,p,2}\%3), \ldots,$ and $(a_{\#2,n-1,1}\%3, a_{\#2,n-1,2}\%3)$ are any of $(1,2)$, or $(2,1)$ (where $p=1,2,3, \ldots, n-1$);

$(a_{\#3,1,1}\%3, a_{\#3,1,2}\%3), (a_{\#3,2,1}\%3, a_{\#3,2,2}\%3), \ldots,$
$(a_{\#3,p,1}\%3, a_{\#3,p,2}\%3), \ldots,$ and $(a_{\#3n-1,1}\%3, a_{\#3,n-1,2}\%3)$ are any of $(1,2)$, or $(2,1)$ (where $p=1,2,3, \ldots, n-1$);

$\vdots$ $(a_{\#k,1,1}\%3, a_{\#k,1,2}\%3), (a_{\#k,2,1}\%3, a_{\#k,2,2}\%3), \ldots,$
$(a_{\#k,p,1}\%3, a_{\#k,p,2}\%3), \ldots,$ and $(a_{\#k,n-1,1}\%3, a_{\#k,n-1,2}\%3)$ are any of $(1,2)$, or $(2,1)$ (where $p=1,2,3, \ldots, n-1$) (where, $k=1,2,3, \ldots, 3g$)

$\vdots$ $(a_{\#3g-2,1,1}\%3, a_{\#3g-2,1,2}\%3), (a_{\#3g-2,2,1}\%3, a_{\#3g-2,2,2}\%3), \ldots, (a_{\#3g-2,p,1}\%3, a_{\#3g-2,p,2}\%3), \ldots,$ and $(a_{\#3g-2,n-1,1}\%3, a_{\#3g-2,n-1,2}\%3)$ are any of $(1,2)$, or $(2,1)$ (where $p=1,2,3, \ldots, n-1$);

$(a_{\#3g-1,1,1}\%3, a_{\#3g-1,1,2}\%3), (a_{\#3g-1,2,1}\%3, a_{\#3g-1,2,2}\%3), \ldots, (a_{\#3g-1,p,1}\%3, a_{\#3g-1,p,2}\%3), \ldots,$ and $(a_{\#3g-1,n-1,1}\%3, a_{\#3g-1,n-1,2}\%3)$ are any of $(1,2)$, or $(2,1)$ (where $p=1,2,3, \ldots, n-1$); and $(a_{\#3g,1,1}\%3, a_{\#3g,1,2}\%3), (a_{\#3g,2,1}\%3, a_{\#3g,2,2}\%3), \ldots, (a_{\#3g,p,1}\%3, a_{\#3g,p,2}\%3), \ldots,$ and $(a_{\#3g,n-1,1}\%3, a_{\#3g,n-1,2}\%3)$ are any of $(1,2)$, or $(2,1)$ (where $p=1,2,3, \ldots, n-1$).

In addition, in equations 13-1 to 13-3g, combinations of orders of P(D) satisfy the following condition:

$(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots,$
$(b_{\#3g-2,1}\%3, b_{\#3g-2,2}\%3), (b_{\#3g-1,1}\%3, b_{\#3g-1,2}\%3),$ and $(b_{\#3g,1}\%3, b_{\#3g,2}\%3)$ are any of $(1,2)$, or $(2,1)$ (where $k=1,2,3, \ldots, 3g$).

<Condition #5> has a similar relationship with respect to equations 13-1 to 13-3g as <Condition #2> has with respect to equations 9-1 to 9-3g. If the condition below (<Condition #6>) is added for equations 13-1 to 13-3g in addition to <Condition #5>, the possibility of being able to create a code having high error correction capability is increased.

<Condition #6>

Orders of X1 (D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,1,1}\%3g, a_{\#1,1,2}\%3g), (a_{\#2,1,1}\%3g, a_{\#2,1,2}\%3g), \ldots, (a_{\#p,1,1}\%3g, a_{\#p,1,2}\%3g), \ldots,$ and $(a_{\#3g,1,1}\%3g, a_{\#3g,1,2}\%3g)$ (where p=1, 2, 3, ..., 3g);

Orders of X2(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,2,1}\%3g, a_{\#1,2,2}\%3g), (a_{\#2,2,1}\%3g, a_{\#2,2,2}\%3g), \ldots, (a_{\#p,2,1}\%3g, a_{\#p,2,2}\%3g), \ldots,$ and $(a_{\#3g,2,1}\%3g, a_{\#3g,2,2}\%3g)$ (where p=1, 2, 3, ..., 3g);

Orders of X3(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,3,1}\%3g, a_{\#1,3,2}\%3g), (a_{\#2,3,1}\%3g, a_{\#2,3,2}\%3g), \ldots, (a_{\#p,3,1}\%3g, a_{\#p,3,2}\%3g), \ldots,$ and $(a_{\#3g,3,1}\%3g, a_{\#3g,3,2}\%3g)$ (where p=1, 2, 3, ..., 3g);

$\vdots$

Orders of Xk(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,k,1}\%3g, a_{\#1,k,2}\%3g), (a_{\#2,k,1}\%3g, a_{\#2,k,2}\%3g), \ldots, (a_{\#p,k,1}\%3g, a_{\#p,k,2}\%3g), \ldots,$ and $(a_{\#3g,k,1}\%3g, a_{\#3g,k,2}\%3g)$ (where p=1, 2, 3, ..., 3g, and k=1, 2, 3, ..., n−1);

$\vdots$

Orders of Xn−1(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,n-1,1}\%3g, a_{\#1,n-1,2}\%3g), (a_{\#2,n-1,1}\%3g, a_{\#2,n-1,2}\%3g), (a_{\#p,n-1,1}\%3g, a_{\#p,n-1,2}\%3g), \ldots,$ and $(a_{\#3g,n-1,1}\%3g, a_{\#3g,n-1,2}\%3g)$ (where p=1, 2, 3, ..., 3g); and Orders of P(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(b_{\#1,1}\%3g, b_{\#1,2}\%3g), (b_{\#2,1}\%3g, b_{\#2,2}\%3g), (b_{\#3,1}\%3g, b_{\#3,2}\%3g), \ldots, (b_{\#k,1}\%3g, b_{\#k,2}\%3g), \ldots, (b_{\#3g-2,1}\%3g, b_{\#3g-2,2}\%3g), (b_{\#3g-1,1}\%3g, b_{\#3g-1,2}\%3g)$ and $(b_{\#3g,1}\%3g, b_{\#3g,2}\%3g)$ (where k=1, 2, 3, ..., n−1).

The possibility of obtaining good error correction capability is high if there is also randomness while regularity is maintained for positions at which "1"s are present in a parity check matrix. With an LDPC-CC for which the time varying period is 3g (where g=2, 3, 4, 5, ...) and the coding rate is (n−1)/n (where n is an integer equal to or greater than 2) that has parity check polynomials of equations 13-1 to 13-3g, if a code is created in which <Condition #6> is applied in addition to <Condition #5>, it is possible to provide randomness while maintaining regularity for positions at which "1"s are present in a parity check matrix, and therefore the possibility of obtaining good error correction capability is increased.

The possibility of being able to create an LDPC-CC having higher error correction capability is also increased if a code is created using <Condition #6'> instead of <Condition #6>, that is, using <Condition #6'> in addition to <Condition #5>.

<Condition #6'>

Orders of X1(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,1,1}\%3g, a_{\#1,1,2}\%3g), (a_{\#2,1,1}\%3g, a_{\#2,1,2}\%3g), \ldots, (a_{\#p,1,1}\%3g, a_{\#p,1,2}\%3g), \ldots,$ and $(a_{\#3g,1,1}\%3g, a_{\#3g,1,2}\%3g)$ (where p=1, 2, 3, ..., 3g);

Orders of X2(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,2,1}\%3g, a_{\#1,2,2}\%3g)$, $(a_{\#2,2,1}\%3g, a_{\#2,2,2}\%3g)$, . . . , $(a_{\#p,2,1}\%3g, a_{\#p,2,2}\%3g)$, . . . , and $(a_{\#3g,2,1}\%3g, a_{\#3g,2,2}\%3g)$ (where p=1, 2, 3, . . . , 3g);

Orders of X3(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,3,1}\%3g, a_{\#1,3,2}\%3g)$, $(a_{\#2,3,1}\%3g, a_{\#2,3,2}\%3g)$, . . . , $(a_{\#p,3,1}\%3g, a_{\#p,3,2}\%3g)$, . . . , and $(a_{\#3g,3,1}\%3g, a_{\#3g,3,2}\%3g)$ (where p=1, 2, 3, . . . , 3g);

⋮

Orders of Xk(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3g, a_{\#1,k,2}\%3g)$, $(a_{\#2,k,1}\%3g, a_{\#2,k,2}\%3g)$, . . . , $(a_{\#p,k,1}\%3g, a_{\#p,k,2}\%3g)$, . . . , $(a_{\#3g,k,1}\%3g, a_{\#3g,k,2}\%3g)$ (where p=1, 2, 3, . . . , 3g, and k=1, 2, 3, . . . , n−1);

⋮

Orders of Xn−1(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,n-1,1}\%3g, a_{\#1,n-1,2}\%3g)$, $(a_{\#2,n-1,1}\%3g, a_{\#2,n-1,2}\%3g)$, . . . , $(a_{\#p,n-1,1}\%3g, a_{\#p,n-1,2}\%3g)$, . . . , $(a_{\#3g,n-1,1}\%3g, a_{\#3g,n-1,2}\%3g)$ (where p=1, 2, 3, . . . , 3g); or Orders of P(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g)$, . . . , $(b_{\#k,1}\%3g, b_{\#k,2}\%3g)$, . . . , $(b_{\#3g-2,1}\%3g, b_{\#3g-2,2}\%3g)$, $(b_{\#3g-1,1}\%3g, b_{\#3g-1,2}\%3g)$, $(b_{\#3g,1}\%3g, b_{\#3g,2}\%3g)$ (where k=1, 2, 3, . . . , 3g).

The above description relates to an LDPC-CC of a time varying period of 3g and a coding rate of (n−1)/n (where n is an integer equal to or greater than 2). Below, conditions are described for orders of an LDPC-CC of a time varying period of 3g and a coding rate of 1/2 (n=2).

Consider equations 15-1 to 15-3g as parity check polynomials of an LDPC-CC for which the time varying period is 3g (where g=1, 2, 3, 4, . . . ) and the coding rate is 1/2 (n=2).

[15]

$$(D^{a\#1,1,1}+D^{a\#1,1,2}+D^{a\#1,1,3})X(D)+(D^{b\#1,1}+D^{b\#1,2}+D^{b\#1,3})P(D)$$ (Equation 15-1)

$$(D^{a\#2,1,1}+D^{a\#2,1,2}+D^{a\#2,1,3})X(D)+(D^{b\#2,1}+D^{b\#2,2}+D^{b\#2,3})P(D)=0$$ (Equation 15-2)

$$(D^{a\#3,1,1}+D^{a\#3,1,2}+D^{a\#3,1,3})X(D)+(D^{b\#3,1}+D^{b\#3,2}+D^{b\#3,3})P(D)=0$$ (Equation 15-3)

$$(D^{a\#k,1,1}+D^{a\#k,1,2}+D^{a\#k,1,3})X(D)+(D^{b\#k,1}+D^{b\#k,2}+D^{b\#k,3})P(D)=0$$ (Equation 15-k)

$$(D^{a\#3g-2,1,1}+D^{a\#3g-2,1,2}+D^{a\#3g-2,1,3})X(D)+(D^{b\#3g-2,1}+D^{b\#3g-2,2}+D^{b\#3g-2,3})P(D)=0$$ (Equation 15-(3g−2))

$$(D^{a\#3g-1,1,1}+D^{a\#3g-1,1,2}+D^{a\#3g-1,1,3})X(D)+(D^{b\#3g-1,1}+D^{b\#3g-1,2}+D^{b\#3g-1,3})P(D)=0$$ (Equation 15-(3g−1))

$$(D^{a\#3g,1,1}+D^{a\#3g,1,2}+D^{a\#3g,1,3})X(D)+(D^{b\#3g,1}+D^{b\#3g,2}+D^{b\#3g,3})P(D)=0$$ (Equation 15-3g)

At this time, X(D) is a polynomial representation of data (information) X and P(D) is a polynomial representation of parity. Here, in equations 15-1 to 15-3g, parity check polynomials are assumed such that there are three terms in X(D) and P(D) respectively.

Thinking in the same way as in the case of an LDPC-CC of a time varying period of 3 and an LDPC-CC of a time varying period of 6, the possibility of being able to obtain higher error correction capability is increased if the condition below (Condition #2-1>) is satisfied in an LDPC-CC of a time varying period of 3g and a coding rate of 1/2 (n=2) represented by parity check polynomials of equations 15-1 to 15-3g.

In an LDPC-CC of a time varying period of 3g and a coding rate of 1/2 (n=2), parity and information at time i are represented by Pi and $X_{i,1}$ respectively. If i %3g=k (where k=0, 1, 2, . . . , 3g−1) is assumed at this time, a parity check polynomial of equation 15-(k+1) holds true. For example, if i=2, i %3g=2 (k=2), and therefore equation 16 holds true.

[16]

$$(D^{a\#3,1,1}+D^{a\#3,1,2}+D^{a\#3,1,3})X_{2,1}+(D^{b\#3,1}+D^{b\#3,2}+D^{b\#3,3})P_2=0$$ (Equation 16)

In equations 15-1 to 15-3g, it is assumed that $a_{\#k,1,1}$, $a_{\#k,1,2}$, and $a_{\#k,1,3}$ are integers (where $a_{\#k,1,1} \neq a_{\#k,1,2} \neq a_{\#k,1,3}$) (where k=1, 2, 3, . . . , 3g). Also, it is assumed that $b_{\#k,1}$, $b_{\#k,2}$, and $b_{\#k,3}$ are integers (where $b_{\#k,1} \neq b_{\#k,2} \neq b_{\#k,3}$). A parity check polynomial of equation 15-k (k=1, 2, 3, . . . , 3g) is called "check equation #k," and a sub-matrix based on the parity check polynomial of equation 15-k is designated k-th sub-matrix $H_k$. Next, an LDPC-CC of a time varying period of 3g is considered that is generated from first sub-matrix $H_1$, second sub-matrix $H_2$, third sub-matrix $H_3$, . . . , and 3g-th sub-matrix $H_{3g}$.

<Condition #2-1>

In equations 15-1 to 15-3g, combinations of orders of X(D) and P(D) satisfy the following condition:

$(a_{\#1,1,1}\%3, a_{\#1,1,2}\%3, a_{\#1,1,3}\%3)$ and $(b_{\#1,1}\%3, b_{\#1,2}\%3, b_{\#1,3}\%3)$ are any of (0,1,2),(0,2,1), (1,0,2),(1,2,0),(2,0,1), or (2,1,0);

$(a_{\#2,1,1}\%3, a_{\#2,1,2}\%3, a_{\#2,1,3}\%3)$ and $(b_{\#2,1}\%3, b_{\#2,2}\%3, b_{\#2,3}\%3)$ are any of (0,1,2),(0,2,1), (1,0,2),(1,2,0),(2,0,1), or (2,1,0);

$(a_{\#3,1,1}\%3, a_{\#3,1,2}\%3, a_{\#3,1,3}\%3)$ and $(b_{\#3,1}\%3, b_{\#3,2}\%3, b_{\#3,3}\%3)$ are any of (0,1,2),(0,2,1), (1,0,2),(1,2,0),(2,0,1), or (2,1,0);

⋮

$(a_{\#k,1,1}\%3, a_{\#k,1,2}\%3, a_{\#k,1,3}\%3)$ and $(b_{\#k,1}\%3, b_{\#k,2}\%3, b_{\#k,3}\%3)$ are any of (0,1,2),(0,2,1),(1,0,2),(1,2,0),(2,0,1), or (2,1,0) (where k=1,2,3, . . . ,3g);

⋮

$(a_{\#3g-2,1,1}\%3, a_{\#3g-2,1,2}\%3, a_{\#3g-2,1,3}\%3)$ and $(b_{\#3g-2,1}\%3, b_{\#3g-2,2}\%3, b_{\#3g-2,3}\%3)$ are any of (0,1,2),(0,2,1),(1,0,2),(1,2,0),(2,0,1), or (2,1,0);

$(a_{\#3g-1,1,1}\%3, a_{\#3g-1,1,2}\%3, a_{\#3g-1,1,3}\%3)$ and $(b_{\#3g-1,1}\%3, b_{\#3g-1,2}\%3, b_{\#3g-1,3}\%3)$ are any of (0,1,2),(0,2,1),(1,0,2),(1,2,0),(2,0,1), or (2,1,0); and $(a_{\#3g,1,1}\%3, a_{\#3g,1,2}\%3, a_{\#3g,1,3}\%3)$ and $(b_{\#3g,1}\%3, b_{\#3g,2}\%3, b_{\#3g,3}\%3)$ are any of (0,1,2),(0,2,1), (1,0,2),(1,2,0),(2,0,1), or (2,1,0).

Taking ease of performing encoding into consideration, it is desirable for one "0" to be present among the three items ($b_{\#k,1}\%3$, $b_{\#k,2}\%3$, $b_{\#k,3}\%3$) (where k=1, 2, . . . , 3g) in equations 15-1 to 15-3g. This is because of a feature that, if $D^0=1$ holds true and $b_{\#k,1}$, $b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for one "0" to be present among the three items ($a_{\#k,1,1}\%3$, $a_{\#k,1,2}\%3$, $a_{\#k,1,3}\%3$) (where k=1, 2, . . . , 3g).

Next, an LDPC-CC of a time varying period of 3g (where g=2, 3, 4, 5, . . . ) that takes ease of encoding into account is considered. At this time, if the coding rate is 1/2 (n=2), LDPC-CC parity check polynomials can be represented as shown below.

[17]

$$(D^{a\#1,1,1}+D^{a\#1,1,2}+D^{a\#1,1,3})X(D)+(D^{b\#1,1}+D^{b\#1,2}+1)P(D) \quad \text{(Equation 17-1)}$$

$$(D^{a\#2,1,1}+D^{a\#2,1,2}+D^{a\#2,1,3})X(D)+(D^{b\#2,1}+D^{b\#2,2}+1)P(D)=0 \quad \text{(Equation 17-2)}$$

$$(D^{a\#3,1,1}+D^{a\#3,1,2}+D^{a\#3,1,3})X(D)+(D^{b\#3,1}+D^{b\#3,2}+1)P(D)=0 \quad \text{(Equation 17-3)}$$

$$(D^{a\#k,1,1}+D^{a\#k,1,2}+D^{a\#k,1,3})X(D)+(D^{b\#k,1}+D^{b\#k,2}+1)P(D)=0 \quad \text{(Equation 17-k)}$$

$$(D^{a\#3g-2,1,1}+D^{a\#3g-2,1,2}+D^{a\#3g-2,1,3})X(D)+(D^{b\#3g-2,1}+D^{b\#3g-2,2}+1)P(D)=0 \quad \text{(Equation 17-(3g-2))}$$

$$(D^{a\#3g-1,1,1}+D^{a\#3g-1,1,2}+D^{a\#3g-1,1,3})X(D)+(D^{b\#3g-1,1}+D^{b\#3g-1,2}+1)P(D)=0 \quad \text{(Equation 17-(3g-1))}$$

$$(D^{a\#3g,1,1}+D^{a\#3g,1,2}+D^{a\#3g,1,3})X(D)+(D^{b\#3g,1}+D^{b\#3g,2}+1)P(D)=0 \quad \text{(Equation 17-3g)}$$

At this time, X(D) is a polynomial representation of data (information) X and P(D) is a polynomial representation of parity. Here, in equations 17-1 to 17-3g, parity check polynomials are assumed such that there are three terms in X(D) and P(D) respectively. In an LDPC-CC of a time varying period of 3g and a coding rate of 1/2 (n=2), parity and information at time i are represented by Pi and $X_{i,1}$ respectively. If i %3g=k (where k=0, 1, 2, . . . , 3g-1) is assumed at this time, a parity check polynomial of equation 17-(k+1) holds true. For example, if i=2, i %3g=2 (k=2), and therefore equation 18 holds true.

[18]

$$(D^{a\#3,1,1}+D^{a\#3,1,2}+D^{a\#3,1,3})X_{2,1}+(D^{b\#3,1}+D^{b\#3,2}+1)P_2=0 \quad \text{(Equation 18)}$$

If <Condition #3-1> and <Condition #4-1> are satisfied at this time, the possibility of being able to create a code having higher error correction capability is increased.

<Condition #3-1>

In equations 17-1 to 17-3g, combinations of orders of X(D) satisfy the following condition:

($a_{\#1,1,1}\%3$, $a_{\#1,1,2}\%3$, $a_{\#1,1,3}\%3$) are any of (0,1,2), (0,2,1),(1,0,2),(1,2,0),(2,0,1), or (2,1,0);

($a_{\#2,1,1}\%3$, $a_{\#2,1,2}\%3$, $a_{\#2,1,3}\%3$) are any of (0,1,2), (0,2,1),(1,0,2),(1,2,0),(2,0,1), or (2,1,0);

($a_{\#3,1,1}\%3$, $a_{\#3,1,2}\%3$, $a_{\#3,1,3}\%3$) are any of (0,1,2), (0,2,1),(1,0,2),(1,2,0),(2,0,1), or (2,1,0);

⋮

($a_{\#k,1,1}\%3$, $a_{\#k,1,2}\%3$, $a_{\#k,1,3}\%3$) are any of (0,1,2),(0,2,1), (1,0,2),(1,2,0),(2,0,1), or (2,1,0) (where k=1,2, 3, . . . ,3g);

⋮

($a_{\#3g-2,1,1}\%3$, $a_{\#3g-2,1,2}\%3$, $a_{\#3g-2,1,3}\%3$) are any of (0,1,2),(0,2,1),(1,0,2),(1,2,0),(2,0,1), or (2,1,0);

($a_{\#3g-1,1,1}\%3$, $a_{\#3g-1,1,2}\%3$, $a_{\#3g-1,1,3}\%3$) are any of (0,1,2),(0,2,1),(1,0,2),(1,2,0),(2,0,1), or (2,1,0); and ($a_{\#3g,1,1}\%3$, $a_{\#3g,1,2}\%3$, $a_{\#3g,1,3}\%3$) are any of (0,1,2), (0,2,1),(1,0,2),(1,2,0),(2,0,1), or (2,1,0).

In addition, in equations 17-1 to 17-3g, combinations of orders of P(D) satisfy the following condition:

($b_{\#1,1}\%3$,$b_{\#1,2}\%3$),($b_{\#2,1}\%3$,$b_{\#2,2}\%3$),($b_{\#3,1}\%3$, $b_{\#3,2}\%3$), . . . ,($b_{\#k,1}\%3$,$b_{\#k,2}\%3$), . . . , ($b_{\#3g-2,1}\%3$,$b_{\#3g-2,2}\%3$),($b_{\#3g-1,1}\%3$, $b_{\#3g-1,2}\%3$), and ($b_{\#3g,1}\%3$,$b_{\#3g,2}\%3$) are any of (1,2), or (2,1) (k=1,2,3, . . . ,3g).

<Condition #3-1> has a similar relationship with respect to equations 17-1 to 17-3g as <Condition #2-1> has with respect to equations 15-1 to 15-3g. If the condition below (<Condition #4-1>) is added for equations 17-1 to 17-3g in addition to <Condition #3-1>, the possibility of being able to create an LDPC-CC having higher error correction capability is increased.

<Condition #4-1>

Orders of P(D) of equations 17-1 to 17-3g satisfy the following condition: all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of ($b_{\#1,1}\%3g$, $b_{\#1,2}\%3g$), ($b_{\#2,1}\%3g$, $b_{\#2,2}\%3g$), ($b_{\#3,1}\%3g$, $b_{\#3,2}\%3g$), . . . , ($b_{k,1}\%3g$, $b_{\#k,2}\%3g$), . . . , ($b_{\#3g-2,1}\%3g$, $b_{\#3g-2,2}\%3g$), ($b_{\#3g-1,1}\%3g$, $b_{\#3g-1,2}\%3g$), and ($b_{\#3g,1}\%3g$, $b_{\#3g,2}\%3g$).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is 1/2 (n=2) that has parity check polynomials of equations 17-1 to 17-3g, if a code is created in which <Condition #4-1> is applied in addition to <Condition #3-1>, it is possible to provide randomness while maintaining regularity for positions at which "1"s are present in a parity check matrix, and therefore the possibility of obtaining better error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is 1/2 (n=2), LDPC-CC parity check polynomials can be represented as shown below.

[19]

$$(D^{a\#1,1,1}+D^{a\#1,1,2}+1)X(D)+(D^{b\#1,1}+D^{b\#1,2}+1)P(D)=0 \quad \text{(Equation 19-1)}$$

$$(D^{a\#2,1,1}+D^{a\#2,1,2}+1)X(D)+(D^{b\#2,1}+D^{b\#2,2}+1)P(D)=0 \quad \text{(Equation 19-2)}$$

$(D^{a\#3,1,1}+D^{a\#3,1,2}+1)X(D)+(D^{b\#3,1}+D^{b\#3,2}+1)$
$P(D)=0$ (Equation 19-3)

$(D^{a\#k,1,1}+D^{a\#k,1,2}+1)X(D)+(D^{b\#k,1}+D^{b\#k,2}+1)$
$P(D)=0$ (Equation 19-k)

$(D^{a\#3g-2,1,1}+D^{a\#3g-2,1,2}+1)X(D)+(D^{b\#3g-2,1}+D^{b\#3g-2,2}+1)P(D)=0$ (Equation 19-(3g-2))

$(D^{a\#3g-1,1,1}+D^{a\#3g-1,1,2}+1)X(D)+(D^{b\#3g-1,1}+D^{b\#3g-1,2}+1)P(D)=0$ (Equation 19-(3g-1))

$(D^{a\#3g,1,1}+D^{a\#3g,1,2}+1)X(D)+(D^{b\#3g,1}+D^{b\#3g,2}+1)P(D)=0$ (Equation 19-3g)

At this time, X(D) is a polynomial representation of data (information) X and P(D) is a polynomial representation of parity.

In equations 19-1 to 19-3g, parity check polynomials are assumed such that there are three terms in X(D) and P(D) respectively, and a $D^0$ term is present in X(D) and P(D) (where k=1, 2, 3, . . . , 3g).

In an LDPC-CC of a time varying period of 3g and a coding rate of 1/2 (n=2), parity and information at time i are represented by Pi and $X_{i,1}$ respectively. If i %3g=k (where k=0, 1, 2, . . . , 3g-1) is assumed at this time, a parity check polynomial of equation 19-(k+1) holds true. For example, if i=2, i %3g=2 (k=2), and therefore equation 20 holds true.

[20]

$(D^{a\#3,1,1}+D^{a\#3,1,2}+1)X_{2,1}+(D^{b\#3,1}+D^{b\#3,2}+1)P_2(D)=0$ (Equation 20)

If following <Condition #5-1> and <Condition #6-1> are satisfied at this time, the possibility of being able to create a code having higher error correction capability is increased.

<Condition #5-1>

In equations 19-1 to 19-3g, combinations of orders of X(D) satisfy the following condition:

$(a_{\#1,1,1}\%3, a_{\#1,1,2}\%3)$ is (1,2) or (2,1);

$(a_{\#2,1,1}\%3, a_{\#2,1,2}\%3)$ is (1,2) or (2,1);

$(a_{\#3,1,1}\%3, a_{\#3,1,2}\%3)$ is (1,2) or (2,1);

⋮

$(a_{\#k,1,1}\%3, a_{\#k,1,2}\%3)$ is (1,2) or (2,1) (where k=1,2, 3, . . . ,3g);

⋮

$(a_{\#3g-2,1,1}\%3, a_{\#3g-2,1,2}\%3)$ is (1,2) or (2,1), $(a_{\#3g-1,1,1}\%3, a_{\#3g-1,1,2}\%3)$ is (1,2) or (2,1); and $(a_{\#3g,1,1}\%3, a_{\#3g,1,2}\%3)$ is (1,2) or (2,1).

In addition, in equations 19-1 to 19-3g, combinations of orders of P(D) satisfy the following condition: $(b_{\#1,1}\%3, b_{\#1,2}\%3)$, $(b_{\#2,1}\%3, b_{\#2,2}\%3)$, $(b_{\#3,1}\%3, b_{\#3,2}\%3)$, $(b_{\#k,1}\%3, b_{\#k,2}\%3)$, $(b_{\#3g-2,1}\%3, b_{\#3g-2,2}\%3)$, $(b_{\#3g-1,1}\%3, b_{\#3g-1,2}\%3)$, and $(b_{\#3g,1}\%3, b_{\#3g,2}\%3)$ are any of (1, 2), or (2, 1) (where k=1, 2, 3, . . . , 3g).

<Condition #5-1> has a similar relationship with respect to equations 19-1 to 19-3g as <Condition #2-1> has with respect to equations 15-1 to 15-3g. If the condition below (<Condition #6-1>) is added for equations 19-1 to 19-3g in addition to <Condition #5-1>, the possibility of being able to create an LDPC-CC having higher error correction capability is increased.

<Condition #6-1>

Orders of X(D) of equations 19-1 to 19-3g satisfy the following condition: all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(a_{\#1,1,1}\%3g, a_{\#1,1,2}\%3g)$, $(a_{\#2,1,1}\%3g, a_{\#2,1,2}\%3g)$, . . . , $(a_{\#p,1,1}\%3g, a_{\#p,1,2}\%3g)$, . . . , $(a_{\#3g,1,1}\%3g, a_{\#3g,1,2}\%3g)$ (where p=1, 2, 3, . . . , 3g); and Orders of P(D) of equations 19-1 to 19-3g satisfy the following condition: all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g)$, . . . , $(b_{\#k,1}\%3g, b_{\#k,2}\%3g)$, . . . , $(b_{\#3g-2,1}\%3g, b_{\#3g-2,2}\%3g)$, $(b_{\#3g-1,1}\%3g, b_{\#3g-1,2}\%3g)$, and $(b_{\#3g,1}\%3g, b_{\#3g,2}\%3g)$ (where k=1, 2, 3, . . . 3g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is 1/2 that has parity check polynomials of equations 19-1 to 19-3g, if a code is created in which <Condition #6-1> is applied in addition to <Condition #5-1>, it is possible to provide randomness while maintaining regularity for positions at which "1"s are present in a parity check matrix, so that the possibility of obtaining better error correction capability is increased.

The possibility of being able to create a code having higher error correction capability is also increased if a code is created using <Condition #6'-1> instead of <Condition #6-1>, that is, using <Condition #6'-1> in addition to <Condition #5-1>.

<Condition #6'-1>

Orders of X(D) of equations 19-1 to 19-3g satisfy the following condition: all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(a_{\#1,1,1}\%3g, a_{\#1,1,2}\%3g)$, $(a_{\#2,1,1}\%3g, a_{\#2,1,2}\%3g)$, . . . , $(a_{\#0,1}\%3g, a_{\#p,1,2}\%3g)$, . . . , and $(a_{\#3g,1,1}\%3g, a_{\#3g,1,2}\%3g)$ (where p=1, 2, 3, . . . , 3g); or Orders of P(D) of equations 19-1 to 19-3g satisfy the following condition: all values other than multiples of 3 (that is, 0, 3, 6, . . . , 3g-3) from among integers from 0 to 3g-1 (0, 1, 2, 3, 4, . . . , 3g-2, 3g-1) are present in the following 6g values of $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g)$, . . . , $(b_{\#k,1}\%3g, b_{\#k,2}\%3g)$, . . . , $(b_{\#3g-2,1}\%3g, b_{\#3g-2,2}\%3g)$, $(b_{\#3g-1,1}\%3g, b_{\#3g-1,2}\%3g)$ and $(b_{\#3g,1}\%3g, b_{\#3g,2}\%3g)$ (where k=1, 2, 3, . . . , 3g).

Examples of LDPC-CCs of a coding rate of 1/2 and a time varying period of 6 having good error correction capability are shown in Table 4.

TABLE 4

| Code | Parity check polynomial |
|---|---|
| LDPC-CC #1 of a time varying period of 6 and a | Check polynomial #1: $(D^{328} + D^{317} + 1)X(D) + (D^{589} + D^{434} + 1)P(D) = 0$<br>Check polynomial #2: $(D^{596} + D^{553} + 1)X(D) + (D^{586} + D^{461} + 1)P(D) = 0$<br>Check polynomial #3: $(D^{550} + D^{143} + 1)X(D) + (D^{470} + D^{448} + 1)P(D) = 0$<br>Check polynomial #4: $(D^{470} + D^{223} + 1)X(D) + (D^{256} + D^{41} + 1)P(D) = 0$ |

TABLE 4-continued

| Code | Parity check polynomial |
|---|---|
| coding rate of 1/2 | Check polynomial #5: $(D^{89} + D^{40} + 1)X(D) + (D^{316} + D^{71} + 1)P(D) = 0$ |
| | Check polynomial #6: $(D^{320} + D^{190} + 1)X(D) + (D^{575} + D^{136} + 1)P(D) = 0$ |
| LDPC-CC #2 of a time varying period of 6 and a coding rate of 1/2 | Check polynomial #1: $(D^{524} + D^{511} + 1)X(D) + (D^{215} + D^{103} + 1)P(D) = 0$ |
| | Check polynomial #2: $(D^{547} + D^{287} + 1)X(D) + (D^{467} + D^{1} + 1)P(D) = 0$ |
| | Check polynomial #3: $(D^{289} + D^{62} + 1)X(D) + (D^{503} + D^{502} + 1)P(D) = 0$ |
| | Check polynomial #4: $(D^{401} + D^{55} + 1)X(D) + (D^{443} + D^{106} + 1)P(D) = 0$ |
| | Check polynomial #5: $(D^{433} + D^{395} + 1)X(D) + (D^{404} + D^{100} + 1)P(D) = 0$ |
| | Check polynomial #6: $(D^{136} + D^{59} + 1)X(D) + (D^{599} + D^{559} + 1)P(D) = 0$ |
| LDPC-CC #3 of a time varying period of 6 and a coding rate of 1/2 | Check polynomial #1: $(D^{253} + D^{44} + 1)X(D) + (D^{473} + D^{256} + 1)P(D) = 0$ |
| | Check polynomial #2: $(D^{595} + D^{143} + 1)X(D) + (D^{598} + D^{95} + 1)P(D) = 0$ |
| | Check polynomial #3: $(D^{97} + D^{11} + 1)X(D) + (D^{592} + D^{491} + 1)P(D) = 0$ |
| | Check polynomial #4: $(D^{50} + D^{10} + 1)X(D) + (D^{368} + D^{112} + 1)P(D) = 0$ |
| | Check polynomial #5: $(D^{286} + D^{221} + 1)X(D) + (D^{517} + D^{359} + 1)P(D) = 0$ |
| | Check polynomial #6: $(D^{407} + D^{322} + 1)X(D) + (D^{283} + D^{257} + 1)P(D) = 0$ |

An LDPC-CC of a time varying period of g with good characteristics has been described above. Also, for an LDPC-CC, it is possible to provide encoded data (codeword) by multiplying information vector n by generator matrix G. That is, encoded data (codeword) c can be represented by $c = n \times G$. Here, generator matrix G is found based on parity check matrix H designed in advance. To be more specific, generator matrix G refers to a matrix satisfying $G \times H^T = 0$.

For example, a convolutional code of a coding rate of 1/2 and generator polynomial $G = [1\ G_1(D)/G_0(D)]$ will be considered as an example. At this time, $G_1$ represents a feed-forward polynomial and $G_0$ represents a feedback polynomial. If a polynomial representation of an information sequence (data) is $X(D)$, and a polynomial representation of a parity sequence is $P(D)$, a parity check polynomial is represented as shown in equation 21 below.

[21]

$$G_1(D)X(D) + G_0(D)P(D) = 0 \quad \text{(Equation 21)}$$

where D is a delay operator.

FIG. 5 shows information relating to a (7, 5) convolutional code. A (7, 5) convolutional code generator polynomial is represented as $G = [1\ (D^2+1)/(D^2+D+1)]$. Therefore, a parity check polynomial is as shown in equation 22 below.

[22]

$$(D^2+1)X(D) + (D^2+D+1)P(D) = 0 \quad \text{(Equation 22)}$$

Here, data at point in time i is represented by $X_i$, and parity by $P_i$, and transmission sequence Wi is represented as $W_i = (X_i, P_i)$. Then transmission vector w is represented as $w = (X_1, P_1, X_2, P_2, \ldots, X_i, P_i \ldots)^T$. Thus, from equation 22, parity check matrix H can be represented as shown in FIG. 5. At this time, the relational equation in equation 23 below holds true.

[23]

$$Hw = 0 \quad \text{(Equation 23)}$$

Therefore, with parity check matrix H, the decoding side can perform decoding using belief propagation (BP) decoding, min-sum decoding similar to BP decoding, offset BP decoding, normalized BP decoding, shuffled BP decoding, or suchlike belief propagation, as shown in Non-Patent Literature 5, Non-Patent Literature 6 and Non-Patent Literature 9.

(Time-invariant/time varying LDPC-CCs (of a coding rate of (n−1)/n) based on a convolutional code (where n is a natural number))

An overview of time-invariant/time varying LDPC-CCs based on a convolutional code is given below.

A parity check polynomial represented as shown in equation 24 will be considered, with polynomial representations of coding rate of $R = (n-1)/n$ as information $X_1, X_2, \ldots, X_{n-1}$ as $X_1(D), X_2(D), \ldots, X_{n-1}(D)$, and a polynomial representation of parity P as P(D).

[24]

$$(D^{a_{1,1}} + D^{a_{1,2}} + \ldots + D^{a_{1,r_1}} + 1)X_1(D) + (D^{a_{2,1}} + D^{a_{2,2}} + \ldots + D^{a_{2,r_2}} + 1)X_2(D) + \ldots + (D^{a_{n-1,1}} + D^{a_{n-1,2}} + \ldots + D^{a_{n-1,r_{n-1}}} + 1)X_{n-1}(D) + (D^{b_1} + D^{b_2} + \ldots + D^{b_s} + 1)P(D) = 0 \quad \text{(Equation 24)}$$

In equation 24, at this time, $a_{p,q}$ (where $p = 1, 2, \ldots, n-1$ and $q = 1, 2, \ldots, r_p$) is, for example, a natural number, and satisfies the condition $a_{p,1} \neq a_{p,2} \neq \ldots \neq a_{p,r_p}$. Also, $b_q$ (where $q = 1, 2, \ldots, s$) is a natural number, and satisfies the condition $b_1 \neq b_2 \neq \ldots \neq b_s$. A code defined by a parity check matrix based on a parity check polynomial of equation 24 at this time is called a time-invariant LDPC-CC here.

Here, m different parity check polynomials based on equation 24 are provided (where m is an integer equal to or greater than 2). These parity check polynomials are represented as shown below.

[25]

$$A_{X1,i}(D)X_1(D) + A_{X2,i}(D)X_2(D) + \ldots + A_{Xn-1,i}(D)X_{n-1}(D) + B_i(D)P(D) = 0 \quad \text{(Equation 25)}$$

Here, $i = 0, 1, \ldots, m-1$.

Then information $X_1, X_2, \ldots, X_{n-1}$ at point in time j is represented as $X_{1,j}, X_{2,j}, \ldots, X_{n-1,j}$, parity P at point in time j is represented as $P_j$, and $u_j = (X_{1,j}, X_{2,j}, \ldots, X_{n-1,j}, P_j)^T$. At this time, information $X_{1,j}, X_{2,j}, \ldots, X_{n-1,j}$, and parity $P_j$ at point in time j satisfy a parity check polynomial of equation 26.

[26]

$$A_{X1,k}(D)X_1(D) + A_{X2,k}(D)X_2(D) + \ldots + A_{Xn-1,k}(D)X_{n-1}(D) + B_k(D)P(D) = 0 \quad \text{(Equation 26)}$$

Here, "j mod m" is a remainder after dividing j by m.

A code defined by a parity check matrix based on a parity check polynomial of equation 26 is called a time varying LDPC-CC here. At this time, a time-invariant LDPC-CC defined by a parity check polynomial of equation 24 and a time varying LDPC-CC defined by a parity check polynomial of equation 26 have a characteristic of enabling parity easily to be found sequentially by means of a register and exclusive OR.

Figure 6:
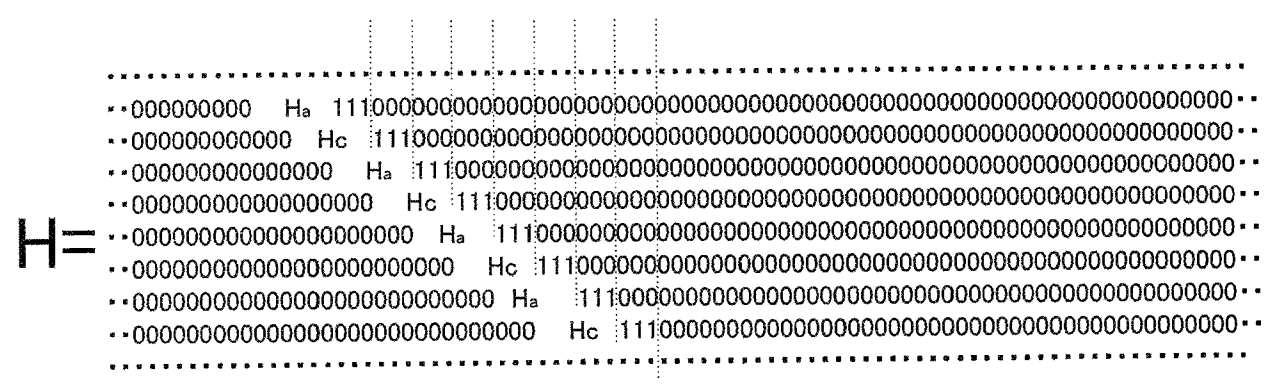

For example, the configuration of parity check matrix H of an LDPC-CC of a time varying period of 2 and a coding rate of 2/3 based on equation 24 to equation 26 is shown in FIG. 6. Two different check polynomials of a time varying period of 2 based on equation 26 are designed "check equation #1" and "check equation #2." In FIG. 6, (Ha,111) is a part corresponding to "check equation #1," and (Hc,111) is a part corresponding to "check equation #2." Below, (Ha,111) and (Hc,111) are defined as sub-matrices.

Thus, LDPC-CC parity check matrix H of a time varying period of 2 of this proposal can be defined by a first sub-matrix representing a parity check polynomial of "check equation #1", and by a second sub-matrix representing a parity check polynomial of "check equation #2". Specifically, in parity check matrix H, a first sub-matrix and second sub-matrix are arranged alternately in the row direction. When the coding rate is 2/3, a configuration is employed in which a sub-matrix is shifted three columns to the right between an i'th row and (i+1)-th row, as shown in FIG. 6.

In the case of a time varying LDPC-CC of a time varying period of 2, an i'th row sub-matrix and an (i+1)-th row sub-matrix are different sub-matrices. That is to say, either sub-matrix (Ha,111) or sub-matrix (Hc,111) is a first sub-matrix, and the other is a second sub-matrix. If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see equation 23).

Next, an LDPC-CC for which the time varying period is m is considered in the case of a coding rate of 2/3. In the same way as when the time varying period is 2, m parity check polynomials represented by equation 24 are provided. Then "check equation #1" represented by equation 24 is provided. "Check equation #2" to "check equation #m" represented by equation 24 are provided in a similar way. Data X and parity P of point in time mi+1 are represented by $X_{mi+1}$ and $P_{+1}$ respectively, data X and parity P of point in time mi+2 are represented by $X_{mi+2}$ and $P_{+2}$ respectively, . . . , and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." An LDPC-CC code of this kind provides the following advantages:

An encoder can be configured easily, and parity can be found sequentially.

Termination bit reduction and received quality improvement in puncturing upon termination can be expected.

Figure 7:
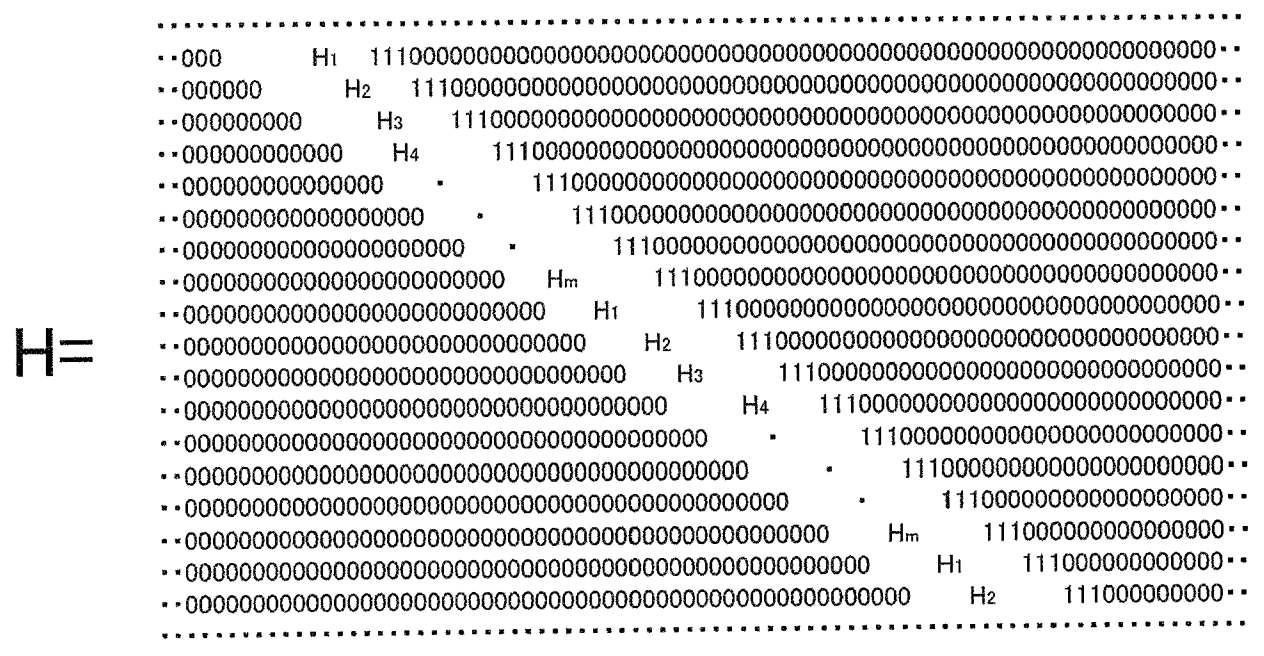

FIG. 7 shows the configuration of the above LDPC-CC parity check matrix of a coding rate of 2/3 and a time varying period of m. In FIG. 7, (H₁,111) is a part corresponding to "check equation #1," (H₂,111) is a part corresponding to "check equation #2," . . . , and (H$_{in}$,111) is a part corresponding to "check equation #m." Below, (E1₁,111) is defined as a first sub-matrix, (H₂,111) is defined as a second sub-matrix, . . . , and (H$_m$, 111) is defined as an m-th sub-matrix.

Thus, LDPC-CC parity check matrix H of a time varying period of m of this proposal can be defined by a first sub-matrix representing a parity check polynomial of "check equation #1", a second sub-matrix representing a parity check polynomial of "check equation #2", . . . , and an m-th sub-matrix representing a parity check polynomial of "check equation #m". Specifically, in parity check matrix H, a first sub-matrix to m-th sub-matrix are arranged periodically in the row direction (see FIG. 7). When the coding rate is 2/3, a configuration is employed in which a sub-matrix is shifted three columns to the right between an i-th row and (i+1)-th row (see FIG. 7).

If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see equation 23).

In the above description, a case of a coding rate of 2/3 has been described as an example of a time-invariant/time varying LDPC-CC based on a convolutional code of a coding rate of (n−1)/n, but a time-invariant/time varying LDPC-CC parity check matrix based on a convolutional code of a coding rate of (n−1)/n can be created by thinking in a similar way.

Figure 8:
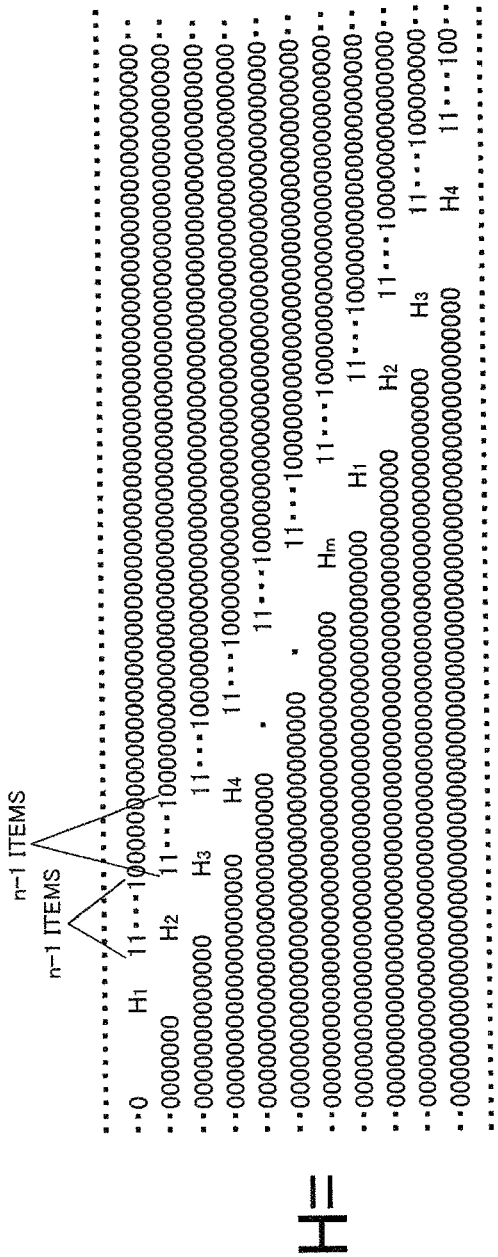
FIG. 8 shows an example of the configuration of an LDPC-CC parity check matrix of a coding rate of (n−1)/n and a time varying period of m.

That is to say, in the case of a coding rate of 2/3, in FIG. 7, (H₁,111) is a part (first sub-matrix) corresponding to "check equation #1," (H₂,111) is a part (second sub-matrix) corresponding to "check equation #2," . . . , and (H$_m$,111) is a part (m-th sub-matrix) corresponding to "check equation #m," while, in the case of a coding rate of (n−1)/n, the situation is as shown in FIG. 8. That is to say, a part (first sub-matrix) corresponding to "check equation #1" is represented by (H₁,11 . . . 1), and a part (k-th sub-matrix) corresponding to "check equation #k" (where k=2, 3, . . . , m) is represented by (H$_k$, 11 . . . 1). At this time, the number of "1"s of parts excluding H$_k$ in the k-th sub-matrix is n−1. Also, in parity check matrix H, a configuration is employed in which a sub-matrix is shifted n−1 columns to the right between an i'th row and (i+1)-th row (see FIG. 8).

If transmission vector u is represented as $u=(X_{1,0}, X_{2,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, the relationship Hu=0 holds true (see equation 23).

Figure 9:
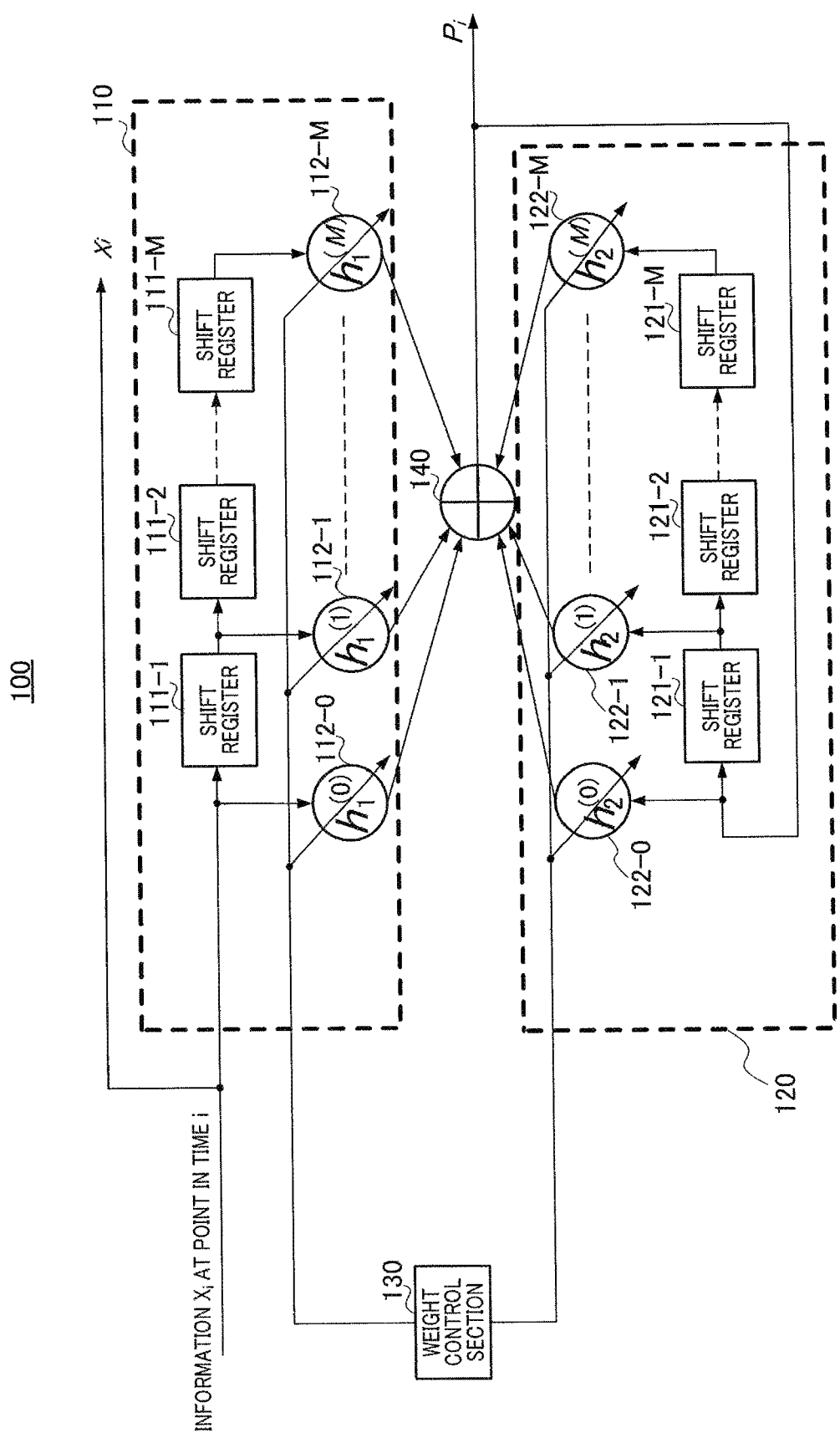
FIG. 9 shows an example of the configuration of an LDPC-CC encoding section.

FIG. 9 shows an example of the configuration of an LDPC-CC encoder when the coding rate is R=1/2.

As shown in FIG. 9, LDPC-CC encoder 100 is provided mainly with data computing section 110, parity computing section 120, weight control section 130, and modulo 2 adder (exclusive OR computer) 140.

Data computing section 110 is provided with shift registers 111-1 to 111-M and weight multipliers 112-0 to 112-M.

Parity computing section 120 is provided with shift registers 121-1 to 121-M and weight multipliers 122-0 to 122-M.

Shift registers 111-1 to 111-M and 121-1 to 121-M are registers storing and $v_{2,t-i}$ (where i=0, M) respectively, and, at a timing at which the next input comes in, send a stored value to the adjacent shift register to the right, and store a new value sent from the adjacent shift register to the left. The initial state of the shift registers is all-zeros.

Weight multipliers 112-0 to 112-M and 122-0 to 122-M switch values of $h_1^{(m)}$ and $h_2^{(m)}$ to 0 or 1 in accordance with a control signal outputted from weight control section 130.

Based on a parity check matrix stored internally, weight control section 130 outputs values of $h_1^{(m)}$ and $h_2^{(m)}$ at that timing, and supplies them to weight multipliers 112-0 to 112-M and 122-0 to 122-M.

Modulo 2 adder 140 adds all modulo 2 calculation results to the outputs of weight multipliers 112-0 to 112-M and 122-0 to 122-M, and calculates $v_{2,t}$.

By employing this kind of configuration, LDPC-CC encoder 100 can perform LDPC-CC encoding in accordance with a parity check matrix.

If the arrangement of rows of a parity check matrix stored by weight control section 130 differs on a row-by-row basis, LDPC-CC encoder 100 is a time varying convolutional encoder. Also, in the case of an LDPC-CC of a coding rate of (q−1)/q, a configuration needs to be employed in which (q−1) data computing sections 110 are provided and modulo 2 adder 140 performs modulo 2 addition (exclusive OR computation) of the outputs of weight multipliers.

Embodiment 1

Next, the present embodiment will explain a search method that can support a plurality of coding rates in a low computational complexity in an encoder and decoder. By using an LDPC-CC searched out by the method described below, it is possible to realize high data received quality in the decoder.

With the LDPC-CC search method according to the present embodiment, LDPC-CCs of coding rates of 2/3, 3/4, 4/5, ..., (q−1)/q are sequentially searched based on, for example, a coding rate of 1/2 among LDPC-CCs with good characteristics described above. By this means, in coding and decoding processing, by preparing a coder and decoder in the highest coding rate of (q−1)/q, it is possible to perform coding and decoding in a coding rate of (s−1)/s (S=2, 3, ..., q−1) lower than the highest coding rate of (q−1)/q.

A case in which the time varying period is 3 will be described below as an example. As described above, an LDPC-CC for which the time varying period is 3 can provide excellent error correction capability.

(LDPC-CC search method)

(1) Coding rate of 1/2

First, an LDPC-CC of a coding rate of 1/2 is selected as a reference LDPC-CC of a coding rate of 1/2. Here, an LDPC-CC of good characteristics described above is selected as a reference LDPC-CC of a coding rate of 1/2.

A case will be explained below where the parity check polynomials represented by equations 27-1 to 27-3 are used as parity check polynomials of a reference LDPC-CC of a coding rate of 1/2. The examples of equations 27-1 to 27-3 are represented in the same way as above (i.e. an LDPC-CC of good characteristics), so that it is possible to define an LDPC-CC of a time varying period of 3 by three parity check polynomials.

[27]

$(D^{373}+D^{56}+1)X_1(D)+(D^{406}+D^{218}+1)P(D)=0$ (Equation 27-1)

$(D^{457}+D^{197}+1)X_1(D)+(D^{491}+D^{22}+1)P(D)=0$ (Equation 27-2)

$(D^{485}+D^{70}+1)X_1(D)+(D^{236}+D^{181}+1)P(D)=0$ (Equation 27-1)

As described in table 3, equations 27-1 to 27-3 are represented as an example of an LDPC-CC with good characteristics where the time varying period is 3 and the coding rate is 1/2. Then, as described above (with an LDPC-CC of good characteristics), information $X_1$ at point in time j is represented as $X_{1,j}$, parity P at point in time j is represented as $P_j$, and $u_j=(X_{1,j}, P_j)^T$. At this time, information $X_{1,j}$ and parity $P_j$ at point in time j satisfy a parity check polynomial of equation 27-1 when "j mod 3=0." Further, information $X_{1,j}$ and parity $P_j$ at point in time j satisfy a parity check polynomial of equation 27-2 when "j mod 3=1." Further, information $X_{1,j}$ and parity $P_j$ at point in time j satisfy a parity check polynomial of equation 27-3 when "j mod 3=2." At this time, the relationships between parity check polynomials and a parity check matrix are the same as above (i.e. as in an LDPC-CC of good characteristics).

(2) Coding rate of 2/3

Next, LDPC-CC parity check polynomials of a coding rate of 2/3 is created based on the parity check polynomials of a coding rate of 1/2 with good characteristics. To be more specific, LDPC-CC parity check polynomials of a coding rate of 2/3 are formed, including the reference parity check polynomials of a coding rate of 1/2.

As shown in equations 28-1 to 28-3, upon using equations 27-1 to 27-3 in a reference LDPC-CC of a coding rate of 1/2, it is possible to represent LDPC-CC parity check polynomials of a coding rate of 2/3.

[28]

$(D^{373}+D^{56}+1)X_1(D)+(D^{\alpha 1}+D^{\beta 1}+1)X_2(D)+D^{406}+D^{218}+1)P(D)=0$ (Equation 28-1)

$(D^{457}+D^{197}+1)X_1(D)+(D^{\alpha 2}+D^{\beta 2}+1)X_2(D)+D^{491}+D^{22}+1)P(D)=0$ (Equation 28-1)

$(D^{485}+D^{70}+1)X_1(D)+(D^{\alpha 3}+D^{\beta 3}+1)X_2(D)+D^{236}+D^{181}+1)P(D)=0$ (Equation 28-1)

The parity check polynomials represented by equations 28-1 to 28-3 are formed by adding term X2(D) to equations 27-1 to 27-3. LDPC-CC parity check polynomials of a coding rate of 2/3 used in equations 28-1 to 28-3 are references for parity check polynomials of a coding rate of 3/4.

Also, in equations 28-1 to 28-3, if the orders of X2(D), (α1, β1), (α2, β2), (α3, β3), are set to satisfy the above conditions (e.g. <Condition #1> to <Condition #6>), it is possible to provide an LDPC-CC of good characteristics even in a coding rate of 2/3.

Then, as described above (with an LDPC-CC of good characteristics), information $X_1$ and $X_2$ at point in time j is represented as $X_{1,j}$ and $X_{2,j}$, parity P at point in time j is represented as $P_j$, and $u_j=(X_{1,j}, X_{2,j}, P_j)^T$. At this time, information $X_{1,j}$ and $X_{2,j}$ and parity $P_j$ at point in time j satisfy a parity check polynomial of equation 28-1 when "j mod 3=0." Further, information $X_{1,j}$ and $X_{2,j}$ and parity $P_j$ at point in time j satisfy a parity check polynomial of equation 28-2 when "j mod 3=1." Further, information $X_{1,j}$ and $X_{2,j}$ and parity $P_j$ at point in time j satisfy a parity check polynomial of equation 28-3 when "j mod 3=2." At this time, the relationships between parity check polynomials and a parity check matrix are the same as above (i.e. as in an LDPC-CC of good characteristics).

(3) Coding rate of 3/4

Next, LDPC-CC parity check polynomials of a coding rate of 3/4 is created based on the above parity check polynomials of a coding rate of 2/3. To be more specific, LDPC-CC parity check polynomials of a coding rate of 3/4 are formed, including the reference parity check polynomials of a coding rate of 2/3.

Equations 29-1 to 29-3 show LDPC-CC parity check polynomials of a coding rate of 3/4 upon using equations 28-1 to 28-3 in a reference LDPC-CC of a coding rate of 2/3.

[29]

$(D^{373}+D^{56}+1)X_1(D)+(D^{\alpha 1}+D^{\beta 1}+1)X_2(D)+(D^{\gamma 1}+D^{\delta 1}+1)X_3(D)+(D^{406}+D^{218}+1)P(D)=0$ (Equation 29-1)

$(D^{457}+D^{197}+1)X_1(D)+(D^{\alpha 2}+D^{\beta 2}+1)X_2(D)+(D^{\gamma 2}+D^{\delta 2}+1)X_3(D)+(D^{491}+D^{22}+1)P(D)=0$ (Equation 29-2)

$(D^{485}+D^{70}+1)X_1(D)+(D^{\alpha 3}+D^{\beta 3}+1)X_2(D)+(D^{\gamma 3}+D^{\delta 3}+1)X_3(D)+(D^{236}+D^{181}+1)P(D)=0$ (Equation 29-3)

The parity check polynomials represented by equations 29-1 to 29-3 are formed by adding term X2(D) to equations 28-1 to 28-3. Also, in equations 29-1 to 29-3, if the orders in X2(D), (γ1, δ1), (γ2, δ2), (γ3, δ3), are set to satisfy the above conditions (e.g. <Condition #1> to <Condition #6>)

with good characteristics, it is possible to provide an LDPC-CC of good characteristics even in a coding rate of 3/4.

Then, as described above (LDPC-CC of good characteristics), information $X_1$, $X_2$ and $X_3$ at point in time j is represented as $X_{1,j}$, $X_{2,j}$ and $X_{3,j}$, parity P at point in time j is represented as $P_j$, and $u_j=(X_{1,j}, X_{2,j}, P_j)^T$. At this time, information $X_{1,j}$, $X_{2,j}$ and $X_{3,j}$ and parity $P_j$ at point in time j satisfy a parity check polynomial of equation 29-1 when "j mod 3=0." Further, information $X_{1,j}$, $X_{2,j}$ and $X_{3,j}$ and parity $P_j$ at point in time j satisfy a parity check polynomial of equation 29-2 when "j mod 3=1." Further, information $X_{i,j}$, $X_{2,j}$ and $X_{3,j}$ and parity $P_j$ at point in time j satisfy a parity check polynomial of equation 29-3 when "j mod 3=2." At this time, the relationships between parity check polynomials and a parity check matrix are the same as above (i.e. as in an LDPC-CC of good characteristics).

Equations 30-1 to 30-(q−1) show general LDPC-CC parity check polynomials of a time varying period of g upon performing a search as above.

[30]

$$A_{X1,k}(D)X_1(D)+B_k(D)P(D)=0 (k=i \bmod g) \quad \text{(Equation 30-1)}$$

$$A_{X1,k}(D)X_1(D)+A_{X2,k}(D)X_2(D)+B_k(D)P(D)=0 (k=i \bmod g) \quad \text{(Equation 30-2)}$$

$$A_{X1,k}(D)X_1(D)+A_{X2,k}(D)X_2(D)+A_{X3,k}(D)X_3(D)+B_k(D)P(D)=0 (k=i \bmod g) \quad \text{(Equation 30-3)}$$

$$A_{X1,k}(D)X_1(D)+A_{X2,k}(D)X_2(D)+\ldots A_{Xq-1,k}(D)X_{q-1}(D)=B_k(D)P(D)=0 (k=i \bmod g) \quad \text{(Equation 30-(q-1))}$$

Here, equation 30-1 is represented as above because it is a general equation. However, as described above (with an LDPC-CC of good characteristics), the time varying period is g, and therefore equation 30-1 is actually represented by g parity check polynomials. For example, as described with the present embodiment, when the time varying period is 3, representation of three parity check polynomials is provided as shown in equations 27-1 to 27-3. Similar to equation 30-1, equations 30-2 to 30-(q−1) each have a time varying period of g, and therefore are represented by g parity check equations.

Here, assume that g parity check equations of equation 30-1 are represented by equation 30-1-0, equation 30-1-1, equation 30-1-2, . . . , equation 30-1-(g−2) and equation 30-1-(g−1).

Similarly, equation 30-w is represented by g parity check polynomials (w=2, 3, . . . , q−1). Here, assume that g parity check equations of equation 30-w are represented by equation 30-w-0, equation 30-w-1, equation 30-w-2, . . . , equation 30-w-(g−2) and equation 30-w-(g−1).

Also, in equations 30-1 to 30-(q−1), information $X_1$, $X_2$, . . . , $X_{q-1}$ at point in time i is represented as $X_{1,i}$, $X_{2,i}$, . . . , $X_{q-1,i}$, and parity P at point in time i is represented as $P_i$. Also, $A_{Xr,k}(D)$ refers to a term of $X_r(D)$ in the parity check polynomial for k calculated from "k=i mod g," at point in time i where the coding rate is (r−1)/r (r=2, 3, . . . , q, and q is a natural number equal to or greater than 3). Also, $B_k(D)$ refers to a term of P(D) in the parity check polynomial for k calculated from "k=i mod g," at point in time i where the coding rate is (r−1)/r. Here, "i mod g" is a remainder after dividing i by g.

That is, equation 30-1 represents an LDPC-CC parity check polynomial of a time varying period of g supporting a coding rate of 1/2, equation 30-2 represents an LDPC-CC parity check polynomial of a time varying period of g supporting a coding rate of 2/3, . . . , and equation 30-(q−1) represents an LDPC-CC parity check polynomial of a time varying period of g supporting a coding rate of (q−1)/q.

Thus, based on equation 30-1 which represents an LDPC-CC parity check polynomial of a coding rate of 1/2 with good characteristics, an LDPC-CC parity check polynomial of a coding rate of 2/3 (i.e. equation 30-2) is generated.

Further, based on equation 30-2 which represents an LDPC-CC parity check polynomial of a coding rate of 2/3, an LDPC-CC parity check polynomial of a coding rate of 3/4 (i.e. equation 30-3) is generated. The same applies to the following, and, based on an LDPC-CC of a coding rate of (r−1)/r, LDPC-CC parity check polynomials of a coding rate of r/(r+1) (r=2, 3, . . . , q−2, q−1) are generated.

The above method of forming parity check polynomials will be shown in a different way. Consider an LDPC-CC for which the coding rate is (y−1)/y and the time varying period is g, and an LDPC-CC for which the coding rate is (z−1)/z and the time varying period is g. Here, the maximum coding rate is (q−1)/q among coding rates to share encoder circuits and to share decoder circuits, where g is an integer equal to or greater than 2, y is an integer equal to or greater than 2, z is an integer equal to or greater than 2, and the relationship of y<z≤q holds true. Here, sharing encoder circuits means to share circuits inside encoders, and does not mean to share circuits between an encoder and a decoder.

At this time, if w=y−1 is assumed in equations 30-w-0, 30-w-1, 30-w-2, . . . , 30-w-(g−2) and 30-w-(g−1), which represent g parity check polynomials described upon explaining equations 30-1 to 30-(q−1), representations of g parity check polynomials is provided as shown in equations 31-1 to 31-g.

[31]

$$A_{X1,0}(D)X_1(D)+ \quad \text{(Equation 31-1)}$$
$$A_{X2,0}(D)X_2(D)+\ldots+A_{Xy-1,0}(D)X_{y-1}(D)+$$
$$B_0(D)P(D)=0 \ (0=i \bmod g)$$

$$B_0(D)P(D)+\sum_{r=1}^{y-1}A_{Xr,0}(D)X_r(D)=0 \ (0=i \bmod g) \quad \text{(Equation 31-1')}$$

$$A_{X1,1}(D)X_1(D)+ \quad \text{(Equation 31-2)}$$
$$A_{X2,1}(D)X_2(D)+\ldots+A_{Xy-1,1}(D)X_{y-1}(D)+$$
$$B_1(D)P(D)=0 \ (1=i \bmod g)$$

$$B_1(D)P(D)+\sum_{r=1}^{y-1}A_{Xr,1}(D)X_r(D)=0 \ (1=i \bmod g) \quad \text{(Equation 31-2')}$$

$$\vdots$$

$$A_{X1,k}(D)X_1(D)+ \quad \text{(Equation 31-(k+1))}$$
$$A_{X2,k}(D)X_2(D)+\ldots+A_{Xy-1,k}(D)X_{y-1}(D)+$$
$$B_k(D)P(D)=0 \ (k=i \bmod g)$$

$$B_k(D)P(D)+\sum_{r=1}^{y-1}A_{Xr,k}(D)X_r(D)=0 \ (k=i \bmod g) \quad \text{(Equation 31-(k+1)')}$$

$$\vdots$$

$$A_{X1,g-1}(D)X_1(D)+A_{X2,g-1}(D)X_2(D)+\ldots+ \quad \text{(Equation 31-g)}$$
$$A_{Xy-1,g-1}(D)X_{y-1}(D)+$$
$$B_{g-1}(D)P(D)=0 \ (g-1=i \bmod g)$$

$$B_{g-1}(D)P(D)+ \quad \text{(Equation 31-g')}$$
$$\sum_{r=1}^{y-1}A_{Xr,g-1}(D)X_r(D)=0 \ (g-1=i \bmod g)$$

In equations 31-1 to 31-g, equation 31-w and equation 31-w' are equivalent, and therefore it is possible to replace equation 31-w below with equation 31-w' (w=1, 2, g).

Then, as described above (with an LDPC-CC of good characteristics), information $X_1, X_2, \ldots, X_{y-1}$ at point in time j is represented as $X_{1,j}, X_{2,j}, X_{y-1,j}$, parity P at point in time j is represented as $P_j$, and $u_j = (X_{1,j}, X_{2,j}, \ldots, X_{y-1,j}, P_j)^T$. At this time, information $X_{1,j}, X_{2,j}, \ldots, X_{y-1}$ and parity $P_j$ at point in time j: satisfy a parity check polynomial of equation 31-1 when "j mod g=0"; satisfy a parity check polynomial of equation 31-2 when "j mod g=1"; satisfy a parity check polynomial of equation 31-3 when "j mod g=2"; ... ; satisfy a parity check polynomial of equation 31-(k+1) when "j mod g=k"; ... ; and satisfy a parity check polynomial of equation 31-g when "j mod g=g–1." At this time, the relationships between parity check polynomials and a parity check matrix are the same as above (i.e. as in an LDPC-CC of good characteristics).

Next, if w=z–1 is assumed in equations 30-w-0, 30-w-1, 30-w-2, ..., 30-w-(g–2) and 30-w-(g–1), which represent g parity check polynomials described upon explaining equations 30-1 to 30-(q–1), representations of g parity check polynomials can be provided as shown in equations 32-1 to 32-g. Here, from the relationship of y<z≤q, representations of equations 32-1 to 32-g can be provided.

[32]

$$A_{X1,0}(D)X_1(D) + A_{X2,0}(D)X_2(D) + \ldots + \\ A_{Xy-1,0}(D)X_{y-1}(D) + \ldots + \\ A_{Xs,0}(D)X_s(D) + \ldots + A_{Xz-1,0}(D)X_{z-1}(D) + \\ B_0(D)P(D) = 0 \; (0 = i \bmod g)$$ (Equation 32-1)

$$B_0(D)P(D) + \sum_{r=1}^{y-1} A_{Xr,0}(D)X_r(D) + \\ \sum_{s=y}^{z-1} A_{Xs,0}(D)X_s(D) = 0 \; (0 = i \bmod g)$$ (Equation 32-1')

$$A_{X1,1}(D)X_1(D) + A_{X2,1}(D)X_2(D) + \ldots + \\ A_{Xy-1,1}(D)X_{y-1}(D) + \ldots + \\ A_{Xs,1}(D)X_s(D) + \ldots + A_{Xz-1,1}(D)X_{z-1}(D) + \\ B_1(D)P(D) = 0 \; (1 = i \bmod g)$$ (Equation 32-2)

$$B_1(D)P(D) + \sum_{r=1}^{y-1} A_{Xr,1}(D)X_r(D) + \\ \sum_{s=y}^{z-1} A_{Xs,1}(D)X_s(D) = 0 \; (1 = i \bmod g)$$ (Equation 32-2')

⋮

$$A_{X1,k}(D)X_1(D) + A_{X2,k}(D)X_2(D) + \ldots + \\ A_{Xy-1,k}(D)X_{y-1}(D) + \ldots + \\ A_{Xs,k}(D)X_s(D) + \ldots + A_{Xz-1,k}(D)X_{z-1}(D) + \\ B_k(D)P(D) = 0 \; (k = i \bmod g)$$ (Equation 32-(k+1))

$$B_k(D)P(D) + \sum_{r=1}^{y-1} A_{Xr,k}(D)X_r(D) + \\ \sum_{s=y}^{z-1} A_{Xs,k}(D)X_s(D) = 0 \; (k = i \bmod g)$$ (Equation 32-(k+1)')

⋮

$$A_{X1,g-1}(D)X_1(D) + A_{X2,g-1}(D)X_2(D) + \ldots + \\ A_{Xy-1,g-1}(D)X_{y-1}(D) + \ldots + \\ A_{Xs,g-1}(D)X_s(D) + \ldots + A_{Xz-1,g-1}(D)X_{z-1}(D) + \\ B_{g-1}(D)P(D) = 0 \; (g-1 = i \bmod g)$$ (Equation 32-g)

$$B_{g-1}(D)P(D) + \sum_{r=1}^{y-1} A_{Xr,g-1}(D)X_r(D) + \\ \sum_{s=y}^{z-1} A_{Xs,g-1}(D)X_s(D) = 0 \; (g-1 = i \bmod g)$$ (Equation 32-g')

In equations 32-1 to 32-g, equation 32-w and equation 32-w' are equivalent, and therefore it is possible to replace equation 32-w below with equation 32-w' (w=1, 2, ..., g).

Then, as described above (LDPC-CC of good characteristics), information $X_1, X_2, \ldots, X_{y-1}, \ldots, X_s, \ldots, X_{z-1}$ at point in time j is represented as $X_{1,j}, X_2, \ldots, X_{y-1,j}, \ldots, X_{s,j}, \ldots, X_{z-1,j}$, parity P at point in time j is represented as $P_j$, and $u_j = (X_{1,j}, X_{2,j}, \ldots, X_{y-1,j}, \ldots, X_{s,j}, \ldots, X_{z-1,j}, P_j)^T$ (here, from the relationship of y<z≤q, s=y, y+1, y+2, y+3, ... z–3, z–2, z–1). At this time, information $X_{1,j}, X_{2,j}, \ldots, X_{y-1,j}, \ldots, X_{s,j}, \ldots X_{z-1,j}$ and parity $P_j$ at point in time j: satisfy a parity check polynomial of equation 32-1 when "j mod g=0"; satisfy a parity check polynomial of equation 32-2 when "j mod g=1"; satisfy a parity check polynomial of equation 32-3 when "j mod g=2"; ..., satisfy a parity check polynomial of equation 32-(k+1) when "j mod g=k"; ... ; and satisfy a parity check polynomial of equation 32-g when "j mod g=g–1." At this time, the relationships between parity check polynomials and a parity check matrix are the same as above (i.e. as in an LDPC-CC of good characteristics).

In a case where the above relationships hold true, if the following conditions hold true for an LDPC-CC of a time varying period of g in a coding rate of (y–1)/y and for an LDPC-CC of a time varying period of g in a coding rate of (z–1)/z, it is possible to share circuits between an encoder for an LDPC-CC of a time varying period of g in a coding rate of (y–1)/y and an encoder for an LDPC-CC of a time varying period of g in a coding rate of (z–1)/z, and it is possible to share circuits between a decoder for an LDPC-CC of a time varying period of g in a coding rate of (y–1)/y and a decoder for an LDPC-CC of a time varying period of g in a coding rate of (z–1)/z. The conditions are as follows.

First, the following relationships hold true between equation 31-1 and equation 32-1:

$A_{X1,0}(D)$ of equation 31-1 and $A_{X1,0}(D)$ of equation 32-1 are equal;

⋮

$A_{Xf,0}(D)$ of equation 31-1 and $A_{Xf,0}(D)$ of equation 32-1 are equal;

⋮

$A_{Xy-1,0}(D)$ of equation 31-1 and $A_{Xy-1,0}(D)$ of equation 32-1 are equal. That is, the above relationships hold true for f=1,2,3, ... ,y–1.

Also, the following relationship holds true for parity:

$B_0(D)$ of equation 31-1 and $B_0(D)$ of equation 32-1 are equal.

Similarly, the following relationships hold true between equation 31-2 and equation 32-2:

$A_{X1,1}(D)$ of equation 31-2 and $A_{X1,1}(D)$ of equation 32-2 are equal;

⋮

$A_{Xf,1}(D)$ of equation 31-2 and $A_{Xf,1}(D)$ of equation 32-2 are equal;

⋮

$A_{Xy-1,1}(D)$ of equation 31-2 and $A_{Xy-1,1}(D)$ of equation 32-2 are equal. That is, the above relationships hold true for $f=1,2,3, \ldots, y-1$.

Also, the following relationship holds true for parity:

$B_1(D)$ of equation 31-2 and $B_1(D)$ of equation 32-2 are equal, and so on.

Similarly, the following relationships hold true between equation 31-h and equation 32-h:

$A_{X1,h-1}(D)$ of equation 31-h and $A_{X1,h-1}(D)$ of equation 32-h are equal;

⋮

$A_{Xf,h-1}(D)$ of equation 31-h and $A_{Xf,h-1}(D)$ of equation 32-h are equal;

⋮

$A_{Xy-i,h-i}(D)$ of equation 31-h and $A_{Xy-i,h-i}(D)$ of equation 32-h are equal.

That is, the above relationships hold true for $f=1, 2, 3, \ldots, y-1$.

Also, the following relationship holds true for parity:

$B_{h-1}(D)$ of equation 31-h and $B_{h-1}(D)$ of equation 32-h are equal, and so on.

Similarly, the following relationships hold true between equation 31-g and equation 32-g:

$A_{X1,g-1}(D)$ of equation 31-g and $A_{X1,g-1}(D)$ of equation 32-g are equal;

⋮

$A_{Xf,g-1}(D)$ of equation 31-g and $A_{Xf,g-1}(D)$ of equation 32-g are equal;

⋮

$A_{Xy-1,g-1}(D)$ of equation 31-g and $A_{Xy-1,g-1}(D)$ of equation 32-g are equal.

That is, the above relationships hold true for $f=1, 2, 3, \ldots, y-1$.

Also, the following relationship holds true for parity:

$B_{g-1}(D)$ of equation 31-g and $B_{g-1}(D)$ of equation 32-g are equal (therefore, $h=1,2,3, \ldots, g-2, g-1, g$).

In a case where the above relationships hold true, it is possible to share circuits between an encoder for an LDPC-CC of a time varying period of g in a coding rate of (y−1)/y and an encoder for an LDPC-CC of a time varying period of g in a coding rate of (z−1)/z, and it is possible to share circuits between a decoder for an LDPC-CC of a time varying period of g in a coding rate of (y−1)/y and a decoder for an LDPC-CC of a time varying period of g in a coding rate of (z−1)/z. Here, the method of sharing encoder circuits and the method of sharing decoder circuits will be explained in detail in the following (configurations of an encoder and decoder).

Examples of LDPC-CC parity check polynomials will be shown in table 5, where the time varying period is 3 and the coding rate is 1/2, 2/3, 3/4 or 5/6. Here, the form of parity check polynomials is the same as in the form of table 3. By this means, if the transmitting apparatus and the receiving apparatus support coding rates of 1/2, 2/3, 3/4 and 5/6 (or if the transmitting apparatus and the receiving apparatus support two or more of the four coding rates), it is possible to reduce the computational complexity (circuit scale) (this is because it is possible to share encoder circuits and decoder circuits even in the case of distributed codes, and therefore reduce the circuit scale), and provide data of high received quality in the receiving apparatus.

TABLE 5

| Code | Parity check polynomial |
|---|---|
| LDPC-CC of a time varying period of 3 and a coding rate of 1/2 | Check polynomial #1: $(D^{373} + D^{56} + 1)X_1(D) + (D^{406} + D^{218} + 1)P(D) = 0$<br>Check polynomial #2: $(D^{457} + D^{197} + 1)X_1(D) + (D^{491} + D^{22} + 1)P(D) = 0$<br>Check polynomial #3: $(D^{485} + D^{70} + 1)X_1(D) + (D^{236} + D^{181} + 1)P(D) = 0$ |
| LDPC-CC of a time varying period of 3 and a coding rate of 2/3 | Check polynomial #1:<br>$(D^{373} + D^{56} + 1)X_1(D) + (D^{86} + D^{4} + 1)X_2(D) + (D^{406} + D^{218} + 1)P(D) = 0$<br>Check polynomial #2:<br>$(D^{457} + D^{197} + 1)X_1(D) + (D^{368} + D^{295} + 1)X_2(D) + (D^{491} + D^{22} + 1)P(D) = 0$<br>Check polynomial #3:<br>$(D^{485} + D^{70} + 1)X_1(D) + (D^{475} + D^{398} + 1)X_2(D) + (D^{236} + D^{181} + 1)P(D) = 0$ |
| LDPC-CC of a time varying | Check polynomial #1: $(D^{373} + D^{56} + 1)X_1(D) + (D^{86} + D^{4} + 1)X_2(D) + (D^{388} + D^{134} + 1)X_3(D) + (D^{406} + D^{218} + 1)P(D) = 0$<br>Check polynomial #2: $(D^{457} + D^{197} + 1)X_1(D) + (D^{368} + D^{295} + 1)X_2(D) + (D^{155} + D^{136} + 1)X_3(D) + (D^{491} + D^{22} + 1)P(D) = 0$ |

TABLE 5-continued

| Code | Parity check polynomial |
|---|---|
| period of 3 and a coding rate of 3/4 | Check polynomial #3: $(D^{485} + D^{70} + 1)X_1(D) + (D^{475} + D^{398} + 1)X_2(D) + (D^{493} + D^{77} + 1)X_3(D) + (D^{236} + D^{181} + 1)P(D) = 0$ |
| LDPC-CC of a time varying period of 3 and a coding rate of 5/6 | Check polynomial #1: $(D^{373} + D^{56} + 1)X_1(D) + (D^{86} + D^{4} + 1)X_2(D) + (D^{388} + D^{134} + 1)X_3(D) + (D^{250} + D^{197} + 1)X_4(D) + (D^{295} + D^{113} + 1)X_5(D) + (D^{406} + D^{218} + 1)P(D) = 0$ <br> Check polynomial #2: $(D^{457} + D^{197}D + 1)X_1(D) + (D^{368} + D^{295} + 1)X_2(D) + (D^{155} + D^{136} + 1)X_3(D) + (D^{220} + D^{146} + 1)X_4(D) + (D^{311} + D^{115} + 1)X_5(D) + (D^{491} + D^{22} + 1)P(D) = 0$ <br> Check polynomial #3: $(D^{485} + D^{70} + 1)X_1(D) + (D^{475} + D^{398} + 1)X_2(D) + (D^{493} + D^{77} + 1)X_3(D) + (D^{490} + D^{239} + 1)X_4(D) + (D^{394} + D^{278} + 1)X_5(D) + (D^{236} + D^{181} + 1)P(D) = 0$ |

A case will be explained where LDPC-CCs of a time varying period of 3 in table 5 satisfy the above conditions. For example, consider an LDPC-CC of a time varying period of 3 in a coding rate of 1/2 in table 5 and an LDPC-CC of a time varying period of 3 in a coding rate of 2/3 in table 5. That is, y=2 holds true in equations 31-1 to 31-g, and z=3 holds true in equations 32-1 to 32-g.

Then, seen from an LDPC-CC of a time varying period of 3 in a coding rate of 1/2 in table 5, $A_{X1,0}(D)$ of equation 31-1 represents $D^{373}+D^{56}+1$, and, seen from an LDPC-CC of a time varying period of 3 in a coding rate of 2/3 in table 5, $A_{X1,0}(D)$ of equation 32-1 represents $D^{373}+D^{56}+1$, so that $A_{X1,0}(D)$ of equation 31-1 and $A_{X1,0}(D)$ of equation 32-1 are equal.

Also, seen from an LDPC-CC of a time varying period of 3 in a coding rate of 1/2 in table 5, $B_0(D)$ of equation 31-1 represents $D^{406}+D^{218}+1$, and, seen from an LDPC-CC of a time varying period of 3 in a coding rate of 2/3 in table 5, $B_0(D)$ of equation 32-1 represents $D^{406+1)218}+1$, so that $B_0(D)$ of equation 31-1 and $B_0(D)$ of equation 32-1 are equal.

Similarly, seen from an LDPC-CC of a time varying period of 3 in a coding rate of 1/2 in table 5, $A_{X1,1}(D)$ of equation 31-2 represents $D^{457}+D^{197}+1$, and, seen from an LDPC-CC of a time varying period of 3 in a coding rate of 2/3 in table 5, $A_{X1,1}(D)$ of equation 32-2 represents $D^{457}+D^{197}+1$, so that $A_{X1,1}(D)$ of equation 31-2 and $A_{X1,1}(D)$ of equation 32-2 are equal.

Also, seen from an LDPC-CC of a time varying period of 3 in a coding rate of 1/2 in table 5, $B_1(D)$ of equation 31-2 represents $D^{491}+D^{22}+1$, and, seen from an LDPC-CC of a time varying period of 3 in a coding rate of 2/3 in table 5, $B_1(D)$ of equation 32-2 represents $D^{491}+D^{22}+1$, so that $B_i(D)$ of equation 31-2 and $B_1(D)$ of equation 32-2 are equal.

Similarly, seen from an LDPC-CC of a time varying period of 3 in a coding rate of 1/2 in table 5, $A_{X1,2}(D)$ of equation 31-3 represents $D^{485}+D^{70}+1$, and, seen from an LDPC-CC of a time varying period of 3 in a coding rate of 2/3 in table 5, $A_{X1,2}(D)$ of equation 32-3 represents $D^{485}+D^{70}+1$, so that $A_{X1,2}(D)$ of equation 31-3 and $A_{X1,2}(D)$ of equation 32-3 are equal.

Also, seen from an LDPC-CC of a time varying period of 3 in a coding rate of 1/2 in table 5, $B_2(D)$ of equation 31-3 represents $D^{236}+D^{181}+1$, and, seen from an LDPC-CC of a time varying period of 3 in a coding rate of 2/3 in table 5, $B_2(D)$ of equation 32-3 represents $D236+D^{181}+1$, so that $B_2(D)$ of equation 31-3 and $B_2(D)$ of equation 32-3 are equal.

In view of the above, it is confirmed that an LDPC-CC of a time varying period of 3 in a coding rate of 1/2 in table 5 and an LDPC-CC of a time varying period of 3 in a coding rate of 2/3 in table 5 satisfy the above conditions.

Similarly as above, if LDPC-CCs of a time varying period of 3 in two different coding rates are selected from LDPC-CCs of a time varying period of 3 in coding rates of 1/2, 2/3, 3/4 and 5/6 in table 5, and whether or not the above conditions are satisfied is examined, it is confirmed that the above conditions are satisfied in any selected patterns.

Also, an LDPC-CC is a kind of a convolutional code, and therefore requires, for example, termination or tail-biting to secure belief in decoding of information bits. Here, a case will be considered where the method of making the state of data (information) X zero (hereinafter "information-zero-termination") is implemented.

Figure 10:
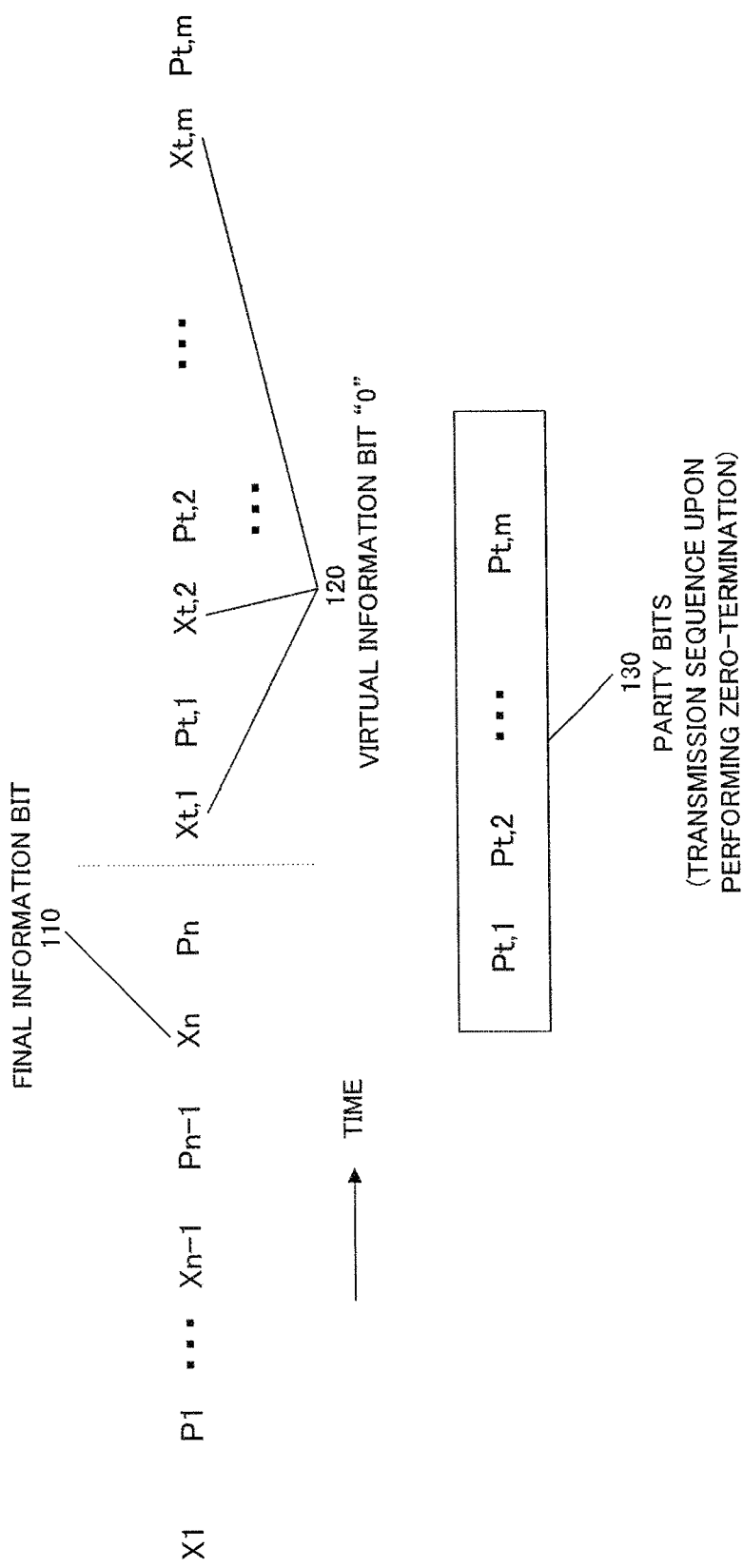
FIG. 10 is a drawing for explaining a method of information-zero-termination.

FIG. 10 shows the method of information-zero-termination. As shown in FIG. 10, the information bit (final transmission bit) that is finally transmitted in a transmission information sequence is Xn(110). With this final information bit Xn(110), if the transmitting apparatus transmits data only until parity bits generated in an encoder and then the receiving apparatus performs decoding, the received quality of information degrades significantly. To solve this problem, information bits subsequent to final information bit Xn(110) (hereinafter "virtual information bits") are presumed as "0" and encoded to generate parity bits 130.

In this case, the receiving apparatus knows that virtual information bits 120 are "0," so that the transmitting apparatus does not transmit virtual information bits 120, but transmits only parity bits 130 generated by virtual information bits 120 (these parity bits represent redundant bits that need to be transmitted, and therefore are called "redundant bits"). Then, a new problem arises that, in order to enable both improvement of efficiency of data transmission and maintenance of received quality of data, it is necessary to secure the received quality of data and decrease the number of parity bits 130 generated by virtual information bits 120 as much as possible.

At this time, it is confirmed by simulation that, in order to secure the received quality of data and decrease the number of parity bits generated by virtual information bits, terms related to parity of a parity check polynomial play an important role.

As an example, a case will be explained using an LDPC-CC for which the time varying period is m (where m is an integer equal to or greater than 2) and the coding rate is 1/2.

When the time varying period is m, m necessary parity check polynomials are represented by the following equation.

[33]

$$A_{X1,i}(D)X_1(D)+B_i(D)P(D)=0 \quad \text{(Equation 33)}$$

where i=0, 1, . . . , m−1. Also, assume that all of the orders of D in $A_{X1,1}(D)$ are integers equal to or greater than 0 (e.g. as shown in $A_{X1,1}(D)=D^{15}+D^3+D^0$, the orders of D are 15, 3 and 0, all of which are integers equal to or greater than 0), and all of the orders of D in $B_i(D)$ are also integers equal to or greater than 0 (e.g. as shown in $B_i(D)=D^{18}+D^4\pm D^0$, the orders of D are 18, 4 and 0, all of which are integers equal to or greater than 0).

Here, at time j, the parity check polynomial of the following equation holds true.

[34]

$$A_{X1,k}(D)X_1(D)+B_k(D)P(D)=0(k=j \bmod m) \quad \text{(Equation 34)}$$

Then, in $X_1(D)$, assume that: the highest order of D in $A_{X1,1}(D)$ is $\alpha_1$ (e.g. when $A_{X1,1}(D)=D^{15}+D^3+D^0$, D has the orders of 15, 3 and 0, and therefore provides 15 as the highest order of D, $\alpha_1$); the highest order of D in $A_{X1,2}(D)$ is $\alpha_2$; . . . ; the highest order of D in $A_{X1,i}(D)$ is $\alpha_i$; . . . ; and the highest order of D in $A_{X1,m-1}(D)$ is $\alpha_{m-1}$. Then, the highest value in $\alpha_i$ (where i=0, 1, 2, . . . , m−1) is $\alpha$.

On the other hand, in P(D), assume that: the highest order of D in $B_1(D)$ is $\beta_1$; the highest order of D in $B_2(D)$ is $\beta_2$; . . . ; the highest order of D in $B_i(D)$ is $\beta_i$; . . . ; and the highest order of D in $B_{m-1}(D)$ is $\beta_{m-1}$. Then, the highest value in $\beta_i$ (where i=0, 1, 2, . . . , m−1) is $\beta$.

Then, in order to secure the received quality of data and decrease the number of parity bits generated by virtual information bits as much as possible, it is preferable to set $\beta$ equal to or below half of $\alpha$.

Although a case has been described where the coding rate is 1/2, the same applies to other cases where the coding rate is above 1/2. At this time, especially when the coding rate is equal to or greater than 4/5, there is a trend to require a significant number of redundant bits to satisfy conditions for securing the received quality of data and decreasing the number of parity bits generated by virtual information bits as much as possible. Consequently, the conditions described above play an important role to secure the received quality of data and decrease the number of parity bits generated by virtual information bits as much as possible.

As an example, a case will be explained using an LDPC-CC for which the time varying period is m (where m is an integer equal to or greater than 2) and the coding rate is 4/5. When the time varying period is m, m necessary parity check polynomials are represented by the following equation.

[35]

$$A_{X1,i}(D)X_1(D)+A_{X2,i}(D)X_2(D)+A_{X3,i}(D)X_3(D)+A_{X4,i}(D)X_4(D)+B_i(D)P(D)=0 \quad \text{(Equation 35)}$$

where i=0, 1, . . . , m−1. Also, assume that all of the orders of D in $A_{X1,i}(D)$ are integers equal to or greater than 0 (e.g. as shown in $A_{X1,1}(D)=D^{15}+D^3+D^0$, the orders of D are 15, 3 and 0, all of which are integers equal to or greater than 0). Similarly, assume that: all of the orders of D in $A_{X2,i}(D)$ are integers equal to or greater than 0; all of the orders of D in $A_{X3,i}(D)$ are integers equal to or greater than 0; all of the orders of D in $A_{X4,i}(D)$ are integers equal to or greater than 0; and all of the orders of D in $B_1(D)$ are integers equal to or greater than 0 (e.g. as shown in $B_i(D)=D^{18}+D^4+D^0$, the orders of D are 18, 4 and 0, all of which are integers equal to or greater than 0).

Here, at time j, the parity check polynomial of the following equation holds true.

[36]

$$A_{X1,k}(D)X_1(D)+A_{X2,k}(D)X_2(D)+A_{X3,k}(D)X_3(D)+A_{X4,k}(D)X_4(D)+B_k(D)P(D)=0(k=j \bmod m) \quad \text{(Equation 35)}$$

Then, in $X_1(D)$, assume that: the highest order of D in $A_{X1,1}(D)$ is $\alpha_{1,1}$ (e.g. when $A_{X1,1}(D)=D^{15}+D^3+D^0$, D has the orders of 15, 3 and 0, and therefore provides 15 as the highest order of D, $\alpha_{1,1}$); the highest order of D in $A_{X1,2}(D)$ is $\alpha_{1,2}$; . . . ; the highest order of D in $A_{X1,i}(D)$ is $\alpha_{1,i}$; . . . ; and the highest order of D in $A_{X1,m-1}(D)$ is $\alpha_{1,m-1}$. Then, the highest value in $\alpha_{1,i}$ (where i=0, 1, 2, . . . , m−1) is $\alpha_1$.

In $X_2(D)$, assume that: the highest order of D in $A_{X2,1}(D)$ is $\alpha_{2,1}$ (e.g. when $A_{X2,1}(D)=D^{15}+D^3+D^0$, D has the orders of 15, 3 and 0, and therefore provides 15 as the highest order of D, $\alpha_{2,1}$); the highest order of D in $A_{X2,2}(D)$ is $\alpha_{2,2}$; . . . ; the highest order of D in $A_{X2,i}(D)$ is $\alpha_{2,i}$; . . . ; and the highest order of D in $A_{X2,m-1}(D)$ is $\alpha_{2,m-1}$. Then, the highest value in $\alpha_{2,i}$ (where i=0, 1, 2, . . . , m−1) is $\alpha_2$.

In $X_3(D)$, assume that: the highest order of D in $A_{X3,1}(D)$ is $\alpha_{3,1}$ (e.g. when $A_{X3,1}(D)=D^{15}+D^3+D^0$, D has the orders of 15, 3 and 0, and therefore provides 15 as the highest order of D, $\alpha_{3,1}$); the highest order of D in $A_{X3,2}(D)$ is $\alpha_{3,2}$; . . . ; the highest order of D in $A_{X3,i}(D)$ is $\alpha_{3,i}$; . . . ; and the highest order of D in $A_{X3,m-1}(D)$ is $\alpha_{3,m-1}$. Then, the highest value in $\alpha_{3,i}$ (where i=0, 1, 2, . . . , m−1) is $\alpha_3$.

In $X_4(D)$, assume that: the highest order of D in $A_{X4,1}(D)$ is $\alpha_{4,1}$ (e.g. when $A_{X4,1}(D)=D^{15}+D^3+D^0$, D has the orders of 15, 3 and 0, and therefore provides 15 as the highest order of D, $\alpha_{4,i}$); the highest order of D in $A_{X4,2}(D)$ is $\alpha_{4,2}$; . . . ; the highest order of D in $A_{X4,i}(D)$ is $\alpha_{4,i}$; . . . ; and the highest order of D in $A_{X4,m-1}(D)$ is $\alpha_{4,m-1}$. Then, the highest value in $\alpha_{4,i}$ (where i=0, 1, 2, . . . , m−1) is $\alpha_4$.

In P(D), assume that: the highest order of D in $B_1(D)$ is $\beta_1$; the highest order of D in $B_2(D)$ is $\beta_2$; . . . ; the highest order of D in $B_i(D)$ is $\beta_i$; . . . ; and the highest order of D in $B_{m-1}(D)$ is $\beta_{m-1}$. Then, the highest value in $\beta_i$ (where i=0, 1, 2, . . . , m−1) is $\beta$.

Then, in order to secure the received quality of data and decrease the number of parity bits generated by virtual information bits as much as possible, it is necessary to satisfy conditions that: $\beta$ is equal to or below half of $\alpha_1$; $\beta$ is equal to or below half of $\alpha_2$; $\beta$ is equal to or below half of $\alpha_3$; and $\beta$ is equal to or below half of $\alpha_4$, so that, especially, there is a high possibility to secure the received quality of data.

Also, even in a case where: $\beta$ is equal to or below half of $\alpha_1$; $\beta$ is equal to or below half of $\alpha_2$; $\beta$ is equal to or below half of $\alpha_3$; or $\beta$ is equal to or below half of $\alpha_4$, although it is possible to secure the received quality of data and decrease the number of parity bits generated by virtual information bits as much as possible, there is a little possibility to cause degradation in the received quality of data (here, degradation in the received quality of data is not necessarily caused).

Therefore, in the case of an LDPC-CC for which the time varying period is m (where m is an integer equal to or greater than 2) and the coding rate is (n−1)/n, the following is possible.

When the time varying period is m, m necessary parity check polynomials are represented by the following equation.

[37]

$$A_{X1,i}(D)X_1(D)+A_{X2,i}(D)X_2(D)+ \ldots +A_{Xn-1,i}(D)X_{n-1}(D)+B_i(D)P(D)=0 \quad \text{(Equation 37)}$$

where i=0, 1, . . . , m−1. Also, assume that all of the orders of D in $A_{X1,i}(D)$ are integers equal to or greater than 0 (e.g. as shown in $A_{X1,1}(D)=D^{15}+D^3+D^0$, the orders of D are 15, 3 and 0, all of which are integers equal to or greater than 0). Similarly, assume that: all of the orders of D in $A_{X2,i}(D)$ are integers equal to or greater than 0; all of the orders of D in $A_{X3,i}(D)$ are integers equal to or greater than 0; all of the orders of D in $A_{X4,i}(D)$ are integers equal to or greater than 0; . . . ; all of the orders of D in $A_{Xu,i}(D)$ are integers equal to or greater than 0; . . . ; all of the orders of D in $A_{Xn-1,i}(D)$ are integers equal to or greater than 0; and all of the orders of D in $B_i(D)$ are integers equal to or greater than 0 (e.g. as shown in $B_i(D)=D^{18}+D^4+D^0$, the orders of D are 18, 4 and 0, all of which are integers equal to or greater than 0).

Here, at time j, the parity check polynomial of the following equation holds true.

[38]

$$A_{X1,k}(D)X_1(D)+A_{X2,k}(D)X_2(D)+ \ldots +A_{Xn-1,k}(D)X_{n-1}(D)+B_k(D)P(D)=0 (k=j \bmod m) \quad \text{(Equation 38)}$$

Then, in $X_1(D)$, assume that: the highest order of D in $A_{X1,1}(D)$ is $\alpha_{1,1}$ (e.g. when $A_{X1,1}(D)=D^{15}+D^3+D^0$, D has the orders of 15, 3 and 0, and therefore provides 15 as the highest order of D, $\alpha_{1,i}$); the highest order of D in $A_{X1,2}(D)$ is $\alpha_{1,2}$; . . . ; the highest order of D in $A_{X1,i}(D)$ is $\alpha_{1,i}$; . . . ; and the highest order of D in $A_{X1,m-1}(D)$ is $\alpha_{1,m-1}$. Then, the highest value in $\alpha_{1,i}$ (where i=0, 1, 2, . . . , m−1) is $\alpha_1$.

In $X_2(D)$, assume that: the highest order of D in $A_{X2,1}(D)$ is $\alpha_{2,1}$ (e.g. when $A_{X2,1}(D)=D^{15}+D^3+D^0$, D has the orders of 15, 3 and 0, and therefore provides 15 as the highest order of D, $\alpha_{2,1}$); the highest order of D in $A_{X2,2}(D)$ is $\alpha_{2,2}$; . . . ; the highest order of D in $A_{X2,i}(D)$ is $a_{2,i}$; . . . ; and the highest order of D in $A_{X2,m-1}(D)$ is $\alpha_{2,m-1}$. Then, the highest value in $\alpha_{2,1}$ (where i=0, 1, 2, . . . , m−1) is $\alpha_2$.

In $X_u(D)$, assume that: the highest order of D in $A_{Xu,1}(D)$ is $\alpha_{u,1}$ (e.g. when $A_{Xu,1}(D)=D^{15}+D^3+D^0$, D has the orders of 15, 3 and 0, and therefore provides 15 as the highest order of D, $\alpha_{u,1}$); the highest order of D in $A_{Xu,m-1}(D)$ is $\alpha_{u,2}$; . . . ; the highest order of D in $A_{Xu,i}(D)$ is $\alpha_{u,i}$; . . . ; and the highest order of D in $A_{Xu,m-1}(D)$ is $\alpha_{u,m-1}$. Then, the highest value in $\alpha_{u,i}$ (where i=0, 1, 2, . . . , m−1, u=1, 2, 3, . . . , n−2, n−1) is $\alpha_u$.

In $X_{n-1}(D)$, assume that: the highest order of D in $A_{Xn-1,1}(D)$ is $\alpha_{n-1,1}$ (e.g. when $A_{Xn-1,1}(D)=D^{15}+D^3+D^0$, D has the orders of 15, 3 and 0, and therefore provides 15 as the highest order of D, $\alpha_{n-1,1}$); the highest order of D in $A_{Xn-1,2}(D)$ is $\alpha_{n-1,2}$; . . . ; the highest order of D in $A_{Xn-1,i}(D)$ is $\alpha_{n-1,i}$; . . . ; and the highest order of D in $A_{Xn-1,m-1}(D)$ is $\alpha_{n-1,m-1}$. Then, the highest value in $\alpha_{n-1,i}$ (where i=0, 1, 2, . . . , m−1) is $\alpha_{n-1}$.

In P(D), assume that: the highest order of D in $B_1(D)$ is $\beta_1$; the highest order of D in $B_2(D)$ is $\beta_2$; . . . ; the highest order of D in $B_i(D)$ is $\beta_i$; . . . ; and the highest order of D in $B_{m-1}(D)$ is $\beta_{m-1}$. Then, the highest value in $\beta_i$ (where i=0, 1, 2, . . . , m−1) is $\beta$.

Then, in order to secure the received quality of data and decrease the number of parity bits generated by virtual information bits as much as possible, it is necessary to satisfy conditions that: $\beta$ is equal to or below half of $\alpha_1$; $\beta$ is equal to or below half of $\alpha_2$; . . . ; $\beta$ is equal to or below half of $\alpha_u$; . . . ; and $\beta$ is equal to or below half of $\alpha_{n-1}$ (where u=1, 2, 3, . . . , n−2, n−1), so that, especially, there is a high possibility to secure the received quality of data.

Also, even in a case where: $\beta$ is equal to or below half of $\alpha_1$; $\beta$ is equal to or below half of $\alpha_2$; . . . ; $\beta$ is equal to or below half of $\alpha_u$; . . . ; or $\beta$ is equal to or below half of $\alpha_{n-1}$ (where u=1, 2, 3, . . . , n−2, n−1), although it is possible to secure the received quality of data and decrease the number of parity bits generated by virtual information bits as much as possible, there is a little possibility to cause degradation in the received quality of data (here, degradation in the received quality of data is not necessarily caused).

Table 6 shows an example of LDCPC-CC parity check polynomials that can secure the received quality of data and reduce redundant bits, where the time varying period is 3 and the coding rate is 1/2, 2/3, 3/4 or 4/5. If LDPC-CCs of a time varying period of 3 in two different coding rates are selected from LDPC-CCs of a time varying period of 3 in coding rates of 1/2, 2/3, 3/4 and 4/5 in table 6, and whether or not the above-described conditions for sharing encoders and decoders are satisfied is examined, similar to LDPC-CCs of a time varying period of 3 in table 5, it is confirmed that the above conditions for enabling sharing process in encoders and decoders are satisfied in any selected patterns.

Also, although 1000 redundant bits are required in a coding rate of 5/6 in table 5, it is confirmed that the number of redundant bits is equal to or below 500 bits in a coding rate of 4/5 in table 6.

Also, in the codes of table 6, the number of redundant bits (which are added for information-zero-termination) varies between coding rates. At this time, the number of redundant bits tends to increase when the coding rate increases. That is, in a case where codes are created as shown in tables 5 and 6, if there are a code of a coding rate of (n−1)/n and a code of a coding rate of (m−1)/m (n>m), the number of redundant bits required for the code of a coding rate of (n−1)/n (i.e. the number of redundant bits added for information-zero-termination) is more than the number of redundant bits required for the code of a coding rate of (m−1)/m (i.e. the number of redundant bits added for information-zero-termination).

TABLE 6

| Code | Parity check polynomial |
| --- | --- |
| LDPC-CC of a time varying period of 3 and a coding rate of 1/2 | Check polynomial #1:<br>$(D^{268} + D^{164} + 1)X_1(D) + (D^{92} + D^7 + 1)P(D) = 0$<br>Check polynomial #2:<br>$(D^{370} + D^{317} + 1)X_1(D) + (D^{95} + D^{22} + 1)P(D) = 0$<br>Check polynomial #3:<br>$(D^{346} + D^{86} + 1)X_1(D) + (D^{88} + D^{26} + 1)P(D) = 0$ |
| LDPC-CC of a time varying period of 3 and a coding rate of 2/3 | Check polynomial #1:<br>$(D^{268} + D^{164} + 1)X_1(D) + (D^{385} + D^{242} + 1)$<br>$X_2(D) + (D^{92} + D^7 + 1)P(D) = 0$<br>Check polynomial #2:<br>$(D^{370} + D^{317} + 1)X_1(D) + (D^{125} + D^{103} + 1)$<br>$X_2(D) + (D^{95} + D^{22} + 1)P(D) = 0$<br>Check polynomial #3:<br>$(D^{346} + D^{86} + 1)X_1(D) + (D^{319} + D^{290} + 1)$<br>$X_2(D) + (D^{88} + D^{26} + 1)P(D) = 0$ |
| LDPC-CC of a time varying period of 3 and a coding rate of 3/4 | Check polynomial #1: $(D^{268} + D^{164} + 1)X_1(D) +$<br>$(D^{385} + D^{242} + 1)X_2(D) +$<br>$(D^{343} + D^{284} + 1)X_3(D) + (D^{92} + D^7 + 1)P(D) = 0$<br>Check polynomial #2: $(D^{370} + D^{317} + 1)X_1(D) +$<br>$(D^{125} + D^{103} + 1)X_2(D) +$<br>$(D^{259} + D^{14} + 1)X_3(D) + (D^{95} + D^{22} + 1)P(D) = 0$<br>Check polynomial #3: $(D^{346} + D^{86} + 1)X_1(D) +$<br>$(D^{319} + D^{290} + 1)X_2(D) +$<br>$(D^{145} + D^{11} + 1)X_3(D) + (D^{88} + D^{26} + 1)P(D) = 0$ |
| LDPC-CC of a time varying | Check polynomial #1:<br>$(D^{268} + D^{164} + 1)X_1(D) + (D^{385} + D^{242} + 1)X_2(D) +$<br>$(D^{343} + D^{284} + 1)X_3(D) + (D^{310} + D^{113} + 1)$ |

TABLE 6-continued

| Code | Parity check polynomial |
| --- | --- |
| period of 3 and a coding rate of 5/6 | $X_4(D) + (D^{92} + D^7 + 1)P(D) = 0$<br>Check polynomial #2:<br>$(D^{370} + D^{317} + 1)X_1(D) +$<br>$(D^{125} + D^{103} + 1)X_2(D) +$<br>$(D^{259} + D^{14} + 1)X_3(D) + (D^{394} + D^{188} + 1)$<br>$X_4(D) + (D^{95} + D^{22} + 1)P(D) = 0$<br>Check polynomial #3:<br>$(D^{346} + D^{86} + 1)X_1(D) +$<br>$(D^{319} + D^{290} + 1)X_2(D) +$<br>$(D^{145} + D^{11} + 1)X_3(D) + (D^{239} + D^{67} + 1)$<br>$X_4(D) + (D^{88} + D^{26} + 1)P(D) = 0$ |

A case has been described above where the maximum coding rate is $(q-1)/q$ among coding rates of enabling encoder circuits to be shared and enabling decoder circuits to be shared, and where an LDPC-CC parity check polynomial of a coding rate of $(r-1)/r$ ($r=2, 3, \ldots, q$ (q is a natural number equal to or greater than 3)) and a time varying period of g is provided.

Here, the method of generating an LDPC-CC parity check polynomial of a time varying period of g for reducing the computational complexity (i.e. circuit scale) in a transmitting apparatus and receiving apparatus, and features of parity check polynomials have been described, where the transmitting apparatus provides at least an LDPC-CC encoder of a coding rate of $(y-1)/y$ and a time varying period of g and an LDPC-CC encoder of a coding rate of $(z-1)/z$ ($y \neq z$) and a time varying period of g, and where the receiving apparatus provides at least an LDPC-CC decoder of a coding rate of $(y-1)/y$ and a time varying period of g and an LDPC-CC decoder of a coding rate of $(z-1)/z$ ($y \neq z$) and a time varying period of g.

Here, the transmitting apparatus refers to a transmitting apparatus that can generate at least one of a modulation signal for transmitting an LDPC-CC coding sequence of a coding rate of $(y-1)/y$ and a time varying period of g and an LDPC-CC coding sequence of a coding rate of $(z-1)/z$ and a time varying period of g.

Also, the receiving apparatus refers to a receiving apparatus that demodulates and decodes at least one of a received signal including an LDPC-CC coding sequence of a coding rate of $(y-1)/y$ and a time varying period of g and a received signal including an LDPC-CC coding sequence of a coding rate of $(z-1)/z$ and a time varying period of g.

By using an LDPC-CC of a time varying period of g proposed by the present invention, it is possible to provide an advantage of reducing the computational complexity (i.e. circuit scale) in a transmitting apparatus including encoders and in a receiving apparatus including decoders (i.e. it is possible to share circuits).

Further, by using an LDPC-CC of a time varying period of g proposed by the present invention, it is possible to provide an advantage of acquiring data of high received quality in the receiving apparatus in any coding rates. Also, the configurations of encoders and decoders, and their operations will be described later in detail.

Also, although a case has been described above where LDPC-CCs of a time varying period of g in coding rates of 1/2, 2/3, 3/4, . . . , and $(q-1)/q$ are provided in equations 30-1 to 30-$(q-1)$, a transmitting apparatus including encoders and a receiving apparatus including decoders need not support all of the coding rates of 1/2, 2/3, 3/4, . . . , and $(q-1)/q$. That is, as long as these apparatuses support at least two or more different coding rates, it is possible to provide an advantage of reducing the computational complexity (or circuit scale) in the transmitting apparatus and the receiving apparatus (i.e. sharing encoder circuits and decoder circuits), and acquiring data of high received quality in the receiving apparatus.

Also, if all of coding rates supported by the transmitting and receiving apparatuses (encoders/decoders) are associated with codes based on the methods described with the present embodiment, by providing encoders/decoders of the highest coding rate among the supported coding rates, it is possible to easily support coding and decoding in all coding rates and, at this time, provide an advantage of reducing the computational complexity significantly.

Also, although a case has been described above based on codes (i.e. LDPC-CCs of good characteristics), it is not necessary to satisfy the conditions described with the LDPC-CCs of good characteristics. That is, as long as LDPC-CCs of a time varying period of g are provided based on parity check polynomials in the form described with the LDPC-CCs of good characteristics, it is equally possible to implement the present embodiment (where g is an integer equal to or greater than 2). This is obvious from the relationships between equations 31-1 to 31-g and equations 32-1 to 32-g.

Naturally, for example, in a case where: the transmitting and receiving apparatuses (encoders/decoders) support coding rates of 1/2, 2/3, 3/4 and 5/6; LDPC-CCs based on the above conditions are used in coding rates of 1/2, 2/3 and 3/4; and codes not based on the above conditions are used in a coding rate of 5/6, it is possible to share circuits in the encoders and decoders in coding rates of 1/2, 2/3 and 3/4, and it is difficult to share circuits in these encoders and decoders to share circuits in a coding rate of 5/6.

Embodiment 2

Embodiment 2 will explain in detail the method of sharing encoder circuits of an LDPC-CC formed by the search method explained in Embodiment 1 and the method of sharing decoder circuits of that LDPC-CC.

First, in a case where the highest coding rate is $(q-1)/q$ among coding rates for sharing encoder circuits and decoder circuits, an LDPC-CC encoder of a time varying rate of g (where g is a natural number) supporting a plurality of coding rates, $(r-1)/r$, will be explained (e.g., when the coding rates supported by a transmitting and receiving apparatus are 1/2, 2/3, 3/4 and 5/6, coding rates of 1/2, 2/3 and 3/4 allow the circuits of encoders/decoders to be shared, while a coding rate of 5/6 does not allow the circuits of encoders/decoders to be shared, where the above highest coding rate, $(q-1)/q$, is 3/4).

Figure 11:
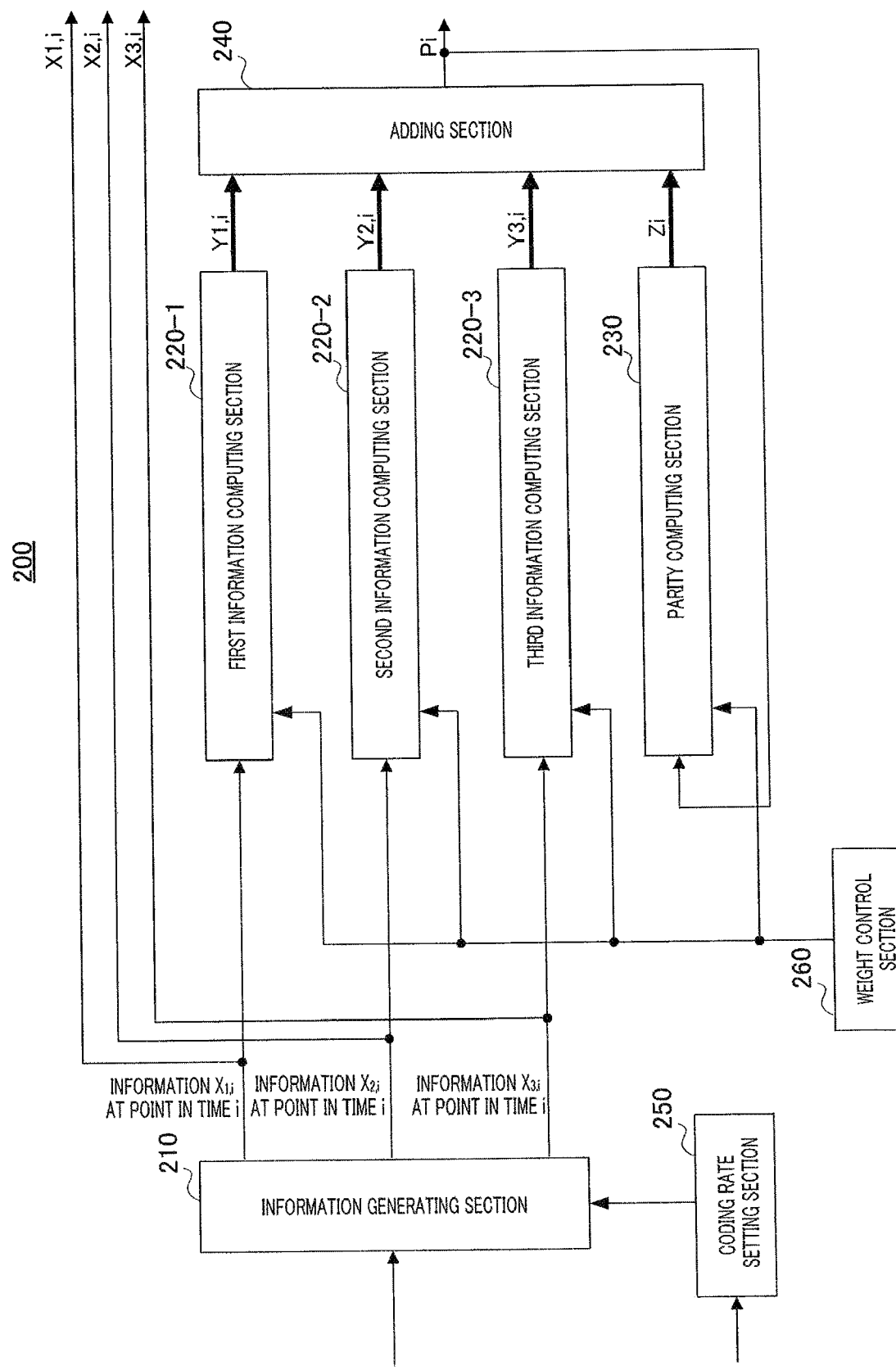
FIG. 11 is a block diagram showing the main configuration of an encoder according to Embodiment 2 of the present invention.

FIG. 11 is a block diagram showing an example of the main components of an encoder according to the present embodiment. Also, encoder 200 shown in FIG. 11 refers to an encoder that can support coding rates of 1/2, 2/3 and 3/4. Encoder 200 shown in FIG. 11 is mainly provided with information generating section 210, first information computing section 220-1, second information computing section 220-2, third information computing section 220-3, parity computing section 230, adding section 240, coding rate setting section 250 and weight control section 260.

Information generating section 210 sets information $X_{1,i}$, information $X_{2,i}$ and information $X_{3,i}$ at point in time i, according to a coding rate designated from coding rate setting section 250. For example, if coding rate setting section 250 sets the coding rate to 1/2, information generating section 210 sets information $X_{1,i}$ at point in time i to input information data $S_j$, and sets information $X_{2,i}$ and information $X_{3,i}$ at point in time i to "0."

Also, in the case of a coding rate of 2/3, information generating section 210 sets information $X_{1,i}$ at point in time i to input information data $S_j$, sets information $X_{2,i}$ at point in time i to input information data $S_{j+1}$ and sets information $X_{3,i}$ at point in time i to "0."

Also, in the case of a coding rate of 3/4, information generating section 210 sets information $X_{1,i}$ at point in time i to input information data $S_j$, sets information $X_{2,i}$ at point in time i to input information data $S_{j+1}$ and sets information $X_{3,i}$ at point in time i to input information data $S_{j+2}$.

In this way, using input information data, information generating section 210 sets information $X_{1,i}$, information $X_{2,i}$ and information $X_{3,i}$ at point in time i according to a coding rate set in coding rate setting section 250, outputs set information $X_{1,i}$ to first information computing section 220-1, outputs set information $X_{2,i}$ to second information computing section 220-2 and outputs set information $X_{3,i}$ to third information computing section 220-3.

First information computing section 220-1 calculates $X_1(D)$ according to $A_{X1,k}(D)$ of equation 30-1. Similarly, second information computing section 220-2 calculates $X_2(D)$ according to $A_{X2,k}(D)$ of equation 30-2. Similarly, third information computing section 220-3 calculates $X_3(D)$ according to $A_{X3,k}(D)$ of equation 30-3.

At this time, as described in Embodiment 1, from the conditions to satisfy in equations 31-1 to 31-g and 32-1 to 32-g, if the coding rate is changed, it is not necessary to change the configuration of first information computing section 220-1, and, similarly, change the configuration of second information computing section 220-2 and change the configuration of third information computing section 220-3.

Therefore, when a plurality of coding rates are supported, by using the configuration of the encoder of the highest coding rate as a reference among coding rates for sharing encoder circuits, the other coding rates can be supported by the above operations. That is, regardless of coding rates, LDPC-CCs explained in Embodiment 1 provide an advantage of sharing first information computing section 220-1, second information computing section 220-2 and third information computing section 220-3, which are main components of the encoder. Also, for example, the LDPC-CCs shown in table 5 provides an advantage of providing data of good received quality regardless of coding rates.

Figure 12:
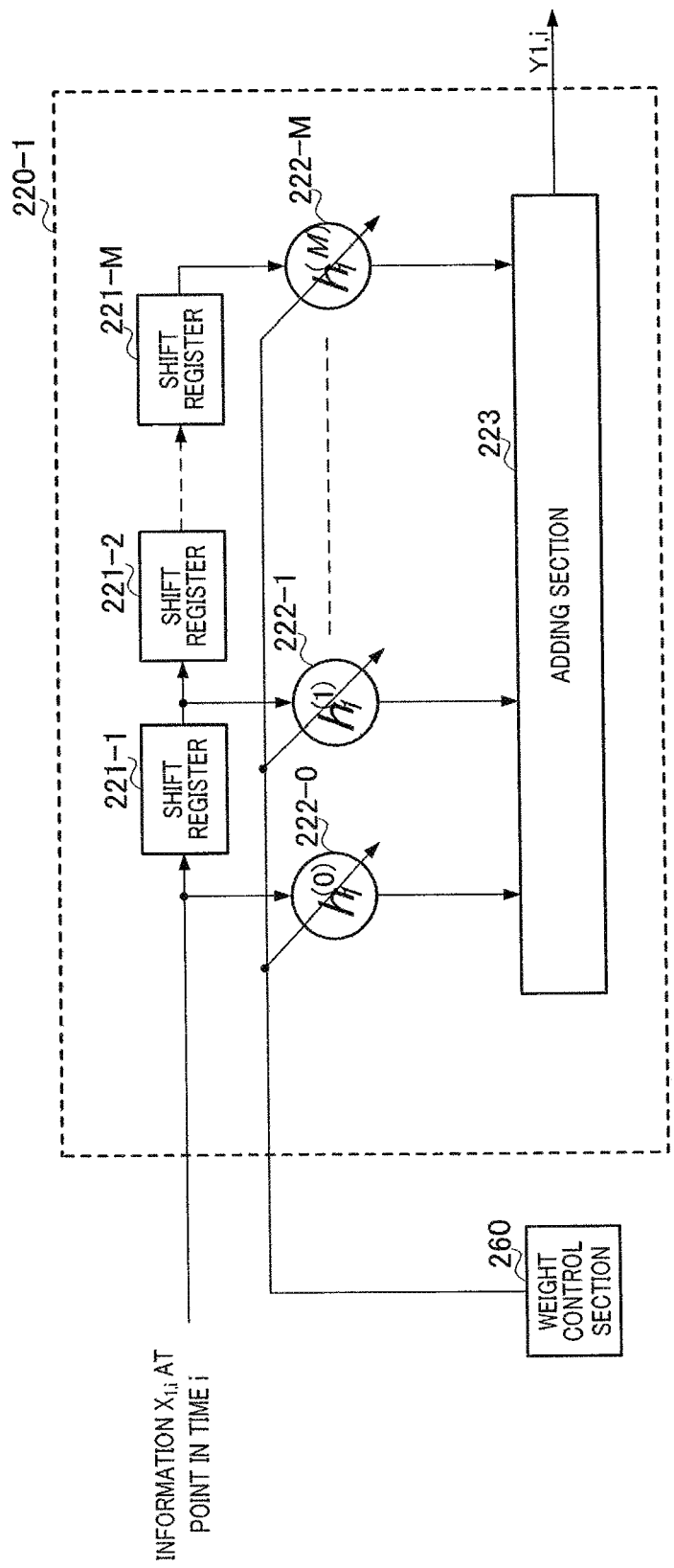
FIG. 12 is a block diagram showing the main configuration of a first information computing section according to Embodiment 2.

FIG. 12 shows the configuration inside first information computing section 220-1. First information computing section 220-1 in FIG. 12 is provided with shift registers 221-1 to 221-M, weight multipliers 220-0 to 222-M and adder 223.

Shift registers 222-1 to 222-M are registers each storing $X_{1,i-t}$ (where t=0, . . . , M), and, at a timing at which the next input comes in, send a stored value to the adjacent shift register to the right, and store a value sent from the adjacent shift register to the left.

Weight multipliers 220-0 to 222-M switch a value of $h_1^{(m)}$ to 0 or 1 in accordance with a control signal outputted from weight control section 260.

Adder 223 performs exclusive OR computation of outputs of weight multipliers 222-0 to 222-M to find and output computation result $Y_{1,i}$ to adder 240 in FIG. 11.

Also, the configurations inside second information computing section 220-2 and third information computing section 220-3 are the same as first information computing section 220-1, and therefore their explanation will be omitted. In the same way as in first information computing section 220-1, second information computing section 220-2 finds and outputs calculation result $Y_{2,i}$ to adder 240. In the same way as in first information computing section 220-1, third information computing section 220-3 finds and outputs calculation result $Y_{3,i}$ to adder 240 in FIG. 11.

Parity computing section 230 in FIG. 11 calculates P(D) according to $B_k(D)$ of equations 30-1 to 30-3.

Figure 13:
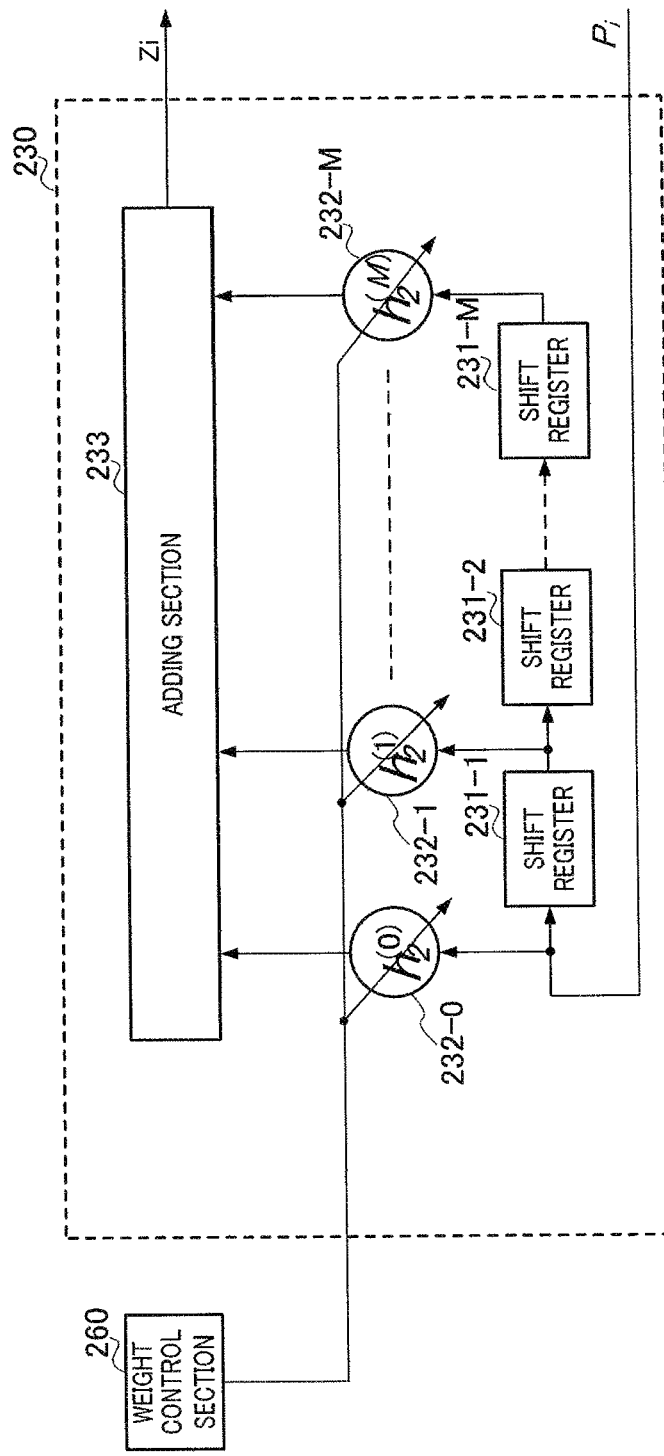
FIG. 13 is a block diagram showing the main configuration of a parity computing section according to Embodiment 2.

FIG. 13 shows the configuration inside parity computing section 230 in FIG. 11. Parity computing section 230 in FIG. 13 is provided with shift registers 231-1 to 231-M, weight multipliers 232-0 to 232-M and adder 233.

Shift registers 231-1 to 231-M are registers each storing $P_{i-t}$ (where t=0, . . . , M), and, at a timing at which the next input comes in, send a stored value to the adjacent shift register to the right, and store a value sent from the adjacent shift register to the left.

Weight multipliers 232-0 to 232-M switch a value of $h_2^{(m)}$ to 0 or 1 in accordance with a control signal outputted from weight control section 260.

Adder 233 performs exclusive OR computation of outputs of weight multipliers 232-0 to 232-M to find and output computation result $Z_i$ to adder 240 in FIG. 11.

Referring back to FIG. 11 again, adder 240 performs exclusive OR computation of computation results $Y_{1,i}$, $Y_{2,i}$, $Y_{3,i}$ and $Z_i$ outputted from first information computing section 220-1, second information computing section 220-2, third information computing section 220-3 and parity computing section 230, to find and output parity $P_i$ at point in time i. Adder 240 also outputs parity $P_i$ at point in time i to parity computing section 230.

Coding rate setting section 250 sets the coding rate of encoder 200 and outputs coding rate information to information generating section 210.

Based on a parity check matrix supporting equations 30-1 to 30-3 held in weight control section 260, weight control section 260 outputs the value of $h_1^{(m)}$ at point in time i based on the parity check polynomials of equations 30-1 to 30-3, to first information computing section 220-1, second information computing section 220-2, third information computing section 220-3 and parity computing section 230. Also, based on the parity check matrix supporting equations 30-1 to 30-3 held in weight control section 260, weight control section 260 outputs the value of $h_2^{(m)}$ at that timing to weight multipliers 232-0 to 232-M.

Figure 14:
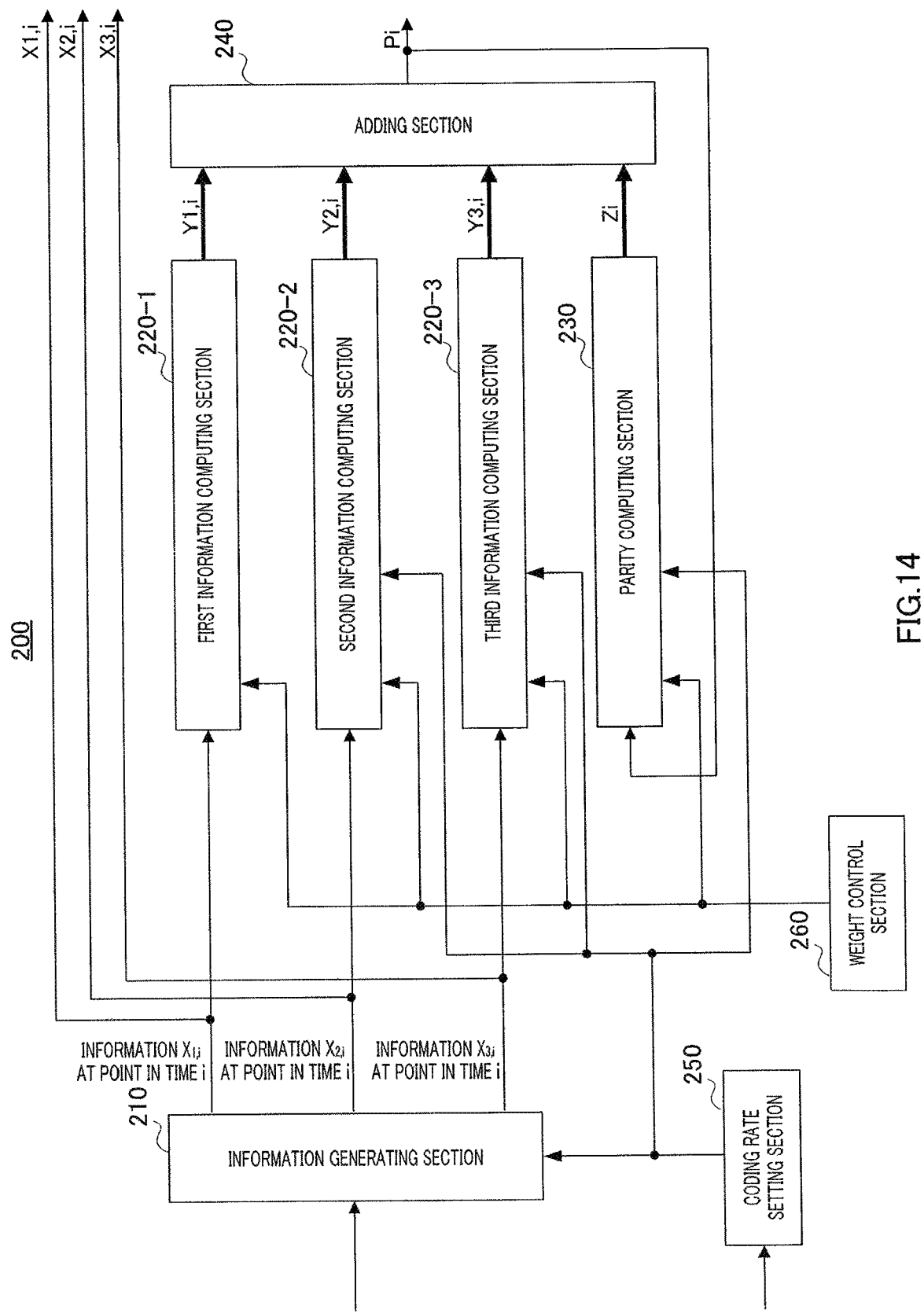
FIG. 14 is a block diagram showing another main configuration of an encoder according to Embodiment 2.

Also, FIG. 14 shows another configuration of an encoder according to the present embodiment. In the encoder of FIG. 14, the same components as in the encoder of FIG. 11 are assigned the same reference numerals. Encoder 200 of FIG. 14 differs from encoder 200 of FIG. 11 in that coding rate setting section 250 outputs coding rate information to first information computing section 220-1, second information computing section 220-2, third information computing section 220-3 and parity computing section 230.

In the case where the coding rate is 1/2, second information computing section 220-2 outputs "0" to adder 240 as computation result $Y_{2,i}$, without computation processing. Also, in the case where the coding rate is 1/2 or 2/3, third information computing section 220-3 outputs "0" to adder 240 as computation result $Y_{3,i}$, without computation processing.

Here, although information generating section 210 of encoder 200 in FIG. 11 sets information $X_{2,i}$ and information $X_{3,i}$ at point in time i to "0" according to a coding rate, second information computing section 220-2 and third information computing section 220-3 of encoder 200 in FIG. 14 stop computation processing according to a coding rate and output 0 as computation results $Y_{2,i}$ and $Y_{3,i}$. Therefore, the resulting computation results in encoder 200 of FIG. 14 are the same as in encoder 200 of FIG. 11.

Thus, in encoder 200 of FIG. 14, second information computing section 220-2 and third information computing section 220-3 stops computation processing according to a coding rate, so that it is possible to reduce computation processing, compared to encoder 200 of FIG. 11.

Next, the method of sharing LDPC-CC decoder circuits described in Embodiment 1 will be explained in detail.

Figure 15:
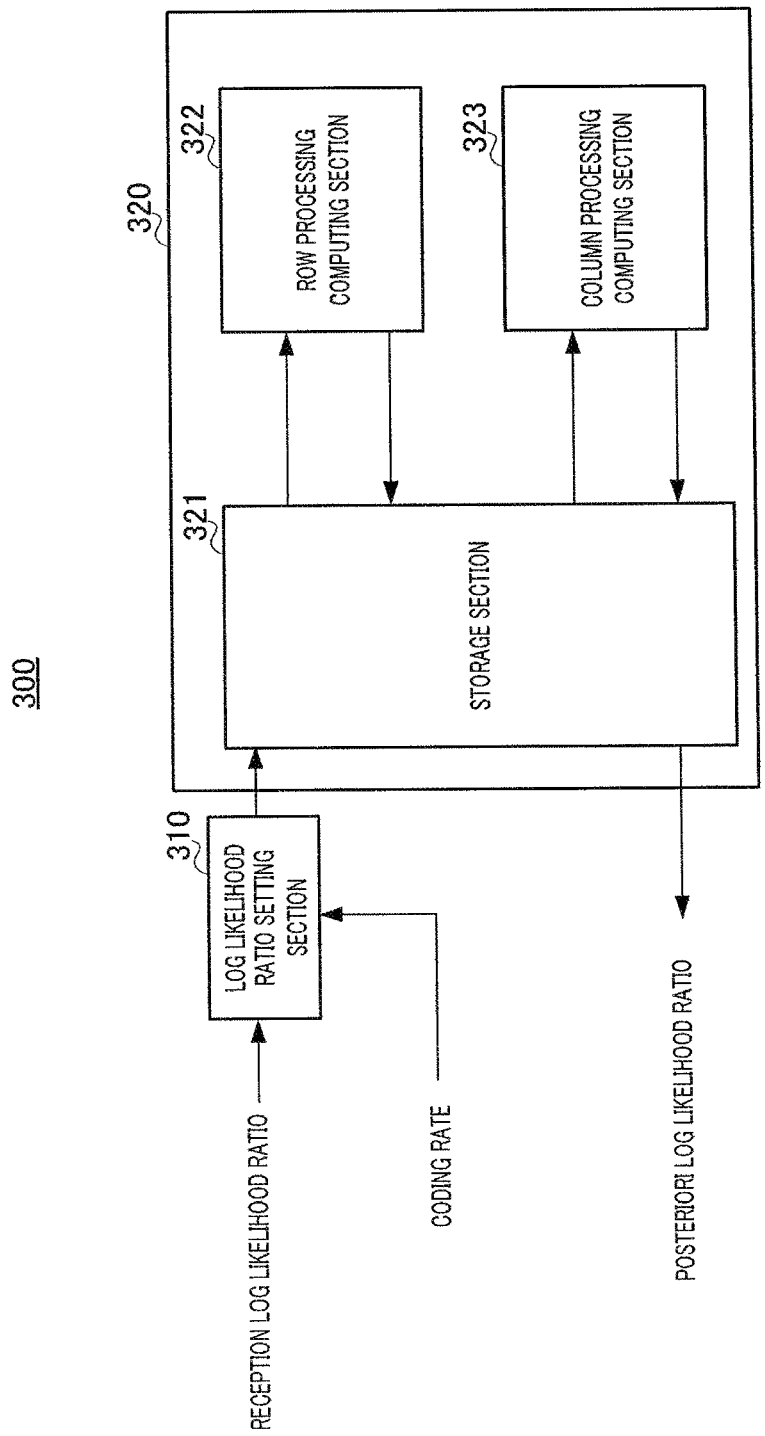
FIG. 15 is a block diagram showing the main configuration of a decoder according to Embodiment 2.

FIG. 15 is a block diagram showing the main components of a decoder according to the present embodiment. Here, decoder 300 shown in FIG. 15 refers to a decoder that can support coding rates of 1/2, 2/3 and 3/4. Decoder 300 of FIG. 14 is mainly provided with log likelihood ratio setting section 310 and matrix processing computing section 320.

Log likelihood ratio setting section 310 receives as input a reception log likelihood ratio and coding rate calculated in a log likelihood ratio computing section (not shown), and inserts a known log likelihood ratio in the reception log likelihood ratio according to the coding rate.

For example, when the coding rate is 1/2, it means that encoder 200 transmits "0" as $X_{2,i}$ and $X_{3,i}$, and, consequently, log likelihood ratio setting section 310 inserts a fixed log likelihood ratio for the known bit "0" as the log likelihood ratios of $X_{2,i}$ and $X_{3,i}$, and outputs the inserted log likelihood ratios to matrix processing computing section 320. This will be explained below using FIG. 16.

Figure 16:
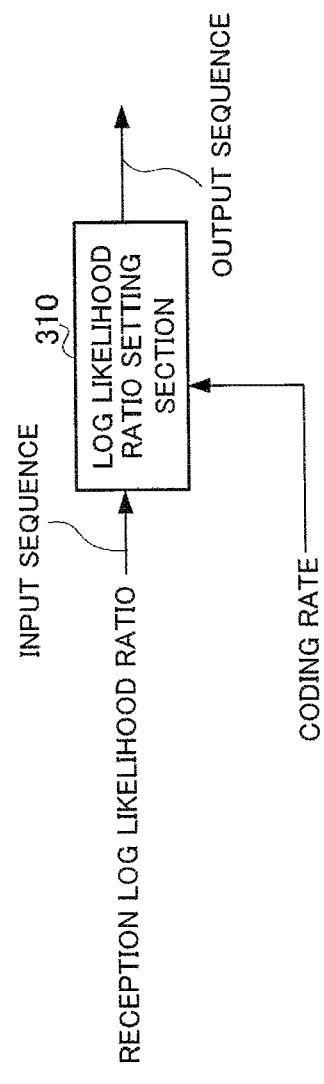
FIG. 16 illustrates operations of a log likelihood ratio setting section in a case of a coding rate of 1/2.

As shown in FIG. 16, when the coding rate is 1/2, log likelihood ratio setting section 310 receives reception log likelihood ratios $LLR_{X1,i}$ and $LLR_{Pi}$ corresponding to $X_{1,i}$ and $P_i$, respectively. Therefore, log likelihood ratio setting section 310 inserts reception log likelihood ratios $LLR_{X2,i}$ and $LLR_{3,i}$ corresponding to $X_{2,i}$ and $X_{3,i}$, respectively. In FIG. 16, reception log likelihood ratios circled by doted lines represent reception log likelihood ratios $LLR_{X2,i}$ and $LLR_{3,i}$ inserted by log likelihood ratio setting section 310. Log likelihood ratio setting section 310 inserts fixed-value log likelihood ratios as reception log likelihood ratios $LLR_{X2,i}$ and $LLR_{3,i}$.

Also, in the case where the coding rate is 2/3, it means that encoder 200 transmits "0" as $X_{3,i}$, and, consequently, log likelihood ratio setting section 310 inserts a fixed log likelihood ratio for the known bit "0" as the log likelihood ratio of $X_{3,i}$, and outputs the inserted log likelihood ratio to matrix processing computing section 320. This will be explained using FIG. 17.

Figure 17:
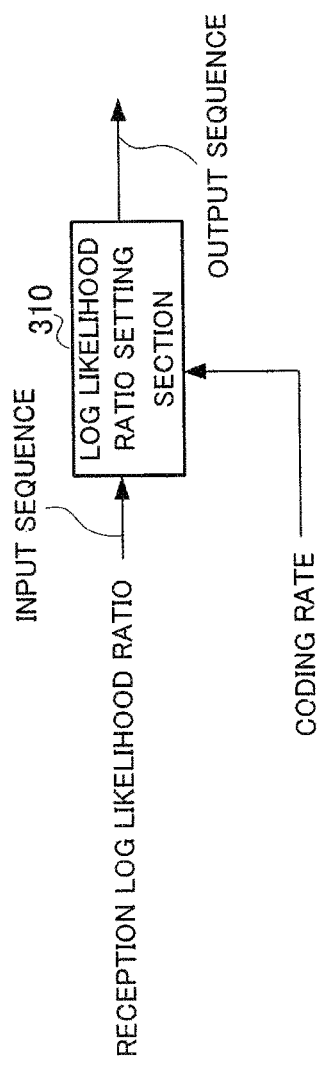
FIG. 17 illustrates operations of a log likelihood ratio setting section in a case of a coding rate of 2/3.

As shown in FIG. 17, in the case where the coding rate is 2/3, log likelihood ratio setting section 310 receives as input reception log likelihood ratios $LLR_{X1}$, $LLR_{X2,i}$ and $LLR_{Pi}$ corresponding to $X_{1,i}$, $X_{2,i}$ and $P_i$, respectively. Therefore, log likelihood ratio setting section 310 inserts reception log likelihood ratio $LLR_{3,i}$ corresponding to $X_{3,i}$. In FIG. 17, reception log likelihood ratios circled by doted lines represent reception log likelihood ratio $LLR_{3,i}$ inserted by log likelihood ratio setting section 310. Log likelihood ratio setting section 310 inserts fixed-value log likelihood ratios as reception log likelihood ratio $LLR_{3,i}$.

Matrix processing computing section 320 in FIG. 15 is provided with storage section 321, row processing computing section 322 and column processing computing section 323.

Storage section 321 stores an log likelihood ratio, external value $\alpha_{mn}$ obtained by row processing and a priori value $\beta_{mn}$ obtained by column processing.

Row processing computing section 322 holds the row-direction weight pattern of LDPC-CC parity check matrix H of the maximum coding rate of 3/4 among coding rates supported by encoder 200. Row processing computing section 322 reads a necessary priori value $\beta_{mn}$ from storage section 321, according to that row-direction weight pattern, and performs row processing computation.

In row processing computation, row processing computation section 322 decodes a single parity check code using a priori value $\beta_{mn}$, and finds external value $\alpha_{mn}$.

Processing of the m-th row will be explained. Here, an LDPC code parity check matrix to decode two-dimensional M×N matrix H={$H_{nm}$} will be used. External value $\alpha_{mn}$ is updated using the following update equation for all pairs (m,n) satisfying the equation $H_{mn}=1$.

[39]

$$\alpha_{mn} = \left(\prod_{n' \in A(m)\backslash n} \text{sign}(\beta_{mn'})\right) \Phi\left(\sum_{n' \in A(m)\backslash n} \Phi(|\beta_{mn'}|)\right) \quad \text{(Equation 39)}$$

where $\Phi(x)$ is called a Gallager f function, and is defined by the following equation.

[40]

$$\Phi(x) = \ln\frac{\exp(x)+1}{\exp(x)-1} \quad \text{(Equation 40)}$$

Column processing computing section 323 holds the column-direction weight pattern of LDPC-CC parity check matrix H of the maximum coding rate of 3/4 among coding rates supported by encoder 200. Column processing computing section 323 reads a necessary external value $\alpha_{mn}$ from storage section 321, according to that column-direction weight pattern, and finds a priori value $\beta_{mn}$.

In column processing computation, column processing computing section 323 performs iterative decoding using input log likelihood ratio $\lambda_n$ and external value $\alpha_{mn}$, and finds a priori value $\beta_{mn}$.

Processing of the m-th column will be explained. $\beta_{mn}$ is updated using the following update equation for all pairs (m,n) satisfying the equation $H_{mn}=1$. Only when q=1, the calculation is performed with $\alpha_{mn}=0$.

[41]

$$\beta_{mn} = \lambda_n + \sum_{m' \in B(n)/m} \alpha_{m'n} \quad \text{(Equation 41)}$$

After repeating above row processing and column processing a predetermined number of times, decoder 300 finds an a posteriori log likelihood ratio.

As described above, with the present embodiment, in a case where the highest coding rate is (q−1)/q among supported coding rates and where coding rate setting section 250 sets the coding rate to (s−1)/s, information generating section 310 sets from information $X_{s,i}$ to information $X_{q-1,i}$ as "0." For example, when supported coding rates are 1/2, 2/3 and 3/4 (q=4), first information computing section 220-1 receives as input information $X_{1,i}$ at point in time i and calculates term $X_1(D)$ of equation 30-1. Also, second information computing section 220-2 receives as input information $X_{2,i}$ at point in time i and calculates term $X_2(D)$ of equation 30-2. Also, third information computing section 220-3 receives as input information $X_{3,i}$ at point in time i and calculates term $X_3(D)$ of equation 30-3. Also, parity computing section 230 receives as input parity $P_{i-1}$ at point in time i−1 and calculates term P(D) of equations 30-1 to 30-3. Also, adder 240 finds, as parity $P_i$ at point in time i, the exclusive OR of the computation results of first information computing section 220-1, second information computing section 220-2 and third information computing section 220-3 and the computation result of parity computing section 230.

With this configuration, upon creating an LDPC-CC supporting different coding rates, it is possible to share the configurations of information computing sections according to the above explanation, so that it is possible to provide an LDPC-CC encoder and decoder that can support a plurality of coding rates in a small computational complexity.

Also, in a case where $A_{X1,k}(D)$ to $A_{Xq-1,k}(D)$ are set to satisfy the above <Condition #1> to <Condition #6> described with the above LDPC-CCs of good characteristics, it is possible to provide an encoder and decoder that can support different coding rates in a small computational complexity and provide data of good received quality in the receiver. Here, as described in Embodiment 1, the method of generating an LDPC-CC is not limited to the above case of LDPC-CCs of good characteristics.

Also, by adding log likelihood ratio setting section 310 to the decoder configuration based on the maximum coding rate among coding rates for sharing decoder circuits, decoder 300 in FIG. 15 can perform decoding in accordance with a plurality of coding rates. Also, according to a coding rate, log likelihood ratio setting section 310 sets log likelihood ratios for (q−2) items of information from information $X_{r,i}$ to information $X_{q-1,i}$ at point in time i, to predetermined values.

Also, although a case has been described above where the maximum coding rate supported by encoder 200 is 3/4, the supported maximum coding rate is not limited to this, and is equally applicable to a case where a coding rate of (q−1)/q (where q is an integer equal to or greater than 5) is supported (here, it naturally follows that it is possible to set the maximum coding rate to 2/3). In this case, essential requirements are that encoder 200 employs a configuration including first to (q−1)-th information computing sections, and that adder 240 finds, as parity $P_i$ at point in time i, the exclusive OR of the computation results of first to (q−1)-th information computing sections and the computation result of parity computing section 230.

Also, if all of coding rates supported by the transmitting and receiving apparatuses (encoder/decoder) are associated with codes based on the methods described with the present embodiment, by providing an encoder/decoder of the highest coding rate among the supported coding rates, it is possible to easily support coding and decoding in a plurality of coding rates and, at this time, provide an advantage of reducing computational complexity significantly.

Also, although an example case has been described above where the decoding scheme is sum-product decoding, the decoding method is not limited to this, and it is equally possible to implement the present invention using decoding methods by a message-passing algorithm such as min-sum decoding, normalized BP (Belief Propagation) decoding, shuffled BP decoding and offset BP decoding, as shown in Non-Patent Literature 5, Non-Patent Literature 6 and Non-Patent Literature 9.

Next, a case will be explained where the present invention is applied to a communication apparatus that adaptively switches the coding rate according to the communication condition. Also, an example case will be explained where the present invention is applied to a radio communication apparatus, the present invention is not limited to this, but is equally applicable to a PLC (Power Line Communication) apparatus, a visible light communication apparatus or an optical communication apparatus.

Figure 18:
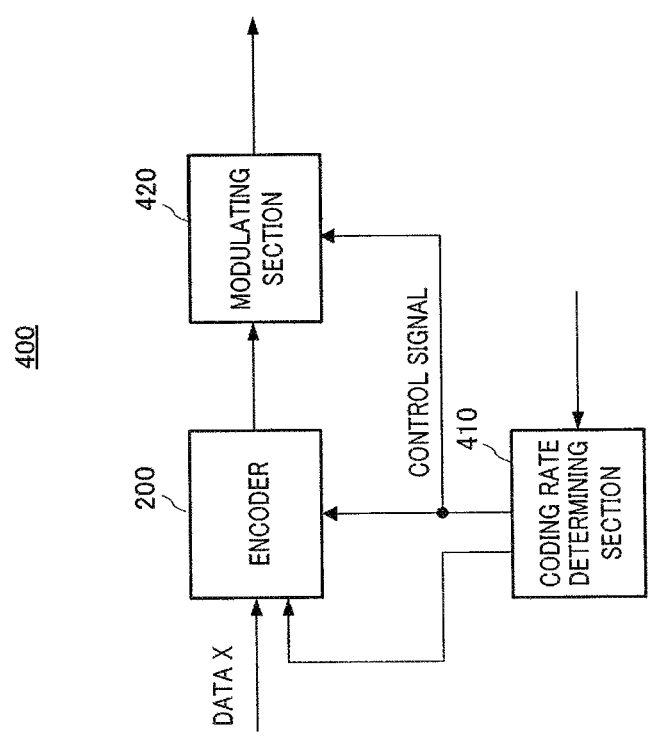
FIG. 18 shows an example of the configuration of a transmitting apparatus having an encoder according to Embodiment 2.

FIG. 18 shows the configuration of communication apparatus 400 that adaptively switches a coding rate. Coding rate determining section 410 of communication apparatus 400 in FIG. 18 receives as input a received signal transmitted from a communication apparatus of the communicating party (e.g. feedback information transmitted from the communicating party), and performs reception processing of the received signal. Further, coding rate determining section 410 acquires information of the communication condition with the communication apparatus of the communicating party, such as a bit error rate, packet error rate, frame error rate and reception field intensity (from feedback information, for example), and determines a coding rate and modulation scheme from the information of the communication condition with the communication apparatus of the communicating party. Further, coding rate determining section 410 outputs the determined coding rate and modulation scheme to encoder 200 and modulating section 420 as a control signal.

Figure 19:
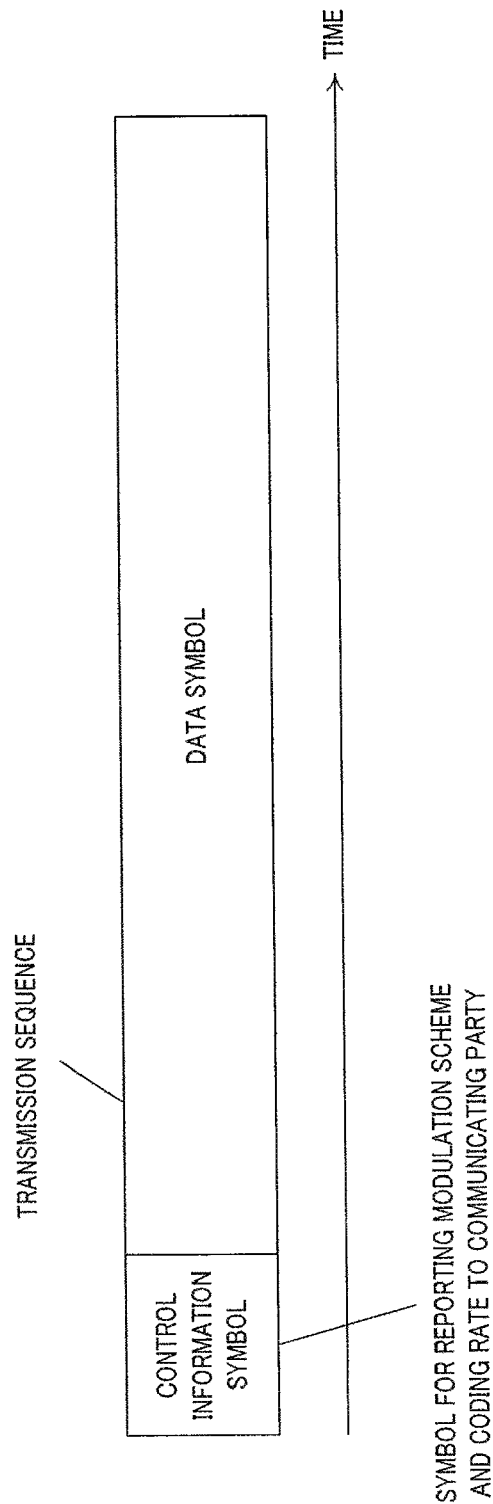
FIG. 19 shows an example of a transmission format.

Using, for example, the transmission format shown in FIG. 19, coding rate determining section 410 includes coding rate information in control information symbols and reports the coding rate used in encoder 200 to the communication apparatus of the communicating party. Here, as is not shown in FIG. 19, the communicating party includes, for example, known signals (such as a preamble, pilot symbol and reference symbol), which are necessary in demodulation or channel estimation.

In this way, coding rate determining section 410 receives a modulation signal transmitted from communication apparatus 500 of the communicating party, and, by determining the coding rate of a transmitted modulation signal based on the communication condition, switches the coding rate adaptively. Encoder 200 performs LDPC-CC coding in the above steps, based on the coding rate designated by the control signal. Modulating section 420 modulates the encoded sequence using the modulation scheme designated by the control signal.

Figure 20:
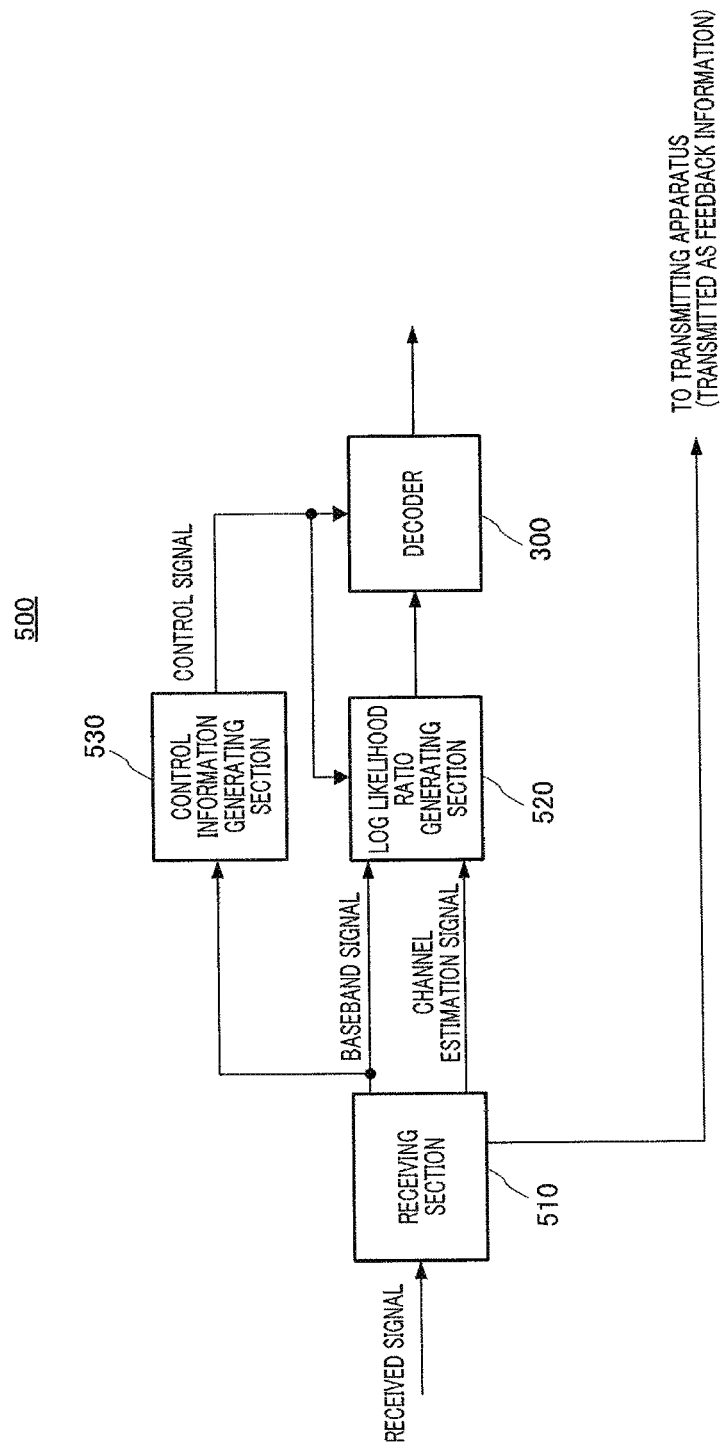
FIG. 20 shows an example of the configuration of a receiving apparatus having a decoder according to Embodiment 2.

FIG. 20 shows a configuration example of a communication apparatus of the communicating party that communicates with communication apparatus 400. Control information generating section 530 of communication apparatus 500 in FIG. 20 extracts control information from a control information symbol included in a baseband signal. The control information symbol includes coding rate information. Control information generating section 530 outputs the extracted coding rate information to log likelihood ratio generating section 520 and decoder 300 as a control signal.

Receiving section 510 acquires a baseband signal by applying processing such as frequency conversion and quadrature demodulation to a received signal for a modulation signal transmitted from communication apparatus 400, and outputs the baseband signal to log likelihood ratio generating section 520. Also, using known signals included in the baseband signal, receiving section 510 estimates channel variation in a channel (e.g. ratio channel) between communication apparatus 400 and communication apparatus 500, and outputs an estimated channel estimation signal to log likelihood ratio generating section 520.

Also, using known signals included in the baseband signal, receiving section 510 estimates channel variation in a channel (e.g. ratio channel) between communication apparatus 400 and communication apparatus 500, and generates and outputs feedback information (such as channel variation itself, which refers to channel state information, for example) for deciding the channel condition. This feedback information is transmitted to the communicating party (i.e. communication apparatus 400) via a transmitting apparatus (not shown), as part of control information. Log likelihood ratio generating section 520 calculates the log likelihood ratio of each transmission sequence using the baseband signal, and outputs the resulting log likelihood ratios to decoder 300.

As described above, according to the coding rate (s−1)/s designated by a control signal, decoder 300 sets the log likelihood ratios for information from information $X_{s,i}$ to information $X_{s-1,i}$, to predetermined values, and performs BP decoding using the LDPC-CC parity check matrix based on the maximum coding rate among coding rates to share decoder circuits.

In this way, the coding rates of communication apparatus 400 and communication apparatus 500 of the communicating party to which the present invention is applied, are adaptively changed according to the communication condition.

Here, the method of changing the coding rate is not limited to the above, and communication apparatus 500 of the communicating party can include coding rate determining section 410 and designate a desired coding rate. Also, communication apparatus 400 can estimate channel variation from a modulation signal transmitted from communication apparatus 500 and determine the coding rate. In this case, the above feedback information is not necessary.

Embodiment 3

The present embodiment will explain a hybrid ARQ (Automatic Repeat reQuest) in an LDPC-CC code formed by the search method explained in Embodiment 1.

Figure 21:
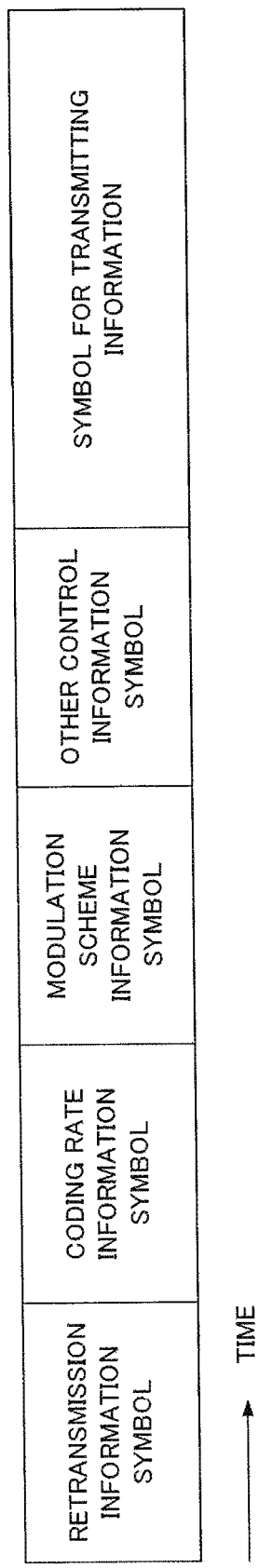
FIG. 21 shows an example of the frame configuration of a modulation signal transmitted by communication apparatus #1 that performs hybrid ARQ according to Embodiment 3 of the present invention.

FIG. 21 shows an example of the frame configuration of a modulation signal transmitted from communication apparatus #1 (e.g. base station apparatus) that performs HARQ. In the frame configuration of FIG. 21, the retransmission information symbol refers to a symbol for reporting information as to whether retransmission data or new data is provided, to the communicating party (e.g. terminal apparatus). The coding rate information symbol refers to a symbol for reporting the cording rate to the communicating party. The modulation scheme information symbol refers to a symbol for transmitting the modulation scheme to the communicating party.

The other control information symbols refer to symbols for reporting control information such as the data length, for example. Also, symbols for transmitting information (hereinafter "data symbols") refer to symbols for transmitting encoded data (codeword) (e.g. information and parity) acquired by applying LDPC-CC coding to data (information). The data symbols include data for detecting frame error such as CRC (Cyclic Redundancy Check).

Figure 22:
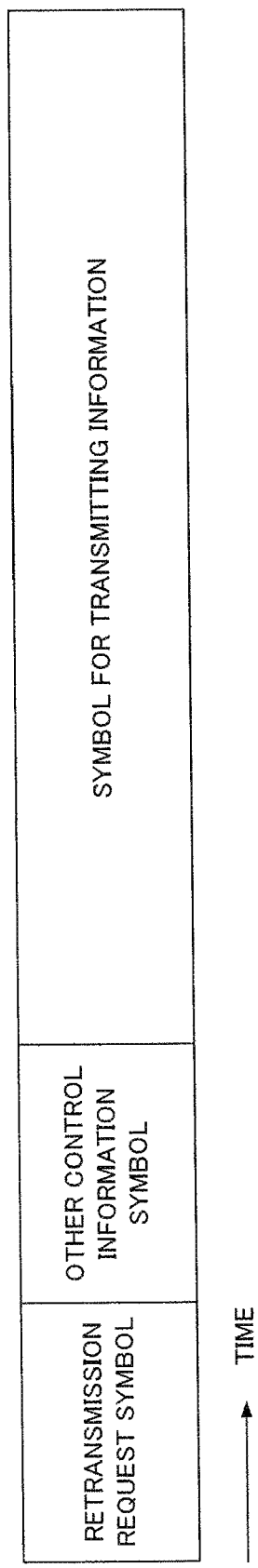
FIG. 22 shows an example of the frame configuration of a modulation signal transmitted by communication apparatus #2, which is the communicating party of communication apparatus #1, according to Embodiment 3.

FIG. 22 shows an example of the frame configuration of a modulation signal transmitted by communication apparatus #2 (e.g. terminal apparatus) that is the communicating party of communication apparatus #1. In the frame configuration of FIG. 22, the retransmission request symbol refers to a symbol indicating whether or not there is a retransmission request. Communication apparatus #2 checks whether or not error occurs in decoded data, and requests a retransmission when there is error, or does not request a retransmission when there is no error. The retransmission request symbol refers to a symbol for reporting whether or not there is the retransmission request.

The other control information symbols refer to symbols for transmitting control information such as the modulation scheme, used code, coding rate and data length, to communication apparatus #1 of the communicating party, for example. The symbol for transmitting information refers to a symbol for transmitting data (information) to transmit to communication apparatus #1 of the communicating party.

Figure 23:
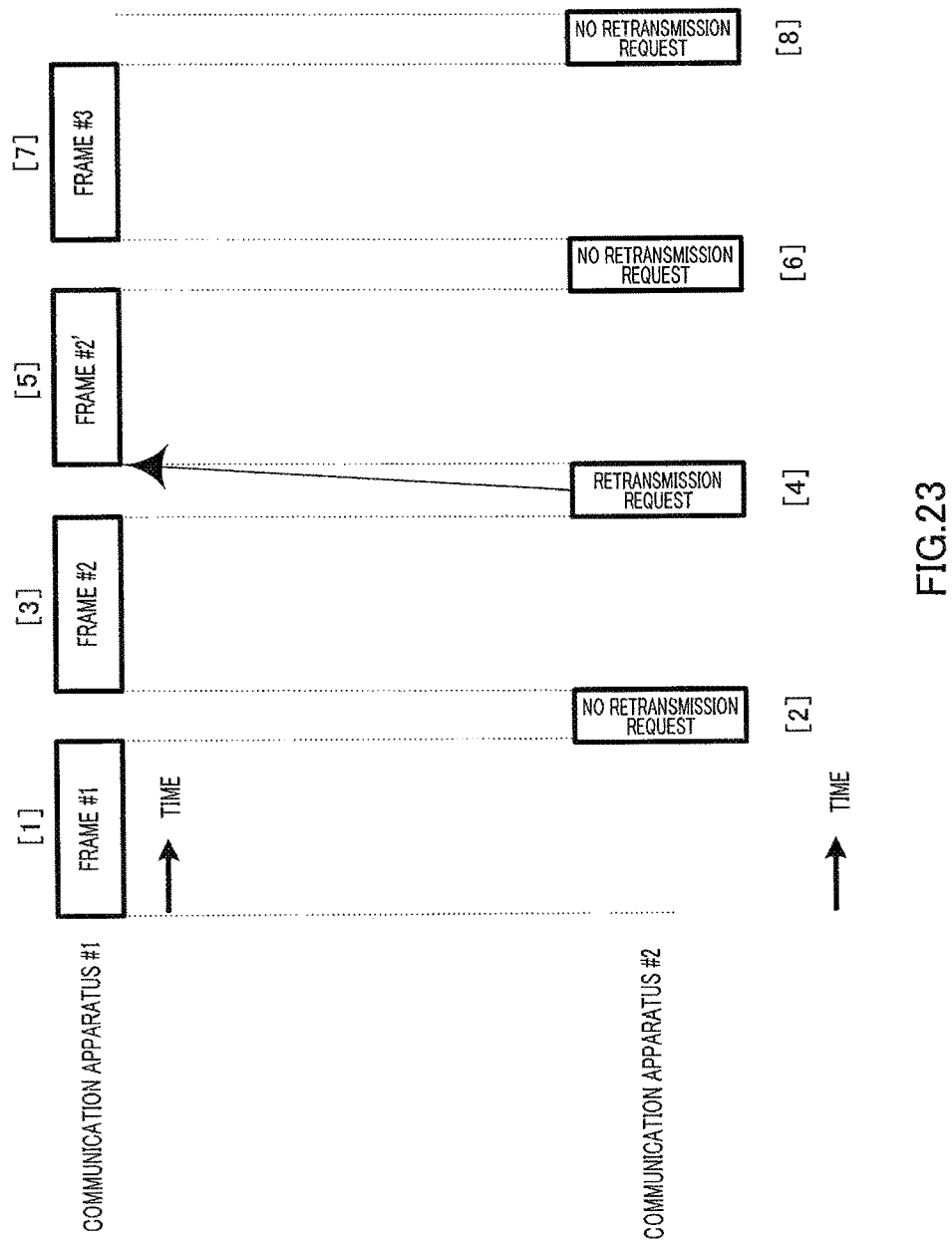
FIG. 23 shows an example of the flow of frames transmitted between communication apparatus #1 and communication apparatus #2, according to Embodiment 3.

FIG. 23 shows an example of the flow of frames transmitted between communication apparatus #1 and communication apparatus #2 according to the present embodiment, referring to HARQ. Also, an example case will be explained below where communication apparatus #1 and communication apparatus #2 support coding rates of 1/2, 2/3 and 3/4.

In FIG. 23, first, communication apparatus #1 transmits a modulation signal of frame #1. At that time, data transmitted by the data symbol area of frame #1 represents a codeword acquired by applying coding of a coding rate of 3/4 to new data.

In FIG. 23, communication apparatus #2 receives, demodulates, decodes and performs a CRC check of the modulation signal of frame #1. As a result of this, there is no error, and therefore a retransmission is not requested to communication apparatus #1.

In FIG. 23, communication apparatus #1 transmits a modulation signal of frame #2. Here, data transmitted by the data symbol area of frame #2 represents a codeword acquired by applying coding of a coding rate of 3/4 to new data.

In FIG. 23, communication apparatus #2 receives, demodulates, decodes and performs a CRC check of the modulation signal of frame #2. As a result of this, there is an error, and therefore a retransmission is requested to communication apparatus #1.

In FIG. 23, communication apparatus #1 receives a retransmission request from communication apparatus #2, and therefore transmits frame #2' for frame #2. To be more specific, communication apparatus #1 encodes part of data (information) using a coding rate of 2/3 lower than a coding rate of 3/4 used upon acquiring a codeword transmitted by frame #2, and transmits only parity of the resulting codeword by frame #2'.

Here, data transmitted by frame #2 and data transmitted by frame #2' will be explained using FIG. 24.

Upon the initial transmission, with frame #2, information $X_{1,i}$, $X_{2,i}$ and $X_{3,i}$ (where i=1, 2, . . . , m) and parity $P_{3/4,i}$ (where i=1, 2, . . . , m) acquired by applying LDPC-CC coding of a coding rate of 3/4 to information $X_{1,i}$, $X_{2,i}$ and $X_{3,i}$, are transmitted.

When a retransmission request of frame #2 is requested from communication apparatus #2 to communication apparatus #1, communication apparatus #1 generates parity $P_{2/3,i}$ (where i=1, 2, . . . , m) by using a coding rate of 2/3 lower than a coding rate of 3/4 used upon the initial transmission and encoding $X_{1,i}$ and $X_{2,i}$ (where i=1, 2, . . . , m) among information $X_{1,i}$, $X_{2,i}$ and $X_{3,i}$ (where i=1, 2, . . . , m) transmitted by frame #2.

Also, with frame #2', only this parity $P_{2/3,i}$ (where i=1, 2, m) is transmitted.

At this time, especially when an encoder of communication apparatus #1 is configured in the same way as in Embodiment 2, it is possible to perform both coding of a coding rate of 3/4 upon the initial transmission and coding of a coding rate of 2/3 upon a retransmission, using the same encoder. That is, even in the case of performing a retransmission by HARQ, it is possible to perform coding upon a retransmission using an encoder to use when performing coding upon the initial transmission, without adding a new encoder for HARQ.

Thus, upon performing HARQ, if an encoder supports a plurality of coding rates and parity check polynomials for these plurality of coding rates represent the LDPC-CCs described in Embodiment 1, it is possible to use the same encoder as the one to use when performing coding upon the initial transmission.

In FIG. 23, communication apparatus #2 receives, demodulates, decodes and performs a CRC check of a modulation signal of frame #2' transmitted upon a retransmission.

Figure 25:
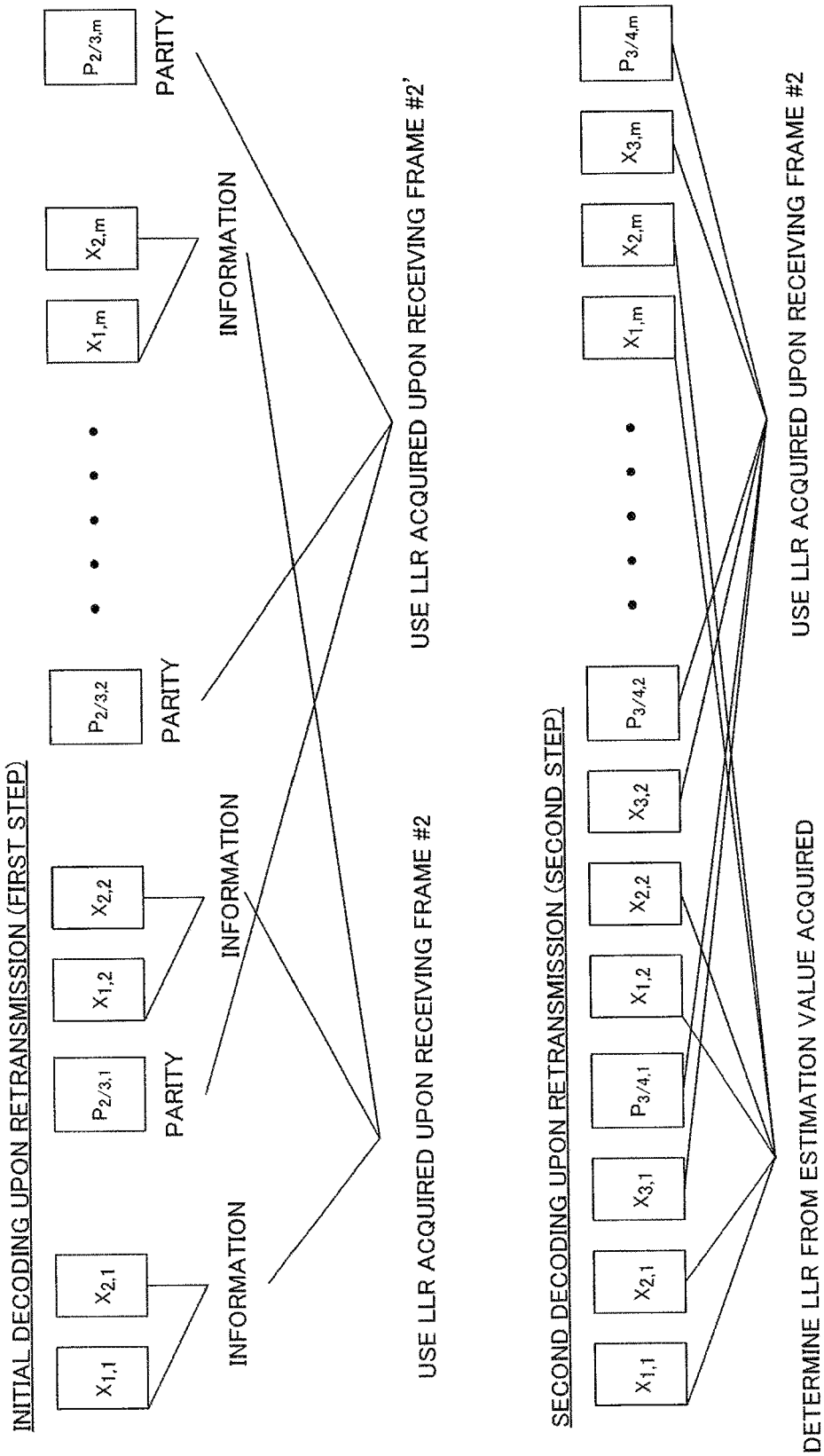
FIG. 25 illustrates a decoding method upon a retransmission.

The operations in FIG. 23 (the method of decoding data upon a retransmission) will be explained using FIG. 25. Upon a retransmission, frame #2' is decoded using a decoding result of frame #2 received earlier.

To be more specific, first, as the initial decoding upon a retransmission (first step), information $X_{1,i}$ and information $X_{2,i}$ (where i=1, 2, . . . , m) are decoded (i.e. LDPC-CC decoding processing of a coding rate of 2/3 is performed), using the LLRs (Log Likelihood Ratios) of information $X_{1,i}$ and $X_{2,i}$ (where i=1, 2, . . . , m) received earlier by frame #2 and the LLR of parity $P_{2/3,i}$ (where i=1, 2, . . . , m) of a coding rate of 2/3 received by frame #2'.

In frame #2', the coding rate is lower than frame #2, so that it is possible to improve the coding gain, increase a possibility of being able to decode information $X_{1,i}$ and $X_{2,i}$ (where i=1, 2, . . . , m), and secure the received quality upon a retransmission. Here, only parity data is retransmitted, so that the efficiency of data transmission is high.

Next, as second decoding upon a retransmission (second step): the estimation values of information $X_{1,i}$ and $X_{2,i}$ (where i=1, 2, . . . , m) are acquired in the first step and therefore are used to generate the LLRs of information $X_{1,i}$ and $X_{2,i}$ (e.g. an LLR corresponding to "0" of sufficiently high reliability is given when "0" is estimated, or an LLR corresponding to "1" of sufficiently high reliability is given when "1" is estimated); and information $X_{3,i}$ (where i=1, 2, . . . , m) is acquired by performing LDPC-CC decoding of a coding rate of 3/4 using the generated LLRs, the LLR of information $X_{3,i}$ (where i=1, 2, . . . , m) received earlier by frame #2 and the LLR of parity $P_{3/4,i}$ (where i=1, 2, . . . , m) received earlier by frame #2.

In this way, communication apparatus #2 decodes frame #2 transmitted upon the initial transmission, using frame #2' retransmitted by HARQ. At this time, especially when a decoder of communication apparatus #2 is configured in the same way as in Embodiment 2, it is possible to perform both coding upon the initial transmission and decoding upon a retransmission (i.e. decoding in the first and second steps), using the same decoder.

That is, even in the case of performing a retransmission by HARQ, it is possible to perform decoding upon a retransmission (i.e. decoding in the first and second steps) using a decoder used when performing decoding upon the initial transmission, without adding a new decoder for HARQ.

Thus, upon performing HARQ, if an encoder of communication apparatus #1 of the communicating party supports a plurality of coding rates and parity check polynomials for these plurality of coding rates represent the LDPC-CCs described in Embodiment 1, it is possible to use the same decoder as the one to use when performing decoding upon the initial transmission.

In this way, communication apparatus #2 receives, demodulates, decodes and performs a CRC check of a modulation signal of frame #2'. As a result of this, there is no error, and therefore a retransmission is not requested to communication apparatus #2.

In FIG. 23, communication apparatus #1 transmits a modulation signal of frame #3. At this time, data transmitted by the data symbol area of frame #3 represents a codeword acquired by applying coding of a coding rate of 3/4 to new data.

In FIG. 23, communication apparatus #2 receives, demodulates, decodes and performs a CRC check of the modulation signal of frame #3. As a result of this, there is an error, and therefore a retransmission is not requested to communication apparatus #1.

Figure 26:
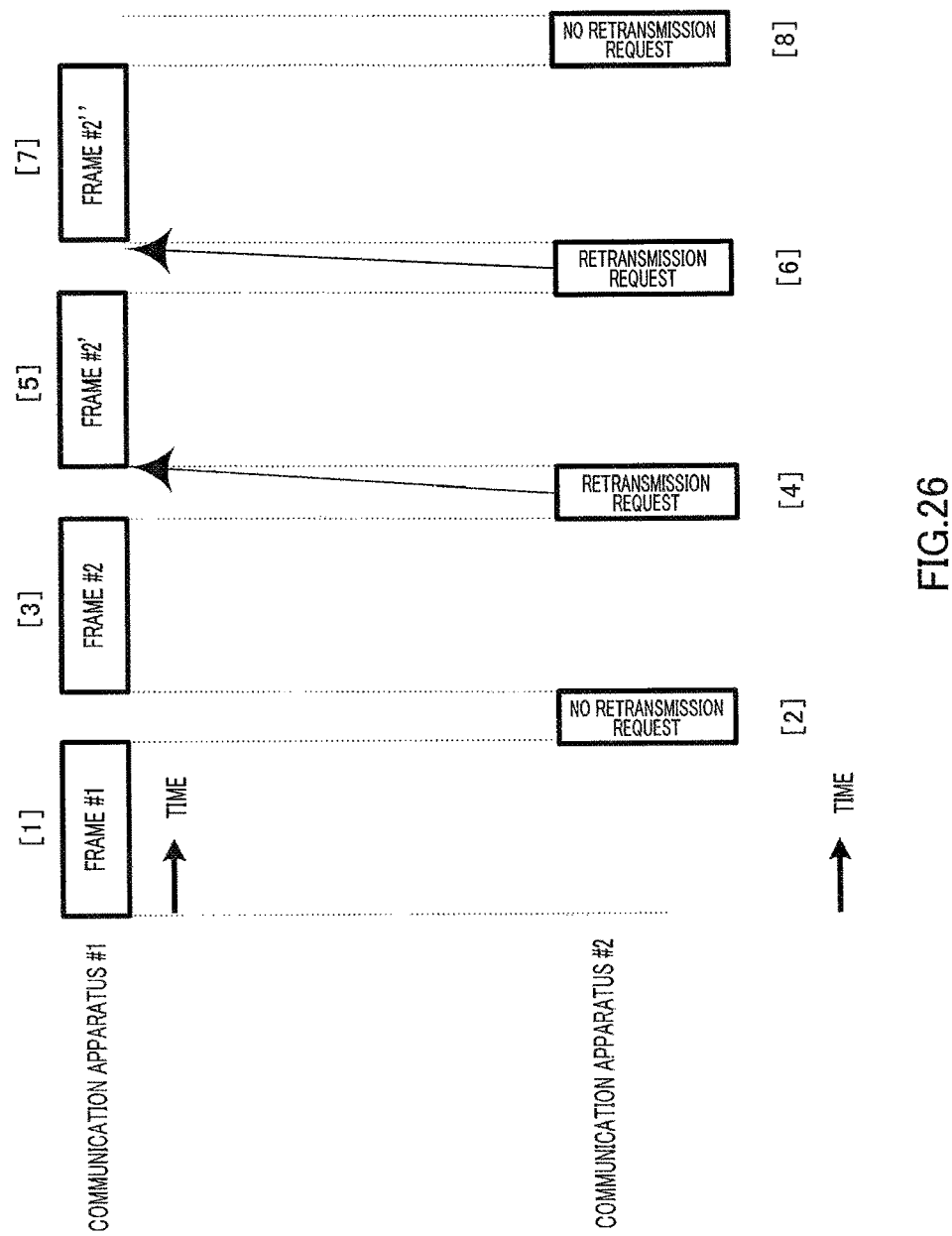
FIG. 26 shows another example of the flow of frames transmitted between communication apparatus #1 and communication apparatus #2, according to Embodiment 3.

FIG. 26 shows another example of the flow of frames transmitted between communication apparatus #1 and communication apparatus #2 according to the present embodiment, referring to HARQ. FIG. 26 differs from the flow of frames shown in FIG. 23 in providing a coding rate of 1/2 upon a retransmission and, for frame #2, further retransmitting frame #2" upon a second retransmission in addition to retransmitting frame #2'. Also, an example case will be explained below where communication apparatus #1 and communication apparatus #2 support coding rates of 1/2, 2/3 and 3/4.

In FIG. 26, first, communication apparatus #1 transmits a modulation signal of frame #1. At that time, data transmitted by the data symbol area of frame #1 represents a codeword acquired by applying coding of a coding rate of 3/4 to new data.

In FIG. 26, communication apparatus #2 receives, demodulates, decodes and performs a CRC check of the modulation signal of frame #1. As a result of this, there is no error, and therefore a retransmission is not requested to communication apparatus #1.

In FIG. 26, communication #1 transmits a modulation signal of frame #2. Here, data transmitted by the data symbol area of frame #2 represents a codeword acquired by applying coding of a coding rate of 3/4 to new data.

In FIG. 26, communication apparatus #2 receives, demodulates, decodes and performs a CRC check of the modulation signal of frame #2. As a result of this, there is an error, and therefore a retransmission is requested to communication apparatus #1.

In FIG. 26, communication apparatus #1 receives a retransmission request from communication apparatus #2, and therefore transmits frame #2' for frame #2. To be more specific, communication apparatus #1 encodes part (or all) of data (information), using a coding rate of 1/2 lower than a coding rate of 3/4 used upon acquiring a codeword transmitted by frame #2, and transmits only parity of the resulting codeword by frame #2'.

Here, an essential requirement is that: the coding rate used upon a retransmission is lower than a coding rate of 3/4; and, if there are a plurality of coding rates lower than the coding rate used upon the initial transmission, an optimal coding rate is set among the plurality of coding rates according to, for example, the channel condition between communication apparatus #1 and communication apparatus #2.

Here, data transmitted by frame #2 and frame #2' will be explained using FIG. 27.

Upon the initial transmission, with frame #2, information $X_{1,i}$, $X_{2,i}$ and $X_{3,i}$ (where i=1, 2, . . . , m) and parity $P_{3/4,i}$ (where i=1, 2, . . . , m) acquired by applying LDPC-CC coding of a coding rate of 3/4 to information $X_{1,i}$, $X_{2,i}$ and $X_{3,i}$, are transmitted.

When a retransmission request of frame #2 is requested from communication apparatus #2 to communication apparatus #1, communication apparatus #1 generates parity $P_{1/2,i}$ (where i=1, 2, . . . , m) by using a coding rate of 1/2 lower than a coding rate of 3/4 used upon the initial transmission and encoding $X_{1,i}$ (where i=1, 2, ..., m) among information $X_{1,i}$, $X_{2,i}$ and $X_{3,i}$ (where i=1, 2, ..., m) transmitted by frame #2.

Also, with frame #2', only this parity $P_{1/2,i}$ (where i=1, 2, ..., m) is transmitted.

At this time, especially when an encoder of communication apparatus #1 is configured in the same way as in Embodiment 2, it is possible to perform both coding of a coding rate of 3/4 upon the initial transmission and coding of a coding rate of 1/2 upon a retransmission, using the same encoder. That is, even in the case of performing a retransmission by HARQ, it is possible to perform coding upon a retransmission using an encoder to use when performing coding upon the initial transmission, without adding a new encoder for HARQ. This is because parity check polynomials for a plurality of coding rates supported by an encoder represent the LDPC-CCs described in Embodiment 1.

In FIG. 26, communication apparatus #2 receives, demodulates, decodes and performs a CRC check of a modulation signal of frame #2' transmitted upon a retransmission.

Figure 28:
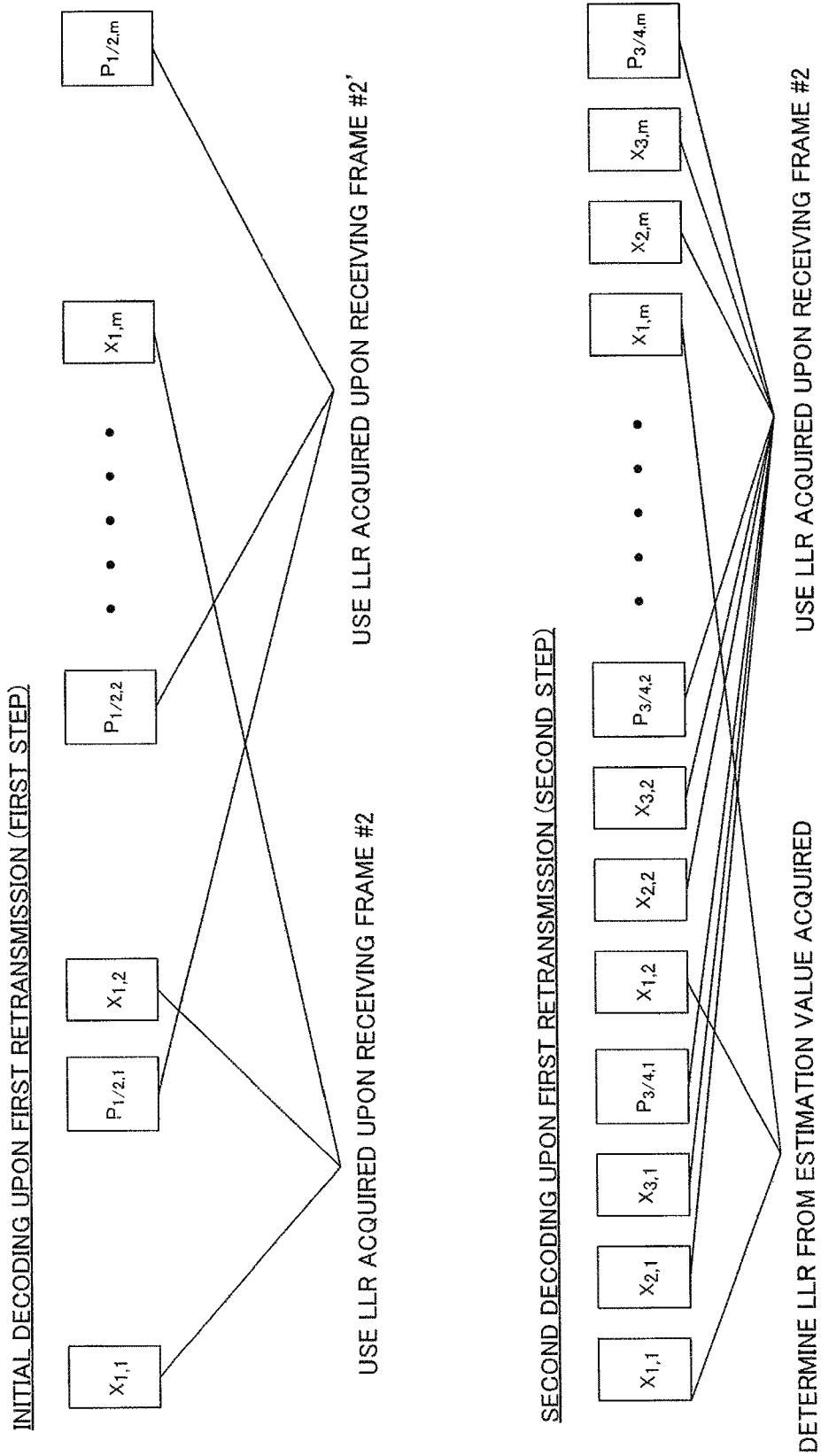
FIG. 28 illustrates a decoding method upon the first retransmission.

The decoding method upon a retransmission (i.e. upon the first retransmission) will be explained using FIG. 28. Upon the first retransmission, communication apparatus #2 decodes frame #2' using a decoding result of frame #2 received earlier.

To be more specific, first, as the initial decoding upon the first retransmission (first step), communication apparatus #2 decodes information $X_{1,i}$ (where i=1, 2, ..., m) (i.e. performs LDPC-CC decoding processing of a coding rate of 1/2), using the LLR of information $X_{1,i}$ (where i=1, 2, ..., m) received earlier by frame #2 and the LLR of parity $P_{1/2,i}$ (where i=1, 2, ..., m) of a coding rate of 1/2 received by frame #2'.

In frame #2', the coding rate is lower than frame #2, so that it is possible to improve the coding gain, increase a possibility of being able to decode information $X_{1,i}$ (where i=1, 2, ..., m), and secure the received quality upon a retransmission. Here, only parity data is retransmitted, so that the efficiency of data transmission is high.

Next, as second decoding upon the first retransmission (second step): communication apparatus #2 acquires the estimation value of information $X_{1,i}$ (where i=1, 2, ..., m) in the first step and therefore uses this estimation value to generate the LLR of information $X_{1,i}$ (e.g. an LLR corresponding to "0" of sufficiently high reliability is given when "0" is estimated, or an LLR corresponding to "1" of sufficiently high reliability is given when "1" is estimated).

Communication apparatus #2 acquires information $X_{2,i}$ and $X_{3,i}$ (where i=1, 2, ..., m) by performing LDPC-CC decoding of a coding rate of 3/4 using the LLR of information $X_{1,i}$ generated by the estimation value, the LLRs of information $X_{2,i}$ and $X_{3,i}$ (where i=1, 2, ..., m) received earlier by frame #2 and the LLR of parity $P_{3/4,i}$ (where i=1, 2, ..., m) received earlier by frame #2.

In this way, communication apparatus #2 decodes frame #2 transmitted upon the initial transmission, using frame #2' transmitted by HARQ upon a retransmission.

Communication apparatus #2 performs a CRC check of the decoding result of frame #2. As a result of this, there is error, and therefore a retransmission is requested to communication apparatus #1.

In FIG. 26, communication apparatus #1 receives a second retransmission request from communication apparatus #2, and therefore transmits frame #2" for frame #2.

To be more specific, communication apparatus #1 encodes part (or all) of data (information) that was not encoded upon the first retransmission, using again a coding rate of 1/2 lower than a coding rate of 3/4 used upon acquiring a codeword transmitted by frame #2, and transmits only parity of the resulting codeword by frame #2".

Here, data transmitted by frame #2" will be explained using FIG. 29.

Figure 27:
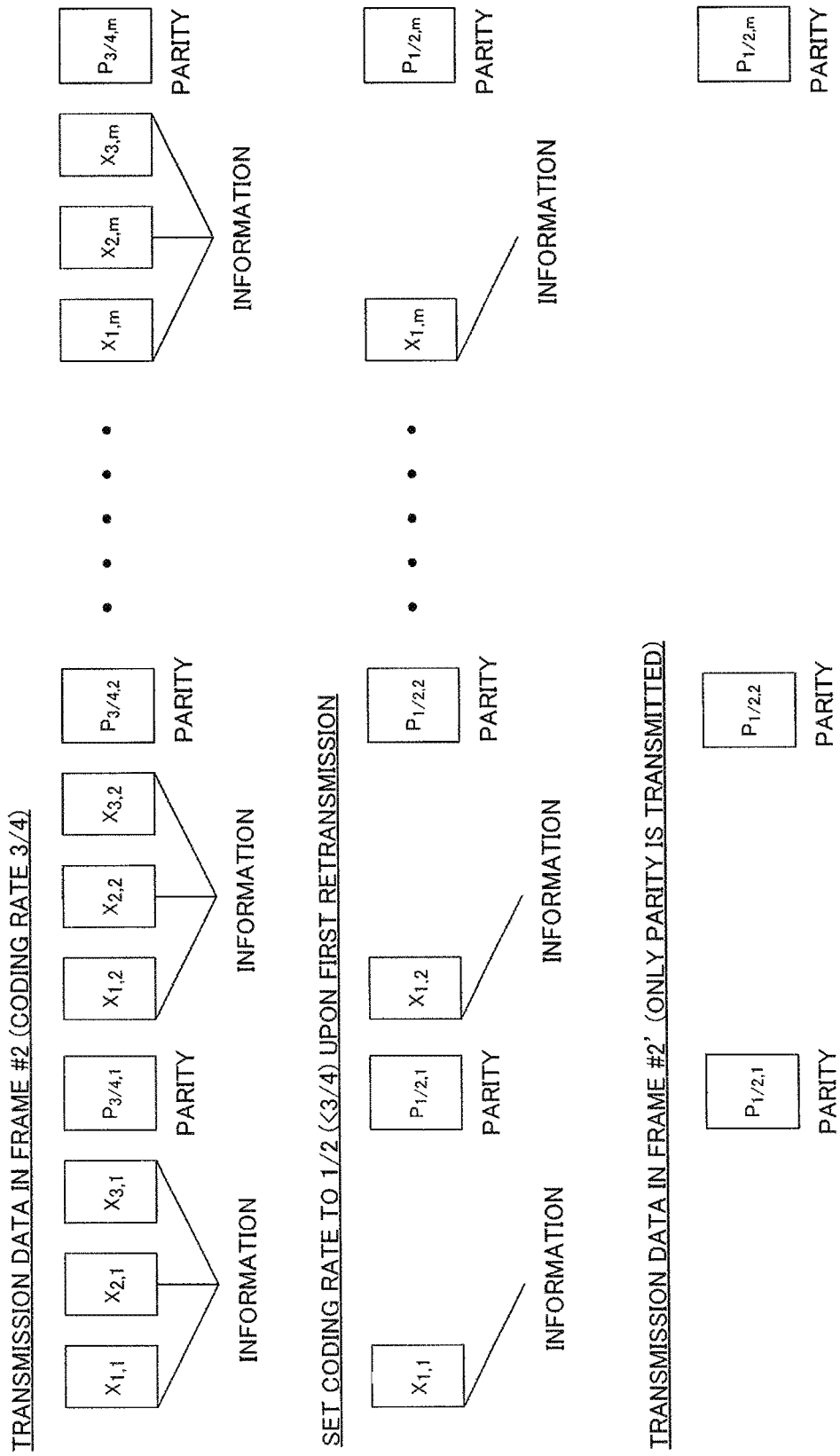
FIG. 27 illustrates data transmitted in frame #2 and frame #2'.

As described above, upon the first retransmission, parity $P_{1/2,i}$ (where i=1, 2, ..., m) is generated by using a coding rate of 1/2 lower than a coding rate of 3/4 upon the initial transmission and applying LDPC-CC coding of a coding rate of 1/2 to $X_{1,i}$ (where i=1, 2, ..., m) among information $X_{1,i}$, $X_{2,i}$ and $X_{3,i}$ (where i=1, 2, ..., m) transmitted by frame #2 (see FIG. 27). Also, with frame #2' upon the first retransmission, only this parity $P_{1/2,i}$ (where i=1, 2, ..., m) is transmitted (see FIG. 27).

Figure 29:
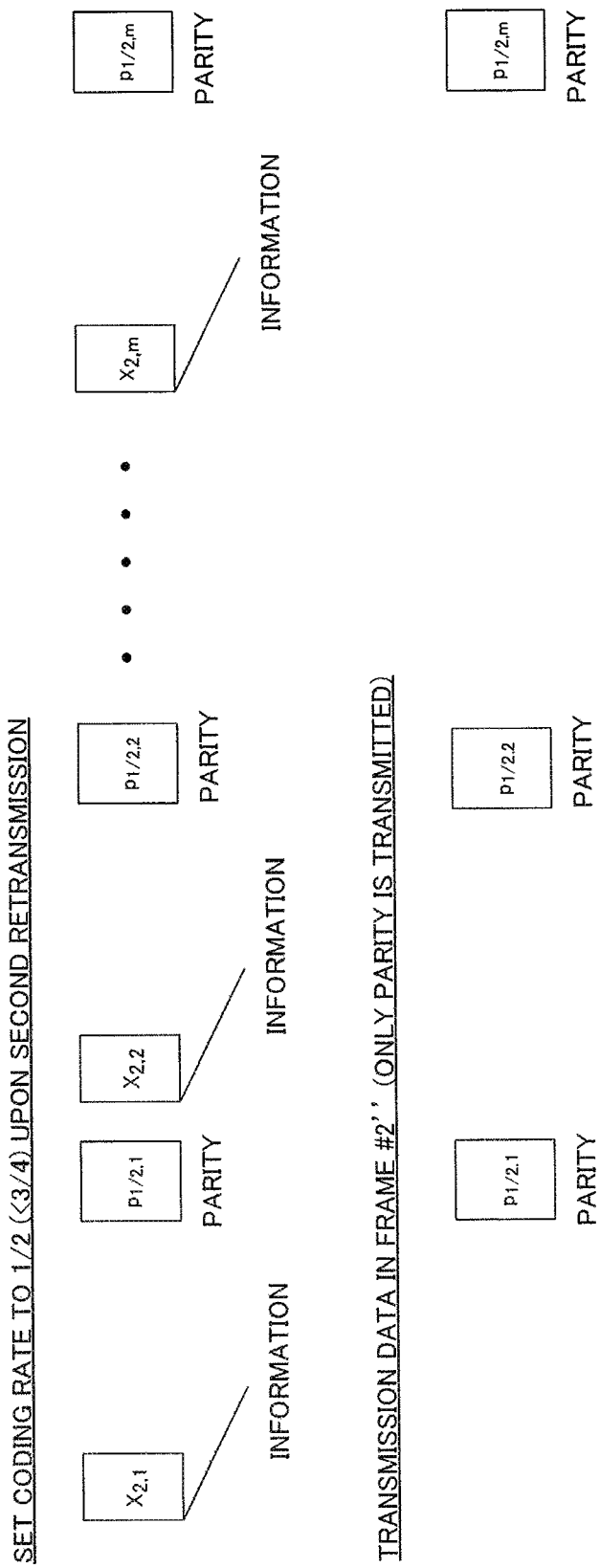
FIG. 29 illustrates data transmitted in frame #2''.

Upon a second retransmission, parity $P_{1/2,i}$ (where i=1, 2, ..., m) is generated by using a coding rate (e.g. 1/2) lower than a coding rate of 3/4 upon the initial transmission and applying, for example, LDPC-CC coding of a coding rate of 1/2 to $X_{2,i}$ (where=1, 2, ..., m) that was not encoded upon the first retransmission among information $X_{1,i}$, $X_{2,i}$ and $X_{3,i}$ (where i=1, 2, ..., m) transmitted by frame #2 (see FIG. 29). Also, with frame #2" upon a second retransmission, only this parity $P_{1/2,i}$ (where i=1, 2, m) is transmitted (see FIG. 29).

Here, LDPC-CC parity check polynomials used upon coding of a coding rate of 1/2 in a second retransmission are the same as LDPC-CC parity check polynomials used upon coding of the same coding rate of 1/2 in the first retransmission (i.e. these are different only in inputs upon coding, but share the same code used upon coding).

By this means, it is possible to generate a codeword using the same encoder between the initial transmission and the first retransmission, and further generate a codeword upon a second retransmission using the same encoder. By this means, it is possible to realize HARQ according to the present embodiment without adding a new encoder.

In the example shown in FIG. 29, upon a second retransmission, parity check polynomials used in coding upon the first retransmission are used to encode information $X_{2,i}$ (where i=1, 2, ..., m) other than information $X_{1,i}$ (where i=1, 2, ..., m) encoded upon the first retransmission and to transmit the resulting codeword.

In this way, in a case where there are a plurality of retransmission requests, upon an n-th retransmission (where n is an integer equal to or greater than 2), by retransmitting a codeword acquired by preferentially encoding information other than information encoded before an (n−1)-th retransmission, it is possible to gradually increase the reliability of the log likelihood ratio of each information forming frame #2, so that it is possible to decode frame #2 more reliably on the decoding side.

Also, in a case where there are a plurality of retransmission requests, upon an n-th retransmission (where n is an integer equal to or greater than 2), it is equally possible to retransmit the same data as one retransmitted before an (n−1)-th retransmission. Also, in a case where there are a plurality of retransmission requests, it is equally possible to further use other ARQ schemes such as chase combining. Also, in a case of performing retransmission several times, the coding rate may vary every retransmission.

In FIG. 26, communication apparatus #2 receives, demodulates, decodes and performs a CRC check of a modulation signal of frame #2" transmitted again upon a retransmission (i.e. upon a second retransmission).

Figure 30:
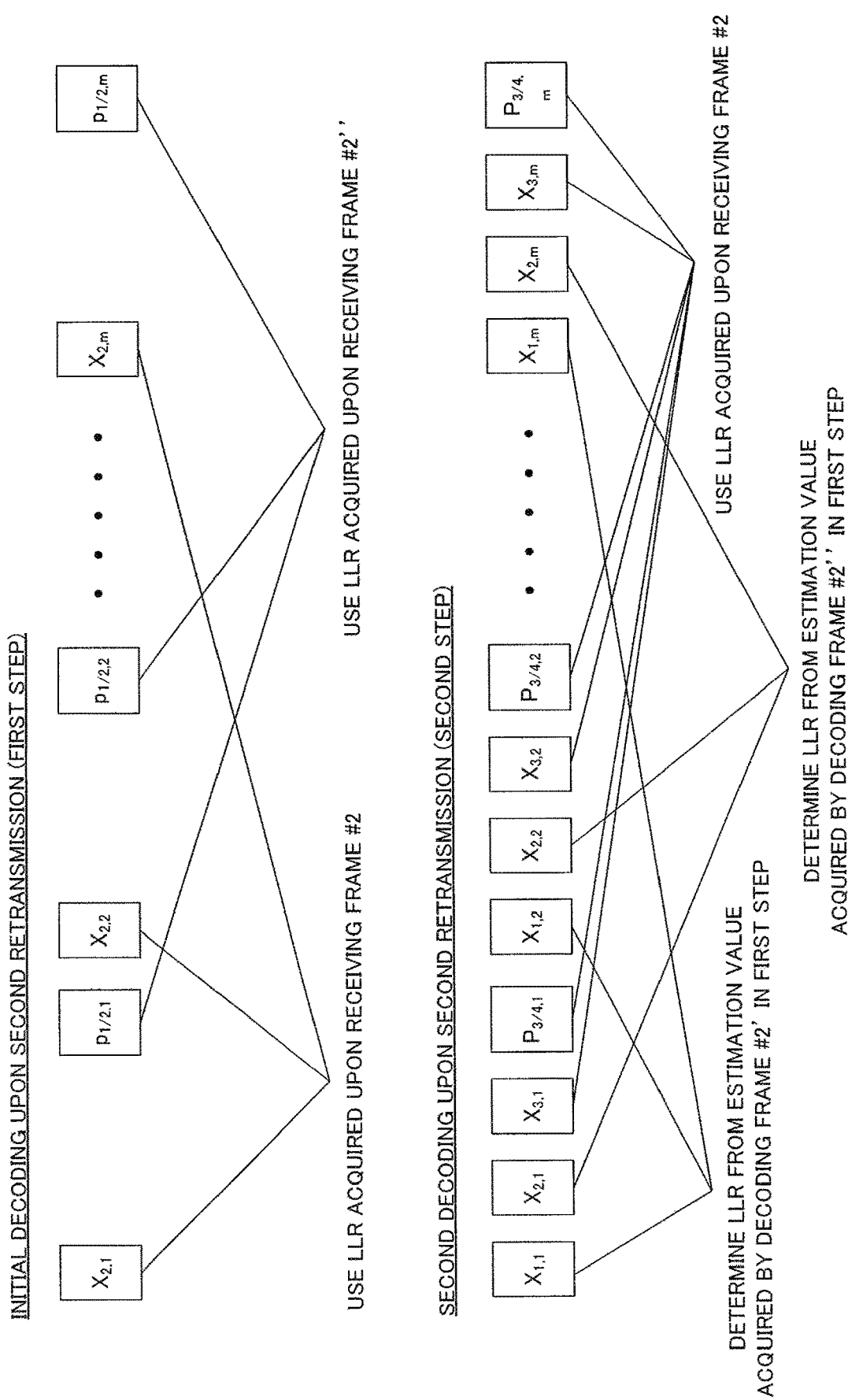
FIG. 30 illustrates a decoding method upon a second retransmission.

The decoding method upon a second retransmission will be explained using FIG. 30. Upon a second retransmission, communication apparatus #2 decodes frame #2" using a decoding result of frame #2 received earlier.

To be more specific, first, as the initial decoding upon a second retransmission (first step), communication apparatus #2 decodes information $X_{2,i}$ (where i=1, 2, ..., m) (i.e. performs LDPC-CC decoding processing of a coding rate of 1/2), using the LLR of information $X_{2,i}$ (where i=1, 2, ..., m) received earlier by frame #2 and the LLR of parity $P_{1/2,i}$ (where i=1, 2, ..., m) of a coding rate of 1/2 received by frame #2".

In frame #2", the coding rate is lower than frame #2, so that it is possible to improve the coding gain, increase a possibility of being able to decode information $X_{2,i}$ (where i=1, 2, ..., m), and secure the received quality upon a retransmission. Here, only parity data is retransmitted, so that the efficiency of data transmission is high.

Next, as second decoding upon a second retransmission (second step), communication apparatus #2 acquires the estimation value of information $X_{2,i}$ (where i=1, 2, ..., m) in the first step, and therefore uses this estimation value to generate the LLR of information $X_{2,i}$ (e.g. an LLR corresponding to "0" of sufficiently high reliability is given when "0" is estimated, or an LLR corresponding to "1" of sufficiently high reliability is given when "1" is estimated).

Communication apparatus #2 acquires information $X_{3,i}$ (where i=1, 2, ..., m) by performing LDPC-CC decoding of a coding rate of 3/4 using the LLR of information $X_{2,i}$ generated by the estimation value, the LLRs of information $X_{3,i}$ (where i=1, 2, ..., m) and parity $P_{3/4,i}$ (where i=1, 2, ..., m) received earlier by frame #2 and the LLR of information $X_{1,i}$ generated by the estimation value of information $X_{1,i}$ (where i=1, 2, ..., m) estimated in decoding upon the first retransmission (first and second steps).

In this way, communication apparatus #2 decodes frame #2 transmitted upon the initial transmission, using frame #2' and frame #2" retransmitted by HARQ.

Communication apparatus #2 decodes frame #2 and then performs a CRC check. As a result of this, there is no error, and therefore a retransmission is not requested to communication apparatus #1.

Figure 31:
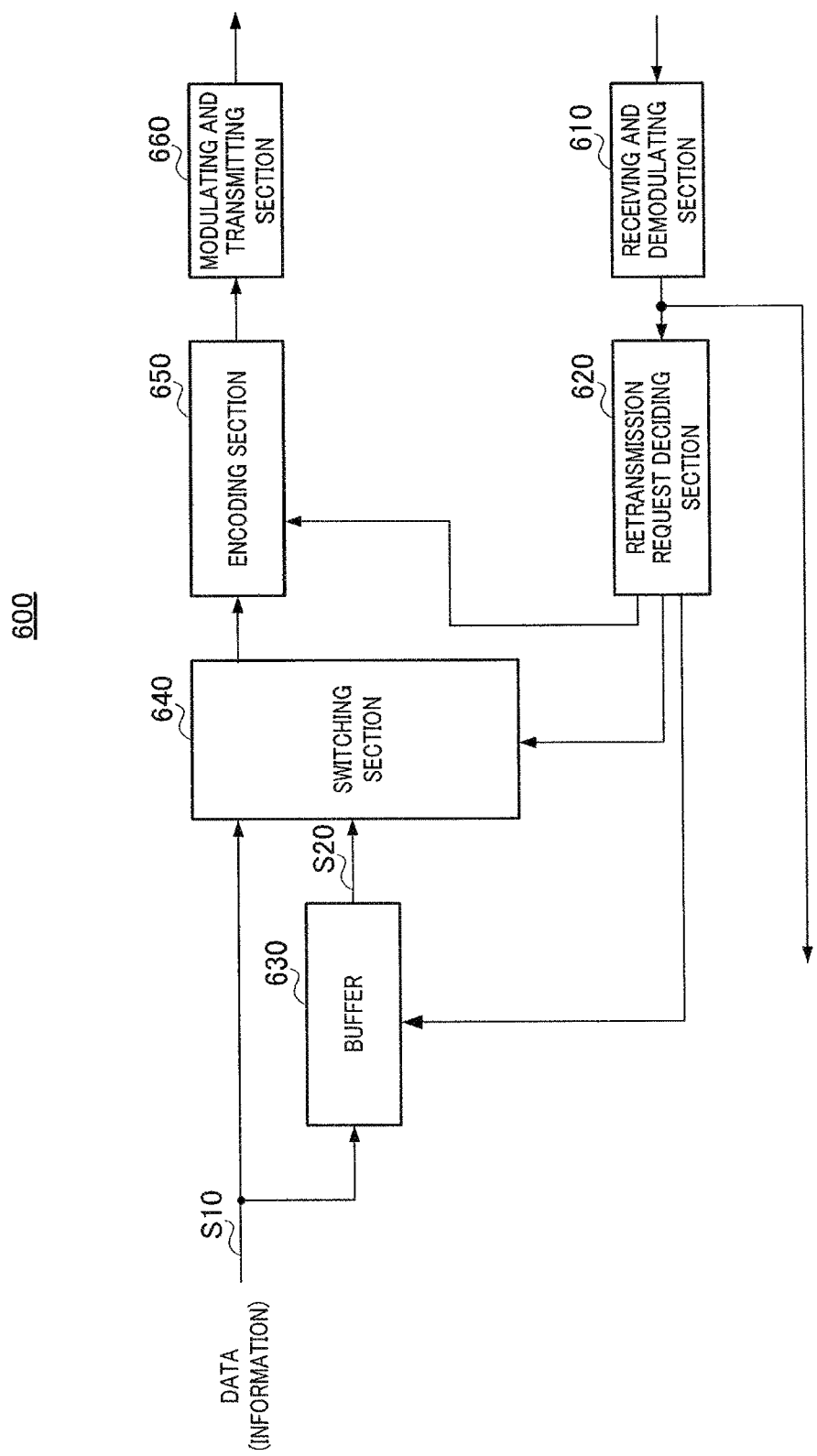
FIG. 31 is a block diagram showing the main configuration of communication apparatus #1 according to Embodiment 3.

FIG. 31 shows the configuration of communication apparatus #1 that performs HARQ according to the present embodiment. Communication apparatus 600 in FIG. 31 is mounted on, for example, a base station.

Receiving and demodulating section 610 of communication apparatus 600 in FIG. 31 finds a received signal by receiving a modulation signal having the frame configuration shown in FIG. 22 transmitted from the communicating party, and applies receiving processing such as frequency conversion, demodulation and decoding to the received signal, thereby extracting a retransmission request symbol. Receiving and demodulating section 610 outputs the retransmission request symbol to retransmission request deciding section 620.

Retransmission request deciding section 620 decides from the retransmission request symbol whether or not there is a retransmission request, and outputs the decision result to switching section 640 as retransmission request information. Further, depending on whether or not there is a retransmission request, retransmission request deciding section 620 outputs a designation signal to encoding section 650 and buffer 630.

To be more specific, if there is no retransmission request, retransmission request deciding section 620 outputs a designation signal to encoding section 650 such that encoding section 650 performs coding using a coding rate set as the coding rate to use upon the initial transmission. In contrast, if there is a retransmission request, retransmission request deciding section 620 outputs a designation signal to encoding section 650 such that, in the case of selecting HARQ, encoding section 650 performs coding upon a retransmission using a coding rate lower than the coding rate to use upon the initial transmission (here, in the case of not selecting HARQ, for example, in the case of selecting chase combining, a coding rate lower than the coding rate to use upon the initial transmission is not necessarily selected). Further, if there is a retransmission request, retransmission request deciding section 620 outputs a designation signal to buffer 630 such that buffer 630 outputs stored data (information) S20 to switching section 640.

Buffer 630 stores data (information) S10 outputted to encoding section 650 via switching section 640, and outputs data (information) S20 to switching section 640 according to a designation signal from retransmission request deciding section 620.

Switching section 640 outputs one of data (information) S10 and data (information) S20 stored in buffer 630 to encoding section 650, according to retransmission request information. To be more specific, if the retransmission request information indicates no retransmission request, switching section 640 outputs data (information) S10 that is not encoded yet, to encoding section 650 as new data. In contrast, if the retransmission request information indicates a retransmission request, switching section 640 outputs data (information) S20 stored in buffer 630 to encoding section 650 as retransmission data.

Encoding section 650 has encoder 200 shown in Embodiment 2, applies LDPC-CC coding to input data according to the coding rate designated from retransmission request deciding section 620 and acquires an LDPC-CC codeword.

Figure 24:
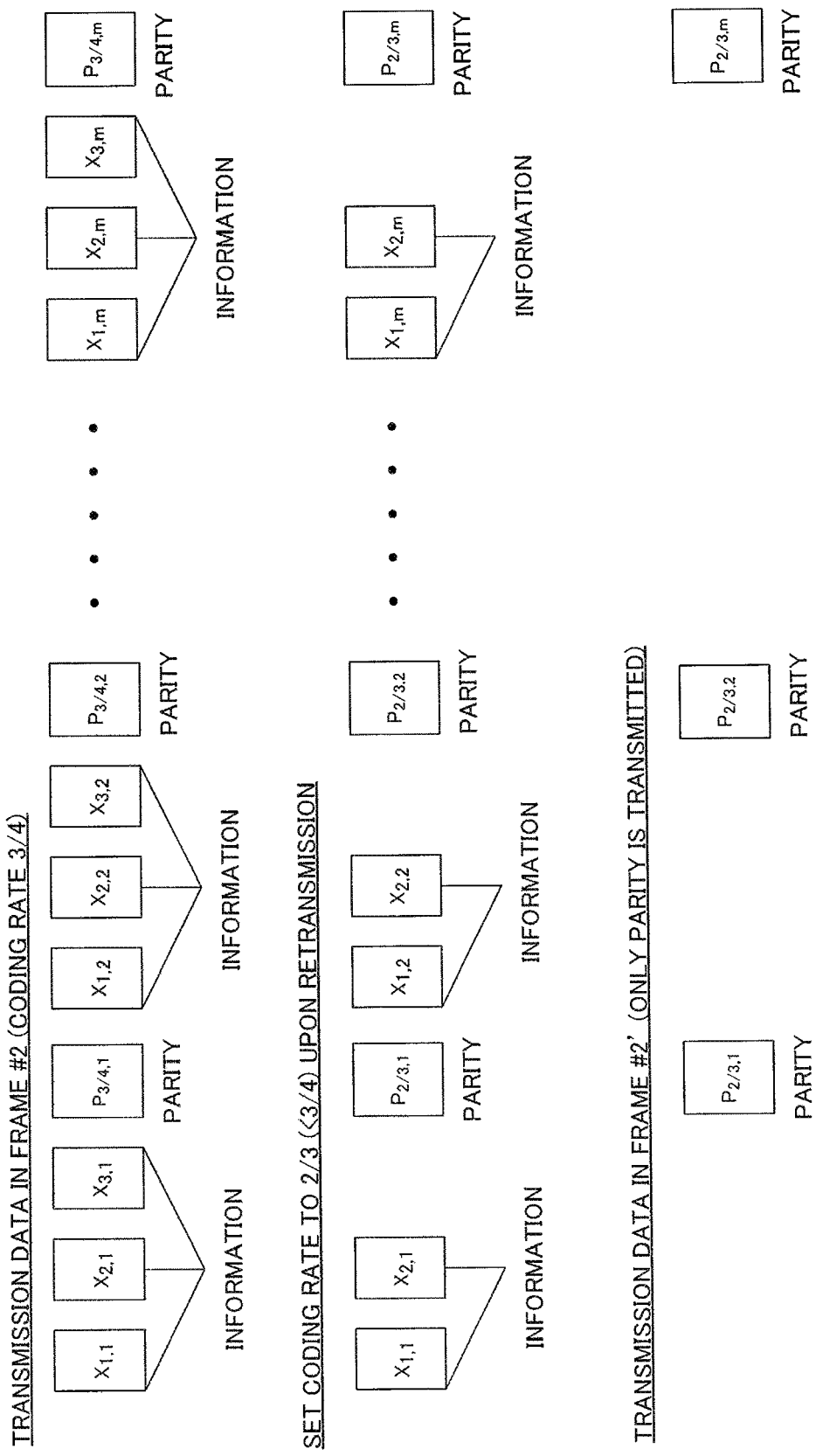
FIG. 24 illustrates data transmitted in frame #2 and frame #2'.

For example, in the case of transmitting frame #2 of FIG. 23 upon the initial transmission, encoding section 650 applies coding to information $X_{1,i}$, $X_{2,i}$ and $X_{3,i}$ (where i=1, 2, ..., m) using a coding rate of 3/4, according to a designation signal reported from retransmission request deciding section 620, and generates parity $P_{3/4,i}$ (where i=1, 2, ..., m) (see FIG. 24).

Then, encoding section 650 outputs information $X_{1,i}$, $X_{2,i}$ and $X_{3,i}$ (where i=1, 2, ..., m) and parity $P_{3/4,i}$ (where i=1, 2, ..., m) to modulating and transmitting section 660 as an LDPC-CC codeword.

Also, for example, in the case of transmitting frame #2' of FIG. 23 upon the first retransmission, encoding section 650 switches the coding rate from 3/4 to 2/3 according to a designation signal reported from retransmission request deciding section 620, applies coding to $X_{1,i}$ and $X_{2,i}$ (where i=1, 2, ..., m) among information $X_{1,i}$, $X_{2,i}$ and $X_{3,i}$ (where i=1, 2, ..., m) transmitted by frame #2, and generates parity $P_{2/3,i}$ (where i=1, 2, ..., m) (see FIG. 24).

Here, an important point is that encoding section 650 includes encoder 200 explained in Embodiment 2. That is, in a case where encoder 200 performs LDPC-CC coding of a time varying period of g (where g is a natural number) supporting coding rates of (y−1)/y and (z−1)/z (y<z), encoding section 650 generates an LDPC-CC codeword using parity check polynomial 42 upon the initial transmission, and, if there is a retransmission request, generates an LDPC-CC codeword using parity check polynomial 43 upon a retransmission.

[42]

$$B_k(D)P(D) + \sum_{r=1}^{z-1} A_{Xr,k}(D)X_r(D) = 0 \quad (k = i \bmod g)$$ (Equation 42)

In equation 42, D is a delay operator, and k is an integer.

[43]

$$B_k(D)P(D) + \sum_{r=1}^{y-1} A_{Xr,k}(D)X_r(D) = 0 \quad (k = i \bmod g)$$ (Equation 43)

In equation 43, D is a delay operator, and k is an integer. Here, $A_{Xr,k}(D)$ of equation 42 and $A_{Xr,k}(D)$ of equation 43 are equal (where f=1, 2, 3, ..., y−1), and $B_k(D)$ of equation 42 and $B_k(D)$ of equation 43 are equal.

By this means, even in the case of performing a retransmission by HARQ, it is possible to perform coding upon a retransmission using an encoder to use when performing coding upon the initial transmission, without adding a new encoder for HARQ.

Then, encoder 650 outputs only this parity $P_{2/3,i}$ (where i=1, 2, ..., m) to modulating and transmitting section 660 as an LDPC-CC codeword.

Modulating and transmitting section 660 applies transmission processing such as modulation and frequency conversion to the LDPC-CC codeword, and transmits the result to communication apparatus #2 of the communicating party via an antenna (not shown).

Figure 32:
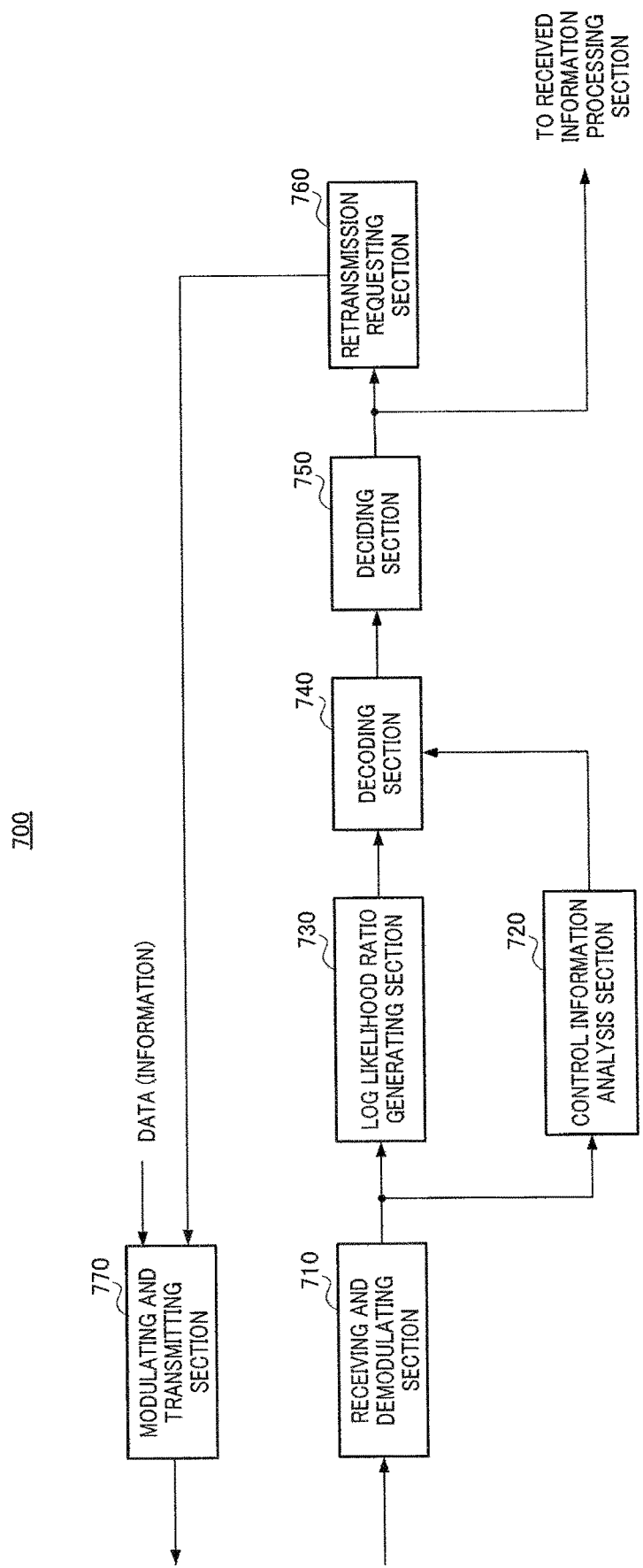
FIG. 32 is a block diagram showing the main configuration of communication apparatus #2 according to Embodiment 3.

FIG. 32 shows an example of the main components of communication apparatus #2, which is the communicating party of communication apparatus #1. Communication apparatus 700 in FIG. 32 is mounted on, for example, a terminal apparatus.

Receiving and demodulating section 710 of communication apparatus 700 in FIG. 32 receives as input a received signal via an antenna (not shown), applies radio processing such as frequency conversion to the received signal and acquires a received signal having the frame configuration shown in FIG. 21. Receiving and demodulating section 710 extracts control information symbols such as a retransmission information symbol, coding rate information symbol and modulation scheme information symbol from the received signal, and outputs these control information symbols to control information analyzing section 720. Further, receiving and demodulating section 710 extracts a data symbol from the received signal and outputs the data symbol to log likelihood ratio generating section 730 as received data.

From the control information symbols, control information analyzing section 720 extracts control information of information as to whether retransmission data or new data is provided, control information of the coding rate and control information of the modulation scheme, from the control information symbols, and outputs these items of control information to decoding section 740.

Log likelihood ratio generating section 730 calculates the log likelihood ratio of received data. Log likelihood ratio generating section 730 outputs the log likelihood ratio to decoding section 740.

Decoding section 740 has decoder 300 of FIG. 15, decodes the log likelihood ratio of the received data using control information reported from control information analyzing section 720, and updates the log likelihood ratio of the received data.

For example, in the case of receiving frame #2 of FIG. 23 transmitted upon the initial transmission, decoding section 740 sets the coding rate to 3/4 according to a designation signal reported from control information analyzing section 720 and performs decoding to provide the log likelihood ratio of received data after decoding processing.

Also, for example, in the case of receiving frame #2' of FIG. 23 transmitted upon a retransmission, decoding section 740 switches the coding ratio from 3/4 to 2/3 according to a designation signal reported from control information analyzing section 720 and performs decoding to provide the log likelihood ratio of received data after decoding processing. Here, upon a retransmission, decoding section 740 performs decoding in a plurality of steps. An example case will be explained below where frame #2 of FIG. 23 and frame #2' of FIG. 23 are received.

To be more specific, first, as the initial decoding upon a retransmission (first step), decoding section 740 decodes information $X_{1,i}$ and $X_{2,i}$ (where i=1, 2, ..., m) (i.e. performs LDPC-CC decoding processing of a coding rate of 2/3), using the LLRs of information $X_{1,i}$ and $X_{2,i}$ (where i=1, 2, ..., m) received earlier by frame #2 and the LLR of parity $P_{2/3,i}$ (where i=1, 2, ..., m) of a coding rate of 2/3 received by frame #2'.

In frame #2', the coding rate is lower than frame #2, so that it is possible to improve the coding gain, increase a possibility of being able to decode information $X_{1,i}$ and $X_{2,i}$ (where i=1, 2, ..., m), and secure the received quality upon a retransmission. Here, only parity data is retransmitted, so that the efficiency of data transmission is high.

Next, as second decoding upon a retransmission (second step), decoding section 740 acquires the estimation values of information $X_{1,i}$ and $X_{2,i}$ (where i=1, 2, ..., m) in the first step and therefore uses these estimation values to generate the LLRs of information $X_{1,i}$ and $X_{2,i}$ (e.g. an LLR corresponding to "0" of sufficiently high reliability is given when "0" is estimated, or an LLR corresponding to "1" of sufficiently high reliability is given when "1" is estimated).

Decoding section 740 acquires information $X_{3,i}$ (where i=1, 2, ..., m) by performing LDPC-CC decoding of a coding rate of 3/4 using the LLRs of information $X_{1,i}$ and $X_{2,i}$ generated by the estimation values, the LLR of information $X_{3,i}$ (where i=1, 2, ..., m) received earlier by frame #2 and the LLR of parity $P_{3/4,i}$ (where i=1, 2, ..., m) received earlier by frame #2.

Here, an important point is that decoding section 740 includes decoder 300 explained in Embodiment 2. That is, in a case where decoder 300 performs LDPC-CC decoding of a time varying period of g (where g is a natural number) supporting coding rates of (y−1)/y and (z−1)/z (y<z), decoding section 740 decodes an LDPC-CC codeword using parity check polynomial 42 in decoding upon the initial transmission, decodes an LDPC-CC codeword using parity check polynomial 43 in decoding upon the first retransmission (first step), and decodes an LDPC-CC codeword using parity check polynomial 42 in decoding upon a second retransmission (second step).

By this means, even in the case of performing a retransmission by HARQ, it is possible to perform decoding upon a retransmission (i.e. decoding in the first and second steps) using a decoder to use when performing decoding upon the initial transmission, without adding a new decoder for HARQ.

Decoding section 740 outputs the log likelihood ratio of received data after decoding processing, to deciding section 750.

Deciding section 750 acquires decoded data by estimating data based on the log likelihood ratio received as input from decoding section 740. Deciding section 750 outputs the decoded data to retransmission requesting section 760.

Retransmission requesting section 760 performs error detection by performing a CRC check of the decoded data, forms retransmission request information based on whether or not there is error, and outputs the retransmission request information to modulating and transmitting section 770.

Modulating and transmitting section 770 receives as input data (information) and retransmission request information, acquires a modulation signal by applying processing such as coding, modulation and frequency conversion to the data and the retransmission request information, and outputs the modulation signal to communication apparatus #1 of the communicating party via an antenna (not shown).

In this way, with the configurations of FIG. 31 and FIG. 32, it is possible to implement HARQ of the present embodiment. By this means, it is possible to perform coding upon a retransmission using an encoder to use when performing coding upon the initial transmission, without adding a new encoder for HARQ. Also, it is possible to perform both decoding upon the initial transmission and decoding upon a retransmission (i.e. decoding in the first and second steps), using the same decoder. That is, it is possible to perform decoding upon a retransmission (i.e. decoding in the first and second steps) using a decoder to use when performing decoding upon the initial transmission, without adding a new decoder for HARQ.

An aspect of the encoder of the present invention that creates a low-density parity-check convolutional code of a time varying period of g (where g is a natural number) using a parity check polynomial of equation 44 of a coding rate of $(q-1)/q$ (where q is an integer equal to or greater than 3), employs a configuration having: a coding rate setting section that sets a coding rate of $(s-1)/s$ $(s \leq q)$; an r-th computing section that receives as input information $X_{r,i}$ (where $r=1, 2, \ldots, q-1$) at point in time i and outputs a computation result of $A_{Xr,k}(D)X_i(D)$ of equation 44; a parity computing section that receives as input parity $P_{1-1}$ at point in time $i-1$ and outputs a computation result of $B_k(D)P(D)$ of equation 44; an adding section that acquires an exclusive OR of computation results of the first to $(q-1)$-th computation sections and the computation result of the parity computing section, as parity $P_i$ at point in time i; and an information generating section that sets zero between information $X_{s,i}$ and information $X_{q-1,i}$.

[44]

$$B_k(D)P(D) + \sum_{r=1}^{s-1} A_{Xr,k}(D)X_r(D) + \sum_{r=s}^{q-1} A_{Xr,k}(D)X_r(D) = 0 \ (k = i \bmod g) \quad \text{(Equation 44)}$$

In equation 44, D is a delay operator, and k is an integer.

An aspect of the decoder of the present invention that provides a parity check matrix based on a parity check polynomial of equation 45 of a coding rate of $(q-1)/q$ (where q is an integer equal to or greater than 3) and decodes a low-density parity-check convolutional code of a time varying period of g (where g is a natural number) using belief propagation, employs a configuration having: a log likelihood ratio setting section that sets log likelihood ratios for information from information $X_{s,i}$ to information $X_{g-1,i}$ at point in time i (where i is an integer), to a known value, according to a set coding rate of $(s-1)/s$ $(s \leq q)$; and a computation processing section that performs row processing computation and column processing computation according to the parity check matrix based on the parity check polynomial of equation 45, using the log likelihood ratio.

[45]

$$B_k(D)P(D) + \sum_{r=1}^{s-1} A_{Xr,k}(D)X_r(D) + \sum_{r=s}^{q-1} A_{Xr,k}(D)X_r(D) = 0 \ (k = i \bmod g) \quad \text{(Equation 45)}$$

In equation 45, D is a delay operator, and k is an integer.

An aspect of the encoding method of the present invention for encoding a low-density parity-check convolutional code of a time varying period of g (where g is a natural number) supporting coding rates of $(y-1)/y$ and $(z-1)/z$ $(y<z)$, includes: generating a low-density parity-check convolutional code of the coding rate of $(z-1)/z$ using a parity check polynomial of equation 46; and generating a low-density parity-check convolutional code of the coding rate of $(y-1)/y$ using a parity check polynomial of equation 47.

[46]

$$B_k(D)P(D) + \sum_{r=1}^{z-1} A_{Xr,k}(D)X_r(D) = 0 \ (k = i \bmod g) \quad \text{(Equation 46)}$$

In equation 46, D is a delay operator, and k is an integer.

[47]

$$B_k(D)P(D) + \sum_{r=1}^{y-1} A_{Xr,k}(D)X_r(D) = 0 \ (k = i \bmod g) \quad \text{(Equation 47)}$$

In equation 47, D is a delay operator, and k is an integer. Here, $A_{Xf,k}(D)$ of equation 46 and $A_{Xf,k}(D)$ of equation 47 are equal (where $f=1, 2, 3, \ldots, y-1$), and $B_k(D)$ of equation 46 and $B_k(D)$ of equation 47 are equal.

The present invention is not limited to the above-described embodiments, and can be implemented with various changes. For example, although cases have been mainly described above with embodiments where the present invention is implemented with an encoder and decoder, the present invention is not limited to this, and is applicable to cases of implementation by means of a power line communication apparatus.

It is also possible to implement the encoding method and decoding method as software. For example, provision may be made for a program that executes the above-described encoding method and communication method to be stored in ROM (Read Only Memory) beforehand, and for this program to be run by a CPU (Central Processing Unit).

Provision may also be made for a program that executes the above-described encoding method and decoding method to be stored in a computer-readable storage medium, for the program stored in the storage medium to be recorded in RAM (Random Access Memory) of a computer, and for the computer to be operated in accordance with that program.

It goes without saying that the present invention is not limited to radio communication, and is also useful in power line communication (PLC), visible light communication, and optical communication.

The disclosures of Japanese Patent Application No. 2008-179636, filed on Jul. 9, 2008, and Japanese Patent Application No. 2008-227505, filed on Sep. 4, 2008, including the specifications, drawings and abstracts, are incorporated herein by reference in their entireties.

INDUSTRIAL APPLICABILITY

With the encoder, decoder and encoding method according to the present embodiment, it is possible to realize a plurality of coding rates in a small circuit scale and provide data of high received quality in an LDPC-CC encoder and decoder.

REFERENCE SIGNS LIST

100 LDPC-CC encoder
110 data computing section
120, 230 parity computing section
130, 260 weight control section
140 mod 2 adder
111-1 to 111-M, 121-1 to 121-M, 221-1 to 221-M, 231-1 to 231-M shift register
112-0 to 112-M, 122-0 to 122-M, 222-0 to 222-M, 232-0 to 232-M weight multiplier
200 encoder
210 information generating section
220-1 first information computing section
220-2 second information computing section
220-3 third information computing section
240 adder
250 coding rate setting section
300 decoder
310 log likelihood ratio setting section
320 matrix processing computing section
321 storage section
322 row processing computing section
323 column processing computing section
400, 500 communication apparatus
410 coding rate determining section
420 modulating section
510 receiving section
520, 730 log likelihood ratio generating section
530 control information generating section
600, 700 communication apparatus
610, 710 receiving and demodulating section
620 retransmission request deciding section
630 buffer
640 switching section
650 encoding section
660, 770 modulating and transmitting section
720 control information analyzing section
740 decoding section
750 deciding section
760 retransmission requesting section

The invention claimed is:

1. A transmission apparatus applied in an optical communication system, comprising:
an encoder, which, in operation, outputs a parity sequence and an information sequence, the parity sequence comprising low-density parity-check (LDPC) encoded data obtained by LDPC-encoding the information sequence using a parity check matrix in which "n" number of (where n is an integer equal to or greater than 1) parity check equation groups including a plurality of parity check polynomials are arranged, each of the plurality of parity check polynomials satisfying zero; and
a transmitter, which, in operation, converts a modulation signal obtained by modulating the LDPC encoded data into an optical signal and outputs the optical signal, wherein
the parity sequence is generated by using a first column to a determined column of the parity check matrix for an information sequence having a sequence length that corresponds to a length from the first column to the determined column among one or more column(s) of the parity check matrix that corresponds to n-th parity check equation group, the determined column varying depending on coding rates, and
the "n" number of parity check equation groups support coding rates of $(r-1)/r$ (where r equals to or more than 2 and equals to or less than q, where q is a natural number equal to or more than 3), support a time varying period of g (where g is an integer equal to or more 2), and are arranged repeatedly at every g-th row of the parity check matrix, the parity check polynomial being represented as:

$$A_{X1,k}(D)X_1(D)+A_{X2,k}(D)X_2(D)+ \ldots +A_{Xq-1,k}(D)X_{q-1}(D)+B_k(D)P(D)=0(k=i \bmod g)$$ (Equation 1)

where, in Equation 1, $X_1(D)$, $X_2(D)$, ..., $X_{q-1}(D)$ are polynomial representations of information $X_1$, $X_2$, ..., $X_{q-1}$ at time i respectively, P(D) is a polynomial representation of parity P, $A_{Xr,k}(D)$ is a term of $X_r(D)$ in the parity check polynomial for "k=i mod g" at time i where the coding rate is $(r-1)/r$, and $B_k(D)$ is a term of P(D) in the parity check polynomial for "k=i mod g" at time i, where "i mod g" is a remainder after dividing i by g.

2. A transmission method using an optical communication system, comprising:
outputting a parity sequence and an information sequence, the parity sequence comprising low-density parity-check (LDPC) encoded data obtained by LDPC-encoding the information sequence using a parity check matrix in which "n" number of (where n is an integer equal to or greater than 1) parity check equation groups including a plurality of parity check polynomials are arranged, each of the plurality of parity check polynomials satisfying zero; and
converting a modulation signal obtained by modulating the LDPC encoded data into an optical signal and outputting the optical signal, wherein
the parity sequence generated by using a first column to a determined column of the parity check matrix for an information sequence having a sequence length that corresponds to a length from the first column to the determined column among one or more column(s) of the parity check matrix that corresponds to n-th parity check equation group, the determined column varying depending on coding rates, and
the "n" number of parity check equation groups support coding rates of $(r-1)/r$ (where r equals to or more than 2 and equals to or less than q, where q is a natural number equal to or more than 3), support a time varying period of g (where g is an integer equal to or more 2), and are arranged repeatedly at every g-th row of the parity check matrix, the parity check polynomial being represented as:

$$A_{X1,k}(D)X_1(D) + A_{X2,k}(D)X_2(D) + \ldots + A_{Xq-1,k}(D)X_{q-1}(D) + B_k(D)P(D) = 0 (k = i \bmod g) \quad \text{(Equation 2)}$$

where, in Equation 2, $X_1(D), X_2(D), \ldots, X_{q-1}(D)$ are polynomial representations of information $X_1, X_2, \ldots, X_{q-1}$ at time i respectively, P(D) is a polynomial representation of parity P, $A_{Xr,k}(D)$ is a term of $X_r(D)$ in the parity check polynomial for "k=i mod g" at time i where the coding rate is (r−1)/r, and $B_k(D)$ is a term of P(D) in the parity check polynomial for "k=i mod g" at time i, where "i mod g" is a remainder after dividing i by g.

* * * * *